(12) United States Patent
Fukase et al.

(10) Patent No.: US 7,679,004 B2
(45) Date of Patent: Mar. 16, 2010

(54) CIRCUIT BOARD MANUFACTURING METHOD AND CIRCUIT BOARD

(75) Inventors: Katsuya Fukase, Nagano (JP); Toyoaki Sakai, Nagano (JP); Munetoshi Irisawa, Tokyo (JP); Toyokazu Komuro, Tokyo (JP); Yasuo Kaneda, Tokyo (JP); Masanori Natsuka, Tokyo (JP); Wakana Aizawa, Tokyo (JP)

(73) Assignees: Shinko Electric Industries Co., Ltd., Nagano-shi (JP); Mitsubishi Paper Mills Limited, Tokyo (JP)

( * ) Notice: Subject to any disclaimer, the term of this patent is extended or adjusted under 35 U.S.C. 154(b) by 416 days.

(21) Appl. No.: 10/598,524

(22) PCT Filed: Mar. 2, 2005

(86) PCT No.: PCT/JP2005/003490
§ 371 (c)(1),
(2), (4) Date: Sep. 1, 2006

(87) PCT Pub. No.: WO2005/086552
PCT Pub. Date: Sep. 15, 2005

(65) Prior Publication Data
US 2007/0181994 A1    Aug. 9, 2007

(30) Foreign Application Priority Data

| Mar. 3, 2004 | (JP) | 2004-059627 |
|---|---|---|
| Mar. 3, 2004 | (JP) | 2004-059629 |
| Mar. 3, 2004 | (JP) | 2004-059630 |
| Mar. 3, 2004 | (JP) | 2004-059631 |
| Mar. 3, 2004 | (JP) | 2004-059632 |
| Mar. 3, 2004 | (JP) | 2004-059633 |
| Mar. 3, 2004 | (JP) | 2004-059634 |
| Mar. 3, 2004 | (JP) | 2004-059635 |
| Dec. 15, 2004 | (JP) | 2004-362991 |
| Dec. 15, 2004 | (JP) | 2004-362992 |
| Dec. 15, 2004 | (JP) | 2004-362993 |
| Dec. 15, 2004 | (JP) | 2004-362994 |
| Dec. 15, 2004 | (JP) | 2004-362995 |
| Dec. 15, 2004 | (JP) | 2004-362996 |
| Dec. 15, 2004 | (JP) | 2004-362997 |
| Dec. 15, 2004 | (JP) | 2004-362998 |

(51) Int. Cl.
H01R 12/04    (2006.01)
H05K 1/00    (2006.01)

(52) U.S. Cl. .................... 174/262; 361/774

(58) Field of Classification Search ......... 174/262–266; 361/774, 792–795
See application file for complete search history.

(56) References Cited

U.S. PATENT DOCUMENTS 6,281,436 B1 * 8/2001 Gotoh et al. ............... 174/538
(Continued)

FOREIGN PATENT DOCUMENTS

JP    3-236956    10/1991
(Continued)

*Primary Examiner*—Jeremy C Norris
(74) *Attorney, Agent, or Firm*—Rankin, Hill & Clark LLP

(57) ABSTRACT

As means for solving a problem of a positional shift of a land and a hole which is caused by an alignment in the formation of an etching resist layer and a plated resist layer in a method of manufacturing a circuit board, there are provided a method of manufacturing a circuit board including the steps of forming a first resin layer on a surface of an insulating substrate having a conductive layer on the surface and an internal wall of a through hole or/and a non-through hole, forming a second resin layer which is insoluble or slightly soluble in a developing solution for the first resin layer on the first resin layer provided on the surface conductive layer, and removing the first resin layer provided over the hole with the developing solution for the first resin layer, and a method of manufacturing a circuit board including the step of uniformly charging a surface of the first resin layer to induce a potential difference to the first resin layer provided over the hole and the first resin layer provided on the surface conductive layer before forming the second resin layer. Moreover, there is provided a circuit board having a hole with a small positional shift and high precision.

3 Claims, 54 Drawing Sheets

U.S. PATENT DOCUMENTS

| | | | | |
|---|---|---|---|---|
| 6,303,880 B1 * | 10/2001 | Asai et al. | | 174/263 |
| 6,534,723 B1 * | 3/2003 | Asai et al. | | 174/255 |
| 7,164,085 B2 * | 1/2007 | Saiki | | 174/261 |
| 7,301,103 B2 * | 11/2007 | Tanaka et al. | | 174/250 |
| 2004/0080052 A1 * | 4/2004 | Ou et al. | | 257/774 |

FOREIGN PATENT DOCUMENTS

| | | |
|---|---|---|
| JP | 7-7265 | 1/1995 |
| JP | 7-142841 | 6/1995 |
| JP | 2002-124765 | 4/2002 |
| JP | 2002-261424 | 9/2002 |

\* cited by examiner

CIRCUIT BOARD MANUFACTURING METHOD AND CIRCUIT BOARD

TECHNICAL FIELD

The present invention relates to a method of manufacturing a circuit board, and more particularly to a method of manufacturing a circuit board having a hole, which is referred to as a through hole or a via hole, and a circuit board obtained by the manufacturing method thereof. In more detail, the invention relates to a method of manufacturing a circuit board for solving a problem of a positional shift between a land and a hole, which is caused by an alignment, and provides the method of manufacturing a circuit board which is adaptable to a landless hole or a hole with having the small land width, of which features are required for a high-density demand of a circuit board.

BACKGROUND ART

Referring to a recent trend for a down-sized or multifunctional electronic equipment, high-density or fine technology of the wiring pattern have been pursued for a circuit board. One of known means for achieving such condition is to form a circuit board in a multilayer. As shown in FIGS. 98(a) and 98(b), in the circuit board formed by stacking a plurality of wiring layers, generally, the conduction is made between the respective layers through a small hole such as a through hole or a non-through hole (below, a hole) of which inner wall is covered or filled with a conductive layer, and which is referred to as a through hole 31, a via hole 32, or an interstitial via hole 33.

FIG. 99 is a schematic view of the hole as seen from the top. In the periphery of the hole 17, a conductive layer referred to as a land 18 is formed. There are various kinds of the land shape such as angular, circular, elliptical, and deformed shape. However, the circular land is frequently used because of the occupied area thereof or the simple use of a circuit design. In order to cope with the trend for the high density, a landless, or narrow land width hole are required.

A method of manufacturing a circuit board includes a subtractive method, an additive method and a semiadditive method. In the subtractive method, an etching resist layer is provided over a circuit portion of an insulating substrate having a conductive layer formed on its surface, and a conductive layer over a non-circuit portion which is exposed is removed by etching so as to form a circuit. In the additive method, a plated resist layer is formed on a non-circuit portion of a surface of an insluting substrate and a conductive layer is formed in a portion corresponding to a circuit portion by a nonelectrolytic plating processing. In the semiadditive method, a plated resist layer is formed on a non-circuit portion of an insulating substrate having a thin conductive layer on its surface, while a conductive layer is formed on a portion corresponding to a circuit portion by an electrolytic plating processing. Thereafter, the plated resist layer on the non-circuit portion is removed and the thin conductive layer on the non-circuit portion is then removed so as to form a circuit by a flash etching processing.

The etching resist layer and the plated resist layer are formed by the methods such as a screen printing method, a photofabrication method, having an exposing and developing step using a photosensitive material, or an ink jet method. In the case in which a landless hole or a hole having a small land width is to be formed, it is important to carry out an alignment in a process of a perforation processing, the screen printing method, the exposing step or the ink jet method. Especially, in the case of forming the landless hole or the hole having a small land width, which are required for a high density circuit board, it is necessary to realize very high precision in an alignment. As shown in FIG. 99, the most desirable alignment for a land should have such a shape as to have a uniform width in all directions of the hole. In other words, the desirable manner is such that the hole and the land make the concentric circles. However, there is a problem in that the hole and the land are not the concentric circles as shown in FIG. 100 when the alignment is not accurate.

FIGS. 100(a) and 100(b) show the schematic plan views, each illustrating a positional shift between the hole and the land in the case. The positional shift at a distance X is generated each in the hole having a small land width in FIG. 100(a), and in the hole having a large land width in FIG. 100(b). Although the land is formed around the hole in the hole having the large land width in FIG. 100(b), the land is cut away by the hole portion in the hole having the small land width in FIG. 100(a), resulting in a problem of impossibility to form a hole having a small land around a whole outer periphery of the hole. Under the conventional circumstance, the precision in the alignment has a limit due to precision in the perforation processing, the expansion of a substrate or a change in a dimension of a photomask for an exposure. Moreover, the hole to be formed on the high density circuit board has a large number of diameters and the number of the holes is very large. For these reasons, it has been very difficult to accurately carry out the alignment with respect to all the holes. As described in JP-A-3-236956 and JP-A-7-7265, accordingly, the circuit design has a problem for employing a large land width regardless of the requirement of a landless hole or a hole having a small land width for the high density circuit board.

It is an object of the invention to provide a method of manufacturing a circuit board such as in a subtractive method, an additive method or a semiadditive method, which solves the problem of the positional shift between a land and a hole, being caused by an alignment in the formation of an etching resist layer and a plated resist layer. Such a method can be employed for a landless hole or a hole having a small land width, which is required for a high-density circuit board.

DISCLOSURE OF THE INVENTION

The inventors made studies in order to solve the problem, resulting in the following invention:

(1) A method of manufacturing a circuit board comprising the steps of forming a first resin layer on a surface of an insulating substrate having a conductive layer on the substrate surface and an internal wall surface of a through hole or/and a non-through hole that is formed in the substrate; forming a second resin layer on the first resin layer provided on the surface of the conductive layer, said second resin layer being insoluble or slightly soluble in a developing solution for the first resin layer, and removing the first resin layer that is provided over the hole with the developing solution for the first resin layer.

(2) A method of manufacturing a circuit board comprising the steps of: forming a first resin layer on a surface of an insulating substrate having a through hole or/and a non-through hole and having a conductive layer on a substrate surface with excluding an internal wall surface of said through hole or/and said non-through hole; forming a second resin layer on the first resin layer provided on the surface, said second layer being insoluble or slightly soluble in a developing solution for the first resin layer, and removing the first resin layer that is provided over the hole with the developing solution for the first resin layer.

(3) A method of manufacturing a circuit board comprising the steps of: forming a first resin layer on a surface of an insulating substrate having a conductive layer on the substrate surface and an internal wall surface of a through hole or/and a non-through hole that is formed in the substrate; forming a second resin layer on the first resin layer provided on the surface of the conductive layer; removing the first resin layer provided over the hole; forming a fourth resin layer over the internal wall surface of the through hole or/and the non-through hole; removing the second resin layer, and removing the first resin layer.

(4) A method of manufacturing a circuit board comprising the steps of: providing a photo-crosslinkable resin layer on the surface of the conductive layer with respect to an insulating substrate having a conductive layer on the substrate surface and an internal wall of a through hole or/and a non-through hole, which is manufactured by the method according to the (3), and having a fourth resin layer on the internal wall of the through hole or/and the non-through hole and in a peripheral portion of the hole according to circumstances; crosslinking the photo-crosslinkable resin at a portion corresponding to a circuit portion; removing an unreacted photo-crosslinkable resin layer at a portion corresponding to a non-circuit portion; etching the conductive layer which is exposed, and removing the fourth resin layer and the photo-crosslinkable resin layer.

(5) A method for manufacturing a circuit board, comprising the steps of: forming a photo-crosslinkable resin layer on a surface of an insulating substrate having a conductive layer on a substrate surface and an inner wall surface of a through hole or/and a non-through hole that is formed in the substrate; forming a second resin layer on a portion of the photo-crosslinkable resin layer on the surface of the conductive layer; removing the photo-crosslinkable resin layer that is provided over the hole; providing a fourth resin layer on the conductive layer in the hole; crosslinking a photo-crosslinkable resin at a portion corresponding to a circuit part; removing the second resin layer; removing an unreacted photo-crosslinkable resin layer at a portion corresponding to a non circuit part; etching the exposed portion of the conductive layer; and removing the fourth resin layer and the photo-crosslinkable resin layer;

(6) A method for manufacturing a circuit board, comprising the steps of: forming a photoconductive layer on a surface of an insulating substrate having a conductive layer on a substrate surface and the inner wall surface of a through hole or/and a non-through hole that is formed in the substrate; forming a second resin layer on the photoconductive layer except for a portion over the hole; removing the portion of the photoconductive layer over the hole; forming a fourth resin layer on a portion of the conductive layer in the hole; removing the second resin layer; forming an electrostatic latent image on the photoconductive layer; forming a third resin layer on the photoconductive layer at a portion corresponding to a circuit part; removing the photoconductive layer at a portion corresponding to a non circuit part; etching the exposed portion of the conductive layer; and removing the third resin layer, the photoconductive layer, and the fourth resin layer.

(7) A method for manufacturing a circuit board, comprising the steps of: forming a photoconductive layer on a surface of an insulating substrate having a conductive layer on a substrate surface and the inner wall surface of a through hole or/and a non-through hole that is formed in the substrate; forming a second resin layer on the photoconductive layer except for a portion over the hole; removing a portion of the photoconductive layer over the hole; removing the second resin layer; forming an electrostatic latent image on the photoconductive layer; forming a third resin layer on the photoconductive layer at a portion corresponding to a circuit part and on a portion of the conductive layer in the hole; removing a portion of the photoconductive layer corresponding to a non circuit part; etching the exposed portion of the conductive layer; and removing the third resin layer and the photoconductive layer.

(8) A method of manufacturing a circuit board comprising the steps of: forming a photo-crosslinkable resin layer as a first resin layer on a surface of an insulating substrate having a first conductive layer on a substrate surface and an internal wall surface of a through hole or/and a non-through hole that is formed in the substrate, forming a second resin layer on the photo-crosslinkable resin layer provided on the surface of the conductive layer, removing the photo-crosslinkable resin layer provided over the hole, crosslinking the photo-crosslinkable resin layer in a portion corresponding to a non-circuit portion, removing an unreacted photo-crosslinkable resin layer and the second resin layer, forming a second conductive layer on the first conductive layer which is exposed, and removing the photo-crosslinkable resin layer which is crosslinked and removing the first conductive layer in a lower part thereof.

(9) The method of manufacturing a circuit board according to any of the (1), (2), (3), (5), (6), (7) and (8), wherein the step of forming a second resin layer on the first resin layer provided on the surface conductive layer includes the steps of uniformly charging a surface of the first resin layer and inducing a potential difference to the first resin layer provided over the hole and the first resin layer provided on the surface conductive layer, and forming the second resin layer on the first resin layer provided on the surface conductive layer by utilizing the potential difference.

(10) The method of manufacturing a circuit board according to any of the (1), (3), (5), (6) and (7), further comprising the step of providing a plated conductive layer on the conductive layer provided on the internal wall surface of the hole after removing the first resin layer provided over the hole.

(11) The method of manufacturing a circuit board according to any of the (1), (3), (5), (6) and (7), further comprising the steps of providing a plated conductive layer on the conductive layer formed on the internal wall surface of the hole after removing the first resin layer provided over the hole, and removing the first resin layer in a peripheral portion of the hole to enlarge a portion corresponding to a land portion with a first resin layer removing solution.

(12) A circuit board in which a circuit portion is formed on an insulating substrate by a conductive layer and there provided a through hole and/or a non-through hole having an internal wall covered or filled with the conductive layer, wherein a land of the through hole and/or the non-through hole is formed continuously like a concentric circle with respect to the hole, a maximum height of the conductive layer in a non-coupling portion of the land is equal to or greater than −5 μm with a corner portion of the insulating substrate set to be a reference point and is equal to or smaller than a thickness of the conductive layer in a circuit portion, and a land width from the reference point is 0 to 40 μm.

(13) The circuit board according to the (12), wherein a difference between maximum and minimum values of the land width is equal to or smaller than 8 μm.

(14) The circuit board according to the (12) or (13), wherein a sectional shape of the conductive layer in the circuit portion is different from that of the conductive layer in the land portion.

(15) The circuit board according to any of the (12) to (14), wherein a portion having a maximum height is present within a range from the internal wall of the hole to a thickness of the conductive layer in the hole in the conductive layer of the land.

The methods (1) and (2) of manufacturing a circuit board according to the invention which are the methods of manufacturing an open substrate having a resin constitute a fundamental process in the invention. In the method (1) of manufacturing a circuit board according to the invention, first of all, the first resin layer is provided on the surface of the insulating substrate having the conductive layer on the surface and the internal wall of the through hole or/and the non-through hole in order to close the hole. Next, the second resin layer is formed on the first resin layer by means such as an electrode-positing method.

In the method (1) of manufacturing a circuit board according to the invention, a solution, in which a resin to be used for the second resin layer is dispersed in a liquid in a particle state, is used to form the second resin layer. The resin particle is charged to be positive or negative. As shown in FIG. 101, a development electrode 19 is disposed to be opposed to a circuit forming substrate 4, and conductive layer 2 is provided on a surface and an internal wall of a hole 3 with stacking a first resin layer 5 thereon. When the conductive layer 2 of the circuit forming 4 is grounded, and a proper bias voltage being applied, a charged resin particle 20 is electrophoresed in a direction of the circuit forming substrate 4 in accordance with an electric field E. FIG. 101 shows the case in which the resin particle 20 is charged to be positive and a positive bias voltage is applied. Also in the case in which the resin particle is charged to be negative and a negative bias voltage is applied, the resin particle 20 is electrophotoresed in the direction of the circuit forming substrate 4 in the same manner.

The amount of the resin particles, which have come closer in the direction of the circuit forming substrate by electrophoresis, to be deposited on the photoconductive layer is determined by the electrostatic capacity of the photoconductive layer. As shown in FIG. 102, in an insulating substrate 1 having a conductive layer 2 on each surface and the inner wall of a through hole (through hole) 31 or/and a via hole (non-through hole) 32, and a photoconductive layer 15 bonded thereon, the electrostatic capacity of the photoconductive layer 15 is affected by the underlying shape. Namely, a difference in electrostatic capacity is caused between the portion of the photoconductive layer 15 on the conductive layer 2 and the portion of the photoconductive layer 15 on the through hole (through hole) 31 or/and the via hole (non-through hole) 32.

Below, the difference in electrostatic capacity of the photoconductive layer, and the difference in amount of the second resin layer deposited based thereon will be described. When this circuit board is assumed to be a capacitor having the conductive layer surface and the photoconductive layer surface as electrodes, the following equation (1) holds:

$$Q=CV \quad (1)$$

[where, Q; the electric charge on the photoconductive layer, C; the electrostatic capacity, and V; the electric potential of the photoconductive layer surface with reference to the conductive layer surface]

The electrostatic capacity C is expressed by the following equation (2):

$$C=\in S/d \quad (2)$$

[where, $\in$; the dielectric constant, d; the distance between the photoconductive layer surface and the conductive layer surface, and S; the area]

Herein, the electrostatic capacity of the portion of the photoconductive layer over the hole is represented by $C_H$; the electrostatic capacity of the portion of the photoconductive layer on the surface conductive layer, $C_S$; the electric charge on the portion of the photoconductive layer over the hole, $Q_H$; the electric charge on the portion of the photoconductive layer on the surface conductive layer, $Q_S$; the electric potential of the portion of the photoconductive layer surface over the hole, $V_H$; the electric potential on the portion of the photoconductive layer on the surface conductive layer, $V_S$; the number of the resin particles for forming the second resin layer, deposited on the portion of the photoconductive layer over the hole, $N_H$; the number of the resin particles for forming the second resin layer, deposited on the portion of the photoconductive layer on the surface conductive layer, Ns; the distance between the portion of the photoconductive layer surface over the hole and the conductive layer surface $d_H$; and the distance between the portion of the photoconductive layer surface on the surface conductive layer and the conductive layer surface, $d_S$.

Namely, as shown in FIG. 103, when the electrostatic capacities C in a given area (S is constant) are compared between over the hole and on the surface conductive layer, the electrostatic capacity $C_H$ over the hole is smaller than the electric capacity $C_S$ on the surface conductive layer because the distance $d_H$ 22 between the portion of the photoconductive layer surface over the hole and the conductive layer surface is larger than the distance $d_s$ 21 between the portion of the photoconductive layer surface on the surface conductive layer and the conductive layer surface. The resin particles are deposited on the photoconductive layer so that the entire surface of the photoconductive layer becomes equipotential (i.e., $V_H = V_S$). Therefore, the electric charge $Q_H$ over the hole becomes smaller than the electric charge $Q_S$ on the surface conductive layer. As shown by the following equation (3), the magnitude of the electric charge Q is proportional to the number N of the resin particles for forming the second resin layer.

$$Q=Nq \quad (3)$$

[where, N; the number of the resin particles for forming the second resin layer, and q; the electric charge of one particle for forming the second resin layer]

Therefore, the number $N_H$ of the resin particles for forming the second resin layer, being deposited on the portion of the photoconductive layer over the hole, becomes very small, and it is smaller than the number $N_S$ of the resin particles for forming the second resin layer, which is deposited on the portion of the photoconductive layer on the surface conductive layer.

As described above, a difference is made between the amount of the second resin layer stacked onto the first resin layer that is provided over the hole, and the amount of the second resin stacked onto the first resin layer that is provided on the surface conductive layer, which is caused due to a difference in an electrostatic capacity C. As for the second resin layer provided on the first resin layer that is provided on the surface conductive layer, said second resin layer is formed up to such a thickness as to make a resisting property to the developing solution for the first resin layer. On the other hand, as for on the first resin layer that is provided over the hole, this second resin layer is provided in such an amount as to be eroded in the developing solution for the first resin layer on the first resin layer. By removing the first resin layer provided over the hole with the second resin layer to be a resist, it is possible to expose the conductive layer provided on the internal wall of the hole and around the hole accurately and selectively.

In the method (2) of manufacturing a circuit board according to the invention, it is possible to manufacture an open substrate having a resin in the same manner as shown in the method (1) of manufacturing a circuit board according to the invention by using the insulating substrate having the through hole or/and the non-through hole and having the conductive layer on the surface excluding the internal wall of the hole in place of the insulating substrate having the conductive layer on the surface and the internal wall of the through hole or/and the non-through hole.

A serial process included in the methods (1) and (2) of manufacturing a circuit board according to the invention does not require an alignment process. Irrespective of the size, shape, number and position of the holes present on the circuit board, accordingly, it is possible to easily manufacture an open substrate having a resin in which a resin layer is not present in only the hole portion accurately and selectively.

FIGS. 11 to 14 are schematic sectional views showing an example of the open substrate having a resin which is manufactured by the serial process included in the method (1) of manufacturing a circuit board according to the invention. FIG. 11 shows an open substrate 11 having a resin in which a first resin layer 5 and a second resin layer 6 are provided on a surface excluding a hole 3 portion of an insulating substrate 1 having a conductive layer 2 on a surface and an internal wall of the hole 3. In the method (1) of manufacturing a circuit board according to the invention, it is possible to remove the first resin layer in a portion corresponding to a distance La from the internal wall of the hole as shown in FIG. 12 by regulating a second resin layer forming condition and a first resin layer removing condition over the hole. Moreover, it is possible to form a uniform land width as shown in FIG. 99. As shown in FIGS. 13 and 14, furthermore, the first resin layer or/and the second resin layer can also form an open substrate having a resin which is protruded into the hole.

FIGS. 15 to 18 are schematic sectional views showing an example of an open substrate having a resin which is manufactured by a serial process included in the method (2) of manufacturing a circuit board according to the invention. FIG. 15 shows an open substrate 11 having a resin in which a first resin layer 5 and a second resin 6 are provided on a surface excluding the hole 3 portion of the insulating substrate 1 having the conductive layer 2 on a surface. In the method (2) of manufacturing a circuit board according to the invention, it is possible to remove the first resin layer in a portion corresponding to a distance La from the internal wall of the hole as shown in FIG. 16 by regulating the second resin layer forming condition and the first resin layer removing condition over the hole. As shown in FIG. 99, moreover, it is possible to form a uniform land width. As shown in FIGS. 17 and 18, furthermore, it is also possible to form an open substrate having a resin in which the first resin layer and the second resin layer are protruded into the hole.

For the open substrate having a resin which is obtained in the method of manufacturing a circuit board according to the invention, there is carried out a serial process obtained by properly combining a hole filling ink step, a conductive ink filling step, an electrodepositing step, a metal plating step, a resist forming step and an etching step. Consequently, it is possible to manufacture a circuit board by a subtractive method, an additive method or a semiadditive method.

EXPLANATION OF THE DESIGNATION

Figure 1:
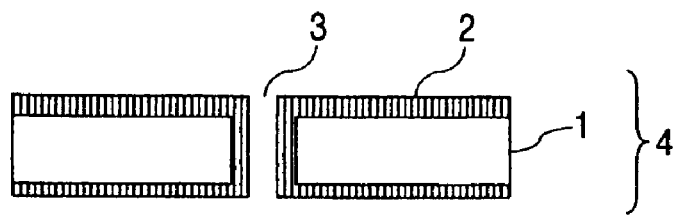
FIG. 1 is a cross sectional view showing one step in a method for manufacturing a circuit board of the present invention.

1 insulating substrate
2 conductive layer
3 hole
4 circuit forming substrate
5 first resin layer
6 second resin layer
7 in-hole plated conductive layer
8 third resin layer
10 fourth resin layer
11 open substrate having resin
12 first conductive layer
13 second conductive layer
17 hole
18 land
19 development electrode
20 resin particle
21 distance between first resin layer surface on surface conductive layer and conductive layer surface
22 distance between first resin layer surface over the hole and conductive layer surface
24 alkali soluble resin layer 25 photo-crosslinkable resin layer
26 crosslinked portion
27 multiplayer photo-crosslinkable resin layer
28 circuit portion
31 through hole (through hole)
32 via hole (non-through hole)
33 interstitial via hole
38 photo-crosslinkable resin layer (dry film photoresist)
39 crosslinked portion

BEST MODE FOR CARRYING OUT THE INVENTION

Method of Manufacturing Open Substrate Having Resin

With reference to FIGS. 1 to 5, description will be given to an embodiment of a method of manufacturing an open substrate having a resin to be a basis of a method of manufacturing a circuit board according to the invention. The description will be given by taking a through hole as an example. In the same method as will be described below with a non-through hole, it is possible to manufacture a circuit board. Also in a buildup substrate in which a through hole and a via hole coexist, furthermore, it is possible to manufacture the circuit board by the same method.

Figure 2:
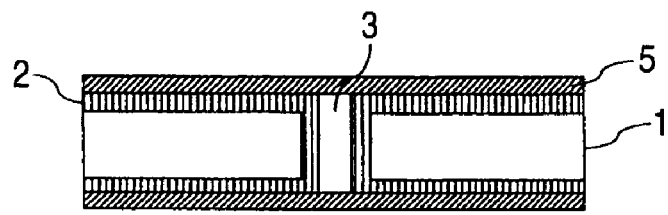
FIG. 2 is a cross sectional view showing one step in a method for manufacturing a circuit board of the present invention.
Figure 4:
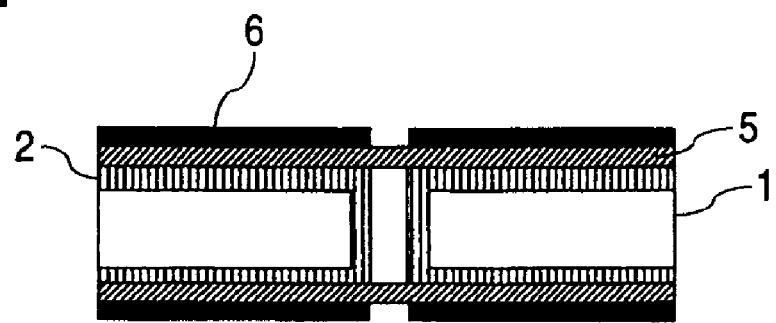
FIG. 4 is a cross sectional view showing one step in a method for manufacturing a circuit board of the present invention.
Figure 5:
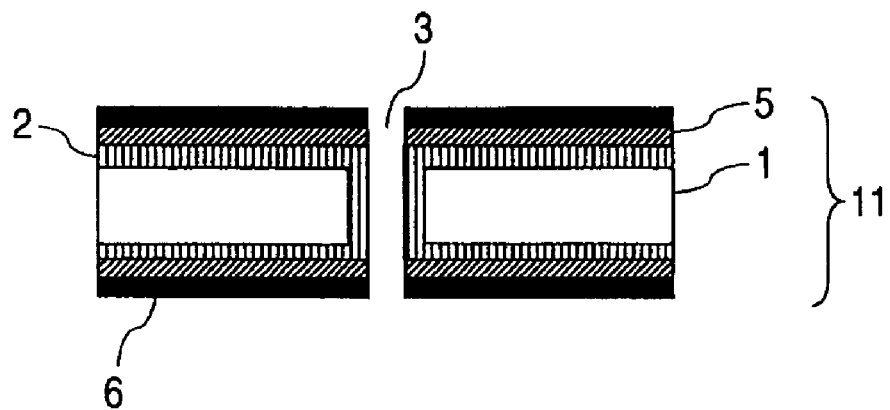
FIG. 5 is a cross sectional view showing one step in a method for manufacturing a circuit board of the present invention.

In a method (1) of manufacturing a circuit board according to the invention, a hole 3 is closed and a first resin layer 5 is stacked to be tenting onto a circuit forming substrate 4 which is formed by an insulating substrate 1 having a conductive layer 2 on a surface and an internal wall of the hole 3 shown in FIG. 1 (FIG. 2). Next, a second resin layer 6 is formed on a first resin layer 5 provided on a surface conductive layer by means such as an electrodepositing method (FIG. 4). Furthermore, only the first resin layer 5 provided over the hole 3 having a small amount of the second resin layer which is stacked is removed with a developing solution for a first resin layer so that an open substrate 11 having a resin is manufactured (FIG. 5). As shown in FIGS. 11 to 14, it is possible to form a circuit pattern having a desirable land width by regulating the amount of removal of the first resin layer.

Figure 6:
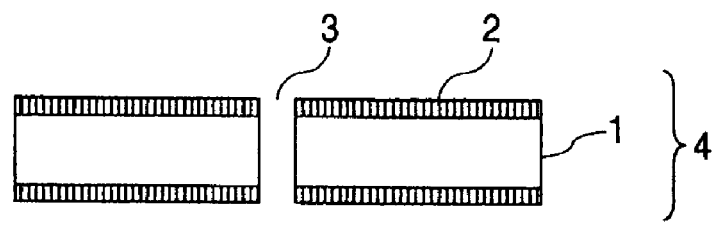
FIG. 6 is a cross sectional view showing one step in a method for manufacturing a circuit board of the present invention.
Figure 7:
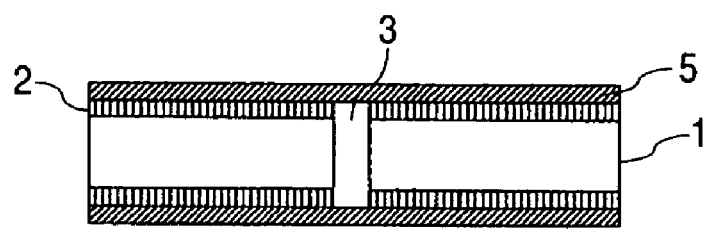
FIG. 7 is a cross sectional view showing one step in a method for manufacturing a circuit board of the present invention.
Figure 9:
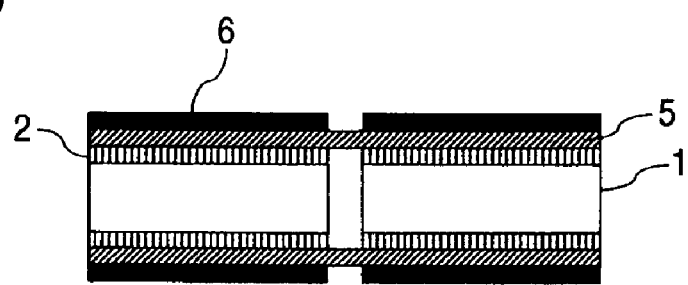
FIG. 9 is a cross sectional view showing one step in a method for manufacturing a circuit board of the present invention.
Figure 10:
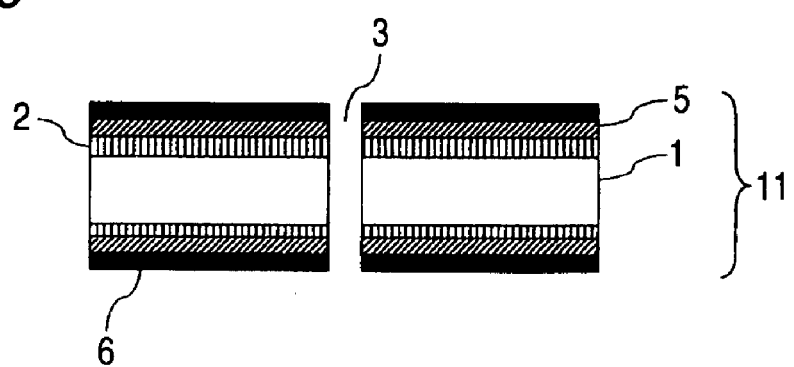
FIG. 10 is a cross sectional view showing one step in a method for manufacturing a circuit board of the present invention.
Figure 11:
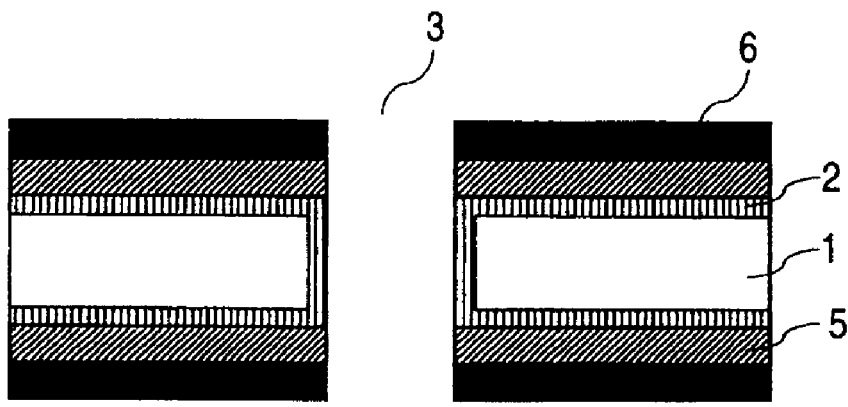
FIG. 11 is a cross sectional view of an example of an open substrate having resin by a method for manufacturing a circuit board of the present invention.
Figure 12:
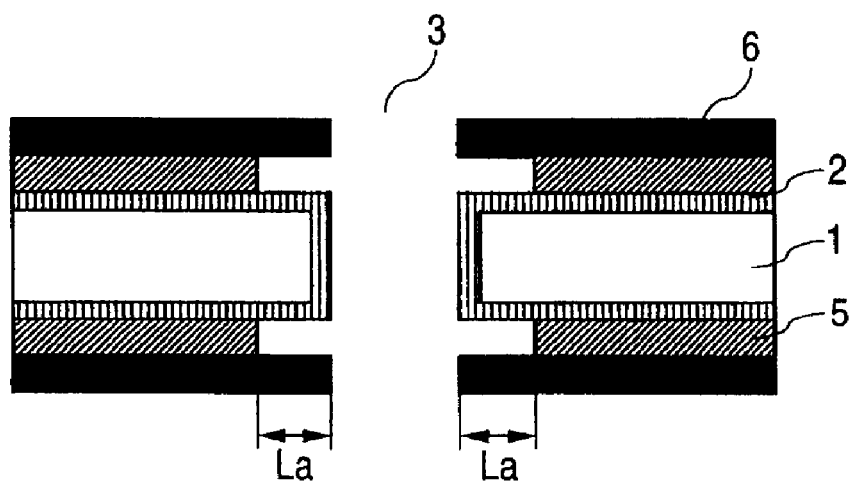
FIG. 12 is a cross sectional view of an example of an open substrate having resin by a method for manufacturing a circuit board of the present invention.
Figure 13:
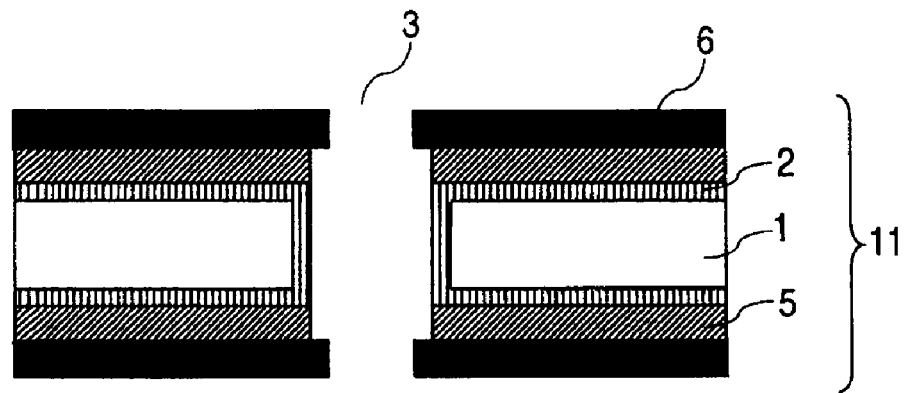
FIG. 13 is a cross sectional view of an example of an open substrate having resin by a method for manufacturing a circuit board of the present invention.

In a method (2) of manufacturing a circuit board according to the invention, the hole 3 shown in FIG. 6 is closed and the first resin layer 5 is stacked to be tenting onto the circuit forming substrate 4 which is constituted by the insulating substrate 1 having the hole 3 and the conductive layer 2 on the surface as shown in FIG. 6 (FIG. 7). Next, the second resin layer 6 is formed on the first resin layer 5 provided on the surface conductive layer by means such as an electrodepositing method (FIG. 9). Furthermore, the first resin layer 5 provided over the hole 3 on which the second resin layer is not formed is removed with the developing solution for the first resin layer so that the open substrate 11 having a resin is manufactured (FIG. 10). As shown in FIGS. 15 to 18, it is possible to form a circuit pattern having a desirable land width by regulating the amount of removal of the first resin layer.

Method of Manufacturing Circuit Board by Subtractive Method

Figure 19:
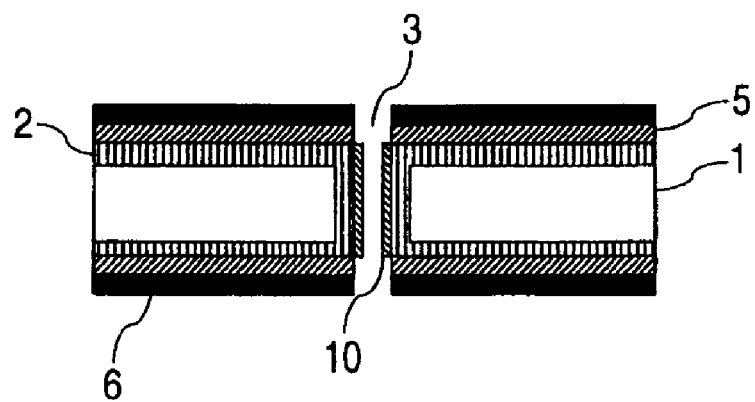
FIG. 19 is a cross sectional view showing one step in a method for manufacturing a circuit board of the present invention.
Figure 20:
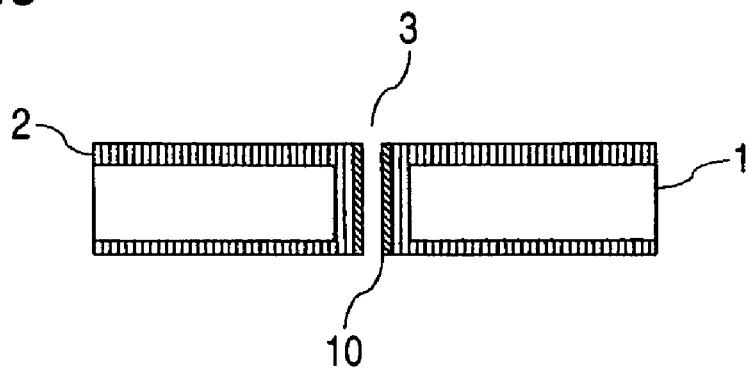
FIG. 20 is a cross sectional view showing one step in a method for manufacturing a circuit board of the present invention.

In a method (3) of manufacturing a circuit board according to the invention, the open substrate 11 having a resin is manufactured (FIG. 5) by the same method as the method (1) of manufacturing a circuit board according to the invention. As shown in FIGS. 11 to 14, it is possible to form a circuit pattern having a desirable land width by regulating the amount of removal of the first resin layer. Subsequently, a fourth resin layer 10 is formed on the conductive layer on the internal wall of the hole and in the peripheral portion of the hole (FIG. 19) and the second resin layer 6 and the first resin layer 5 are removed. Consequently, it is possible to obtain a state in which only the internal wall of the hole and the peripheral portion of the hole are covered with the fourth resin layer 10 (FIG. 20). The second resin layer 6 and the first resin layer 5 may be removed at the same time and the first resin layer 5 may be removed (FIG. 20) after the second resin layer 6 is removed (FIG. 22). Before providing the fourth resin layer 10 on the conductive layer on the internal wall of the hole and in the peripheral portion of the hole, moreover, it is also possible to remove the second resin layer 6 (FIG. 21), and subsequently, to provide the fourth resin layer 10 (FIG. 22) and to then remove the first resin layer 5 (FIG. 20).

For the insulating substrate (FIG. 20) having the conductive layer on the surface and the internal wall of the through hole or/and the non-through hole and having the fourth resin layer provided on the conductive layer corresponding to the hole and the land portion (FIG. 20), for example, it is possible to provide an etching resist layer on the surface conductive layer by a photofabrication method, a screen printing method and an ink jet method. Such a method of providing the etching resist layer has been described in "Printed Circuit Technique Manual" (edited by Japan Electronics Packaging and Circuits Association and issued in 1987 by THE NIKKAN KOGYO SHIMBUN LTD.), publications of JP-A-5-338187, JP-A-2002-16343, Japanese Patent No. 3281476, Japanese Patent No. 3281486, JP-A-2002-158422 and JP-A-2002-23470).

Figure 23:
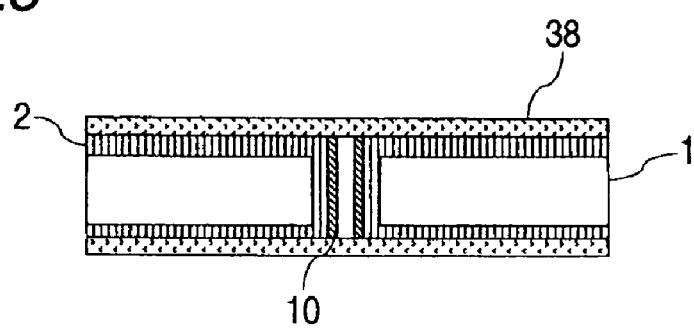
FIG. 23 is a cross sectional view showing one step in a method for manufacturing a circuit board of the present invention.
Figure 24:
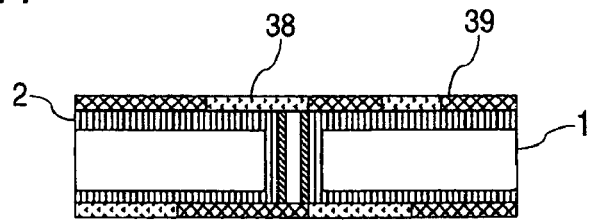
FIG. 24 is a cross sectional view showing one step in a method for manufacturing a circuit board of the present invention.
Figure 25:
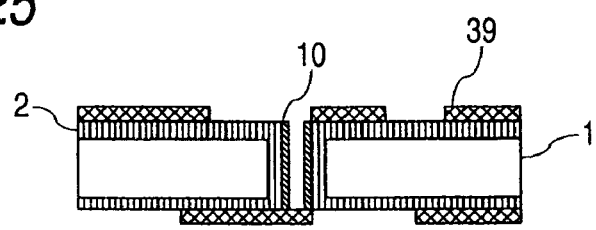
FIG. 25 is a cross sectional view showing one step in a method for manufacturing a circuit board of the present invention.
Figure 26:
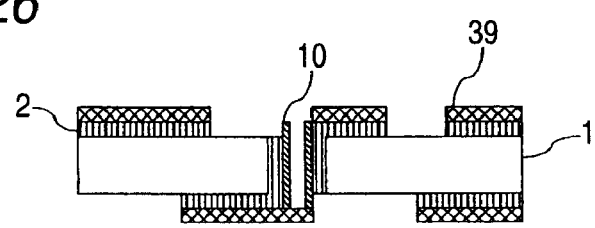
FIG. 26 is a cross sectional view showing one step in a method for manufacturing a circuit board of the present invention.
Figure 27:
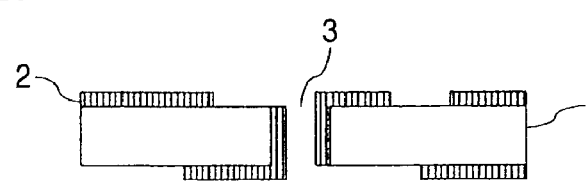
FIG. 27 is a cross sectional view showing one step in a method for manufacturing a circuit board of the present invention.

A method (4) of manufacturing a circuit board according to the invention uses a photo-crosslinkable resin layer as one of the photofabrication methods and an etching resist layer is provided on a surface conductive layer. For the insulating substrate (FIG. 20) having the conductive layer on the surface and the internal wall of the through hole or/and the non-through hole and having the fourth resin layer provided on the conductive layer corresponding to the hole and the land portion, a photo-crosslinkable resin layer 38 is provided (FIG. 23). Next, the circuit portion is exposed to crosslink the photo-crosslinkable resin layer (FIG. 24) and the unreacted photo-crosslinkable resin layer is removed (FIG. 25), and the conductive layer 2 corresponding to the exposed non-circuit portion is then removed by etching (FIG. 26) and an etching resist layer of an unnecessary crosslinked portion 39 is removed to manufacture a circuit board (FIG. 27).

Method of Manufacturing Circuit Board by Subtractive Method Using Photo-Crosslinkable Resin Layer as First Resin Layer In a method (5) of manufacturing a circuit board according to the invention, first of all, the photo-crosslinkable resin layer is provided (FIG. 2) as the first resin layer 5 on the surface of the insulating substrate (FIG. 1) having the conductive layer on the surface and the internal wall of the through hole or/and the non-through hole. Next, the second resin layer 6 is formed on the photo-crosslinkable resin layer provided on the conductive layer 2 (FIG. 4). Then, the photo-crosslinkable resin layer provided over the hole 3 which is not covered with the second resin layer 6 is removed with a photo-crosslinkable resin layer removing solution (FIG. 5). As shown in FIGS. 11 to 14, it is possible to form a circuit pattern having a desirable land width by regulating the amount of removal of the first resin layer.

Figure 28:
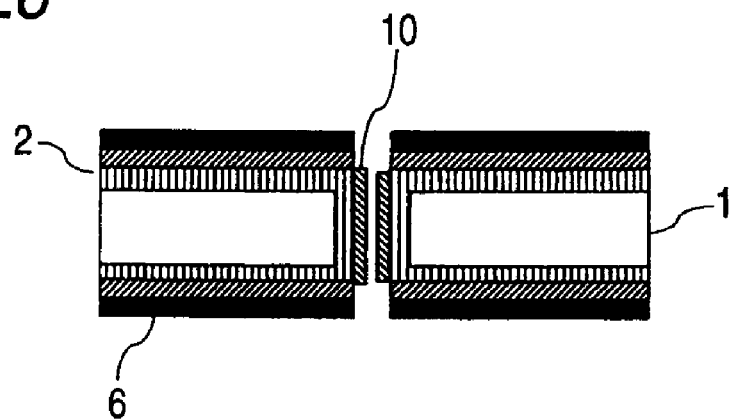
FIG. 28 is a cross sectional view showing one step in a method for manufacturing a circuit board of the present invention.
Figure 29:
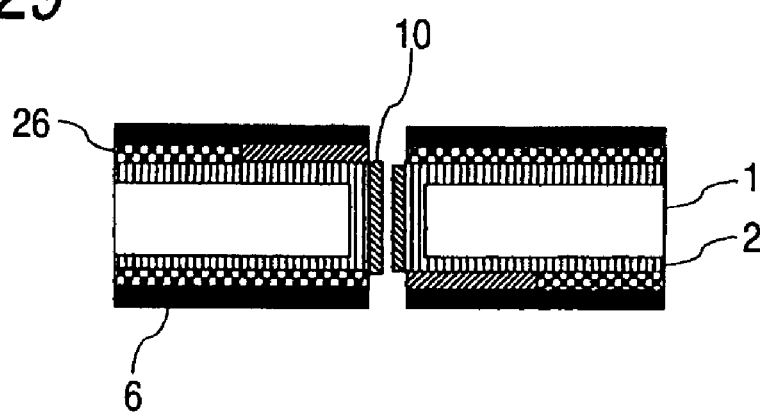
FIG. 29 is a cross sectional view showing one step in a method for manufacturing a circuit board of the present invention.

Then, a fourth resin layer 10 is formed on the portion of the conductive layer on the inner wall of the hole 3 and in the periphery of the hole (FIG. 28). For forming the fourth resin layer selectively on the portion of the conductive layer on the inner wall of the hole 3 and in the periphery of the hole, an electrodeposition method can be preferably used. Then, a circuit pattern is exposed to light by contact exposure or projection exposure using a photomask, or a laser direct drawing method, thereby to crosslink the portion of the photo-crosslinkable resin layer 26 corresponding to a circuit part (FIG. 29).

Figure 30:
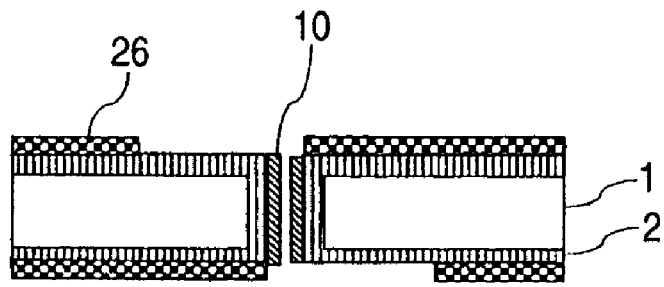
FIG. 30 is a cross sectional view showing one step in a method for manufacturing a circuit board of the present invention.
Figure 31:
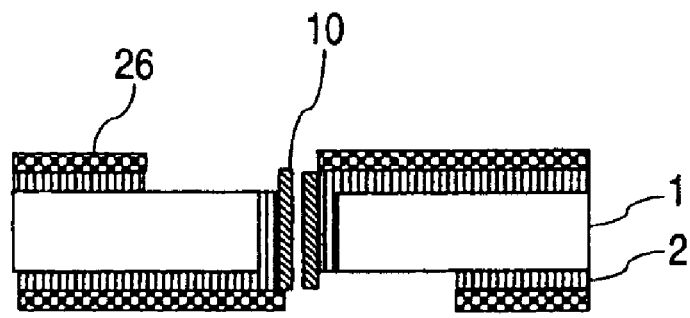
FIG. 31 is a cross sectional view showing one step in a method for manufacturing a circuit board of the present invention.
Figure 32:
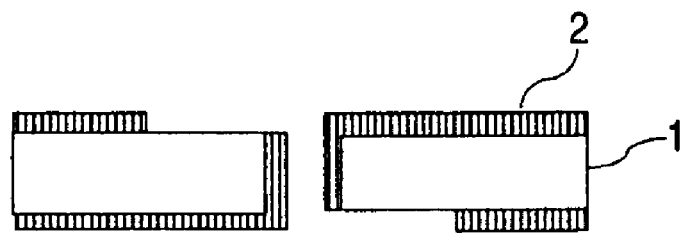
FIG. 32 is a cross sectional view showing one step in a method for manufacturing a circuit board of the present invention.

Then, the unreacted portion of the photo-crosslinkable resin layer corresponding to a non circuit part and the second resin layer are removed (FIG. 30). The unreacted portion of the photo-crosslinkable resin layer and the second resin layer may be removed by one operation. Alternatively, after removing the second resin layer, the unreacted portion of the photo-crosslinkable resin layer may be removed. Then, the exposed portion of the conductive layer 2 corresponding to a non circuit part is removed by etching (FIG. 31). The remaining fourth resin layer 10 and the crosslinked portion 26 of the photo-crosslinkable resin layer are removed by peeling, thereby to manufacture a circuit board (FIG. 32).

The method (5) for manufacturing a circuit board in this invention has been described in the order of the steps thereof. However, it is also possible to manufacture the same circuit board by combining the respective steps without exact manners of manufacturing the circuit board according to the order of the steps. In other words, in the process up to the step of removing the portion of the photo-crosslinkable resin layer over the hole (FIG. 5), manufacturing is carried out in the same order of steps as with the first aspect of the method. Then, it is possible to change the order of the four steps, the step of providing a fourth resin layer on a portion of the conductive layer in the hole; the step of crosslinking a portion of a photo-crosslinkable resin corresponding to a circuit part; the step of removing the second resin layer; and the step of removing an unreacted portion of the photo-crosslinkable resin layer corresponding to a non circuit part. For example, there are a method in which the step of providing a fourth resin layer on a portion of the conductive layer in the hole; the step of removing the second resin layer; the step of crosslinking a portion of a photo-crosslinkable resin corresponding to a circuit part; and the step of removing an unreacted portion of the photo-crosslinkable resin layer corresponding to a non circuit part are carried out sequentially, and a method in which the step of removing the second resin layer; the step of providing a fourth resin layer on a portion of the conductive layer in the hole; the step of crosslinking a portion of a photo-crosslinkable resin corresponding to a circuit part; and the step of removing an unreacted portion of the photo-crosslinkable resin layer corresponding to a non circuit part are carried out sequentially.

Alternatively, mention may be made of a method in which the step of providing a fourth resin layer on a portion of the conductive layer in the hole; the step of crosslinking a portion of a photo-crosslinkable resin corresponding to a circuit part; the step of removing the second resin layer; and the step of removing an unreacted portion of the photo-crosslinkable resin layer corresponding to a non circuit part are carried out sequentially, and a method in which the step of crosslinking a portion of a photo-crosslinkable resin corresponding to a circuit part; the step of providing a fourth resin layer on a portion of the conductive layer in the hole; the step of removing the second resin layer; and the step of removing an unreacted portion of the photo-crosslinkable resin layer corresponding to a non circuit part are carried out sequentially. By carrying out the step of crosslinking a portion of a photo-crosslinkable resin corresponding to a circuit part prior to the step of removing the second resin layer, it is possible to expose the photo-crosslinkable resin layer to light via the second resin layer.

Further, it is also possible to simultaneously carry out the step of removing the second resin layer and the step of removing an unreacted portion of the photo-crosslinkable resin layer corresponding to a non circuit part. Mention may be made of a method in which the step of providing a fourth resin layer on a portion of the conductive layer in the hole and the step of crosslinking a portion of a photo-crosslinkable resin corresponding to a circuit part are sequentially carried out, and then, the step of removing the second resin layer and the step of removing an unreacted portion of the photo-crosslinkable resin layer corresponding to a non circuit part are sequentially carried out; or a method in which the step of crosslinking a portion of a photo-crosslinkable resin corresponding to a circuit part, and the step of providing a fourth resin layer on a portion of the conductive layer in the hole are carried out sequentially, and then the step of removing the second resin layer and the step of removing an unreacted portion of the photo-crosslinkable resin layer corresponding to a non circuit part are sequentially carried out. The method is superior because it can reduce the number of steps by one.

Method of Manufacturing Circuit Board by Subtractive Method Using Photoconductive Layer as First Resin Layer With a method (6) for manufacturing a circuit board (1) of the invention, first, a photoconductive layer 5 is provided on each surface of a circuit forming substrate 4 (FIG. 1) which is an insulating substrate having a conductive layer on each surface and the inner wall of a through hole or/and a non-through hole (FIG. 2). Then, by a means such as electrodeposition, a second resin layer 6 is formed on the portion of the photoconductive layer 5 on each conductive layer 2 (FIG. 4). Subsequently, the portion of the photoconductive layer 5 over the hole 3 not covered with the second resin layer 6 is removed by a developer for the photoconductive layer (FIG. 5). As shown in FIGS. 11 to 14, it is possible to adjust the land width of the hole according to the amount of the photoconductive layer to be removed.

Figure 21:
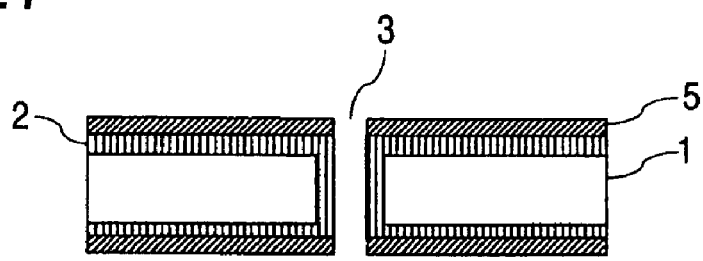
FIG. 21 is a cross sectional view showing one step in a method for manufacturing a circuit board of the present invention.
Figure 22:
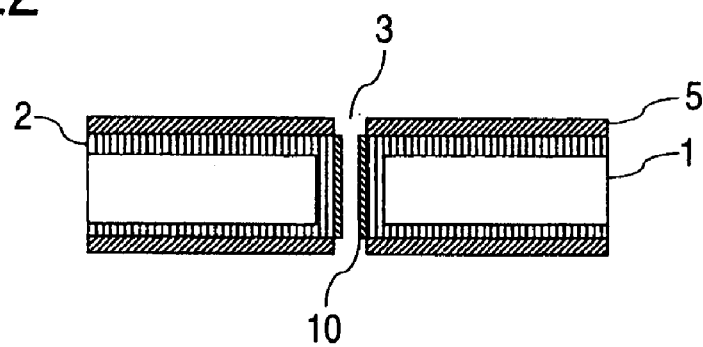
FIG. 22 is a cross sectional view showing one step in a method for manufacturing a circuit board of the present invention.
Figure 33:
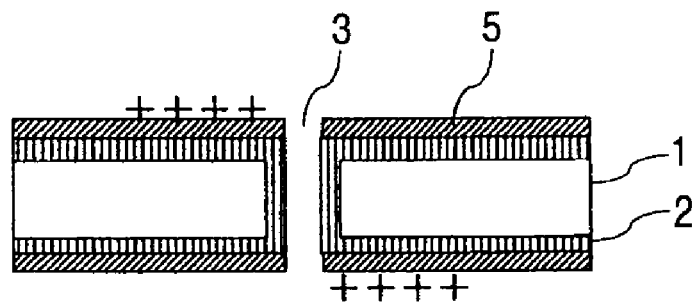
FIG. 33 is a cross sectional view showing one step in a method for manufacturing a circuit board of the present invention.
Figure 34:
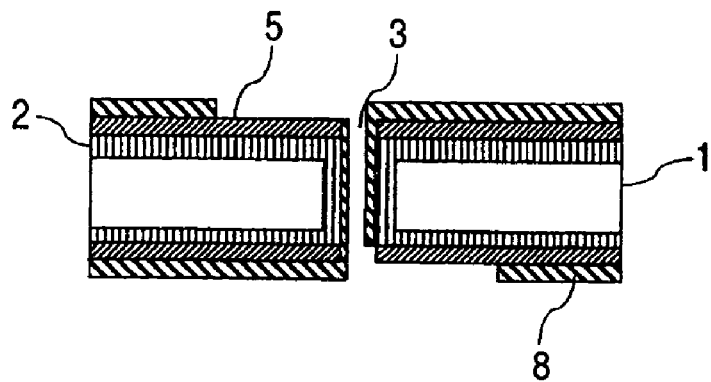
FIG. 34 is a cross sectional view showing one step in a method for manufacturing a circuit board of the present invention.
Figure 35:
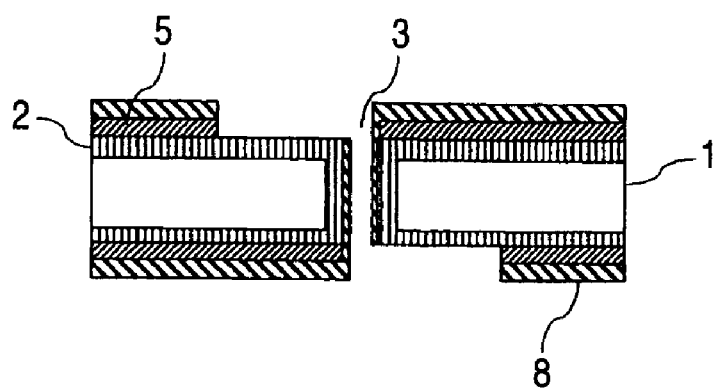
FIG. 35 is a cross sectional view showing one step in a method for manufacturing a circuit board of the present invention.
Figure 36:
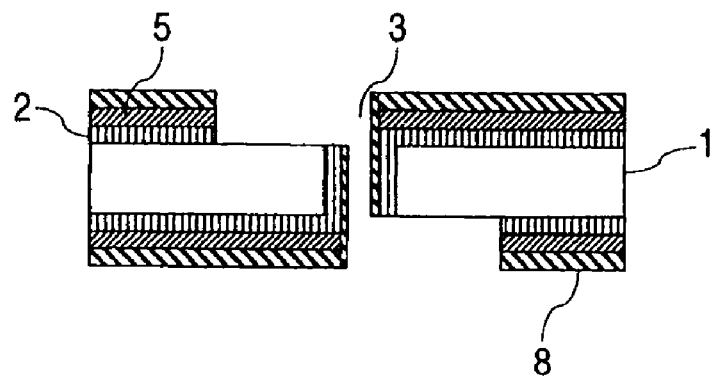
FIG. 36 is a cross sectional view showing one step in a method for manufacturing a circuit board of the present invention.

Then, the remaining second resin layer 6 is removed with a second resin layer removing solution (FIG. 21). A positive or negative electrostatic latent image is formed on the exposed photoconductive layer 5 (FIG. 33). By utilizing the electrostatic latent image, at the circuit part and on the portion of the conductive layer in the hole, a third resin layer 8 is formed by a means such as an electrodeposition method (FIG. 34). After removing the portion of the photoconductive layer 5 not covered with the third resin layer 8 by a developer for the photoconductive layer (FIG. 35), the exposed portion of the conductive layers 2 corresponding to a non circuit part are removed by etching (FIG. 36). The remaining third resin layer 8 and photoconductive layer 5 are removed by peeling, thereby to manufacture a circuit board (FIG. 32).

With a method for manufacturing a circuit board (7) of the invention, as with the method for manufacturing a circuit board (1) of the invention, a photoconductive layer 5 is provided on each surface of the circuit forming substrate 4 (FIG. 1) which is an insulating substrate having a conductive layer on each surface and the inner wall of a through hole and/or a non-through hole (FIG. 2). Then, by a means such as electrodeposition, a second resin layer 6 is formed on the portion of the photoconductive layer 5 on the conductive layer 2 (FIG. 4). Subsequently, the portion of the photoconductive layer 5 over the hole 3 not covered with the second resin layer 6 is removed by a developer for the photoconductive layer (FIG.

5). As shown in FIGS. 11 to 14, it is possible to adjust the land width of the hole according to the amount of the photoconductive layer to be removed.

Figure 37:
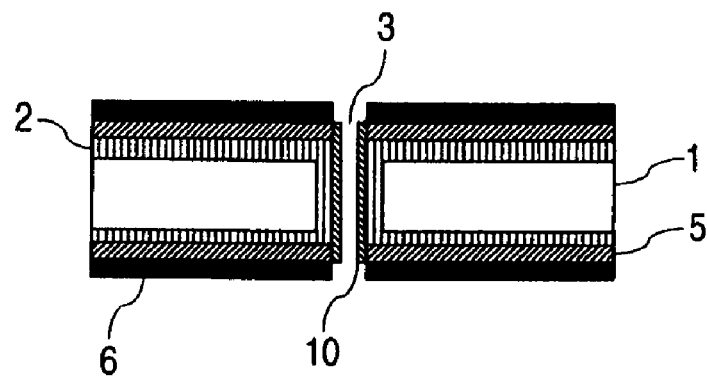
FIG. 37 is a cross sectional view showing one step in a method for manufacturing a circuit board of the present invention.
Figure 38:
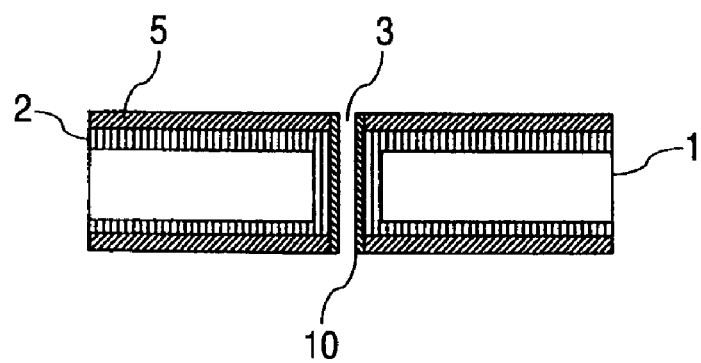
FIG. 38 is a cross sectional view showing one step in a method for manufacturing a circuit board of the present invention.
Figure 39:
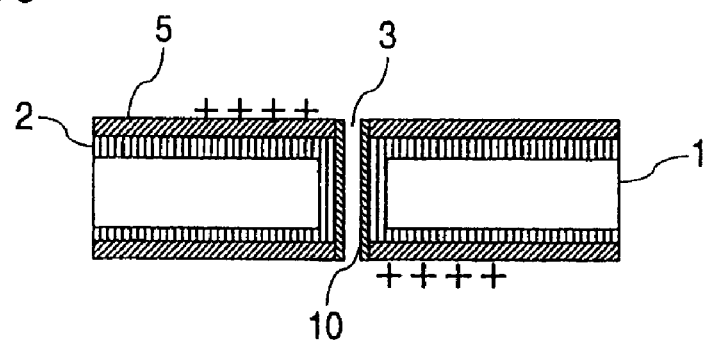
FIG. 39 is a cross sectional view showing one step in a method for manufacturing a circuit board of the present invention.
Figure 40:
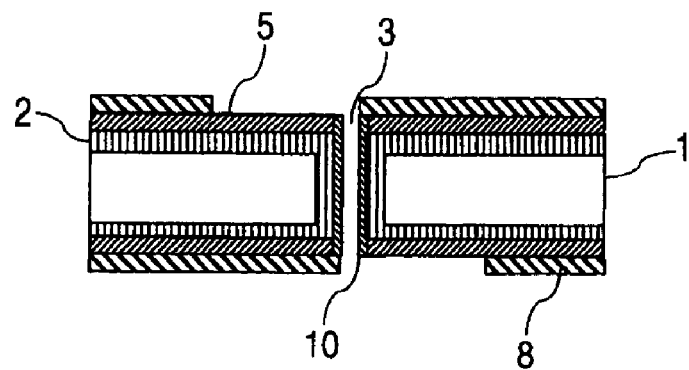
FIG. 40 is a cross sectional view showing one step in a method for manufacturing a circuit board of the present invention.
Figure 41:
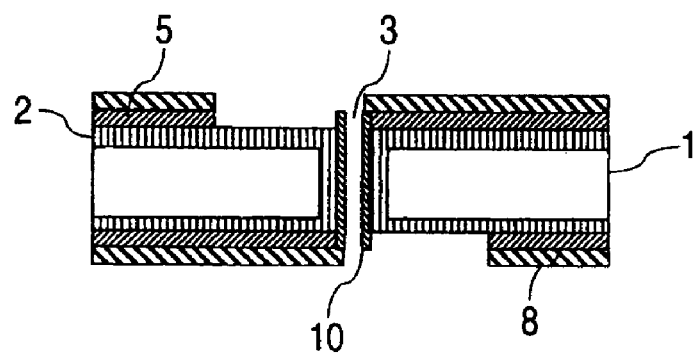
FIG. 41 is a cross sectional view showing one step in a method for manufacturing a circuit board of the present invention.
Figure 42:
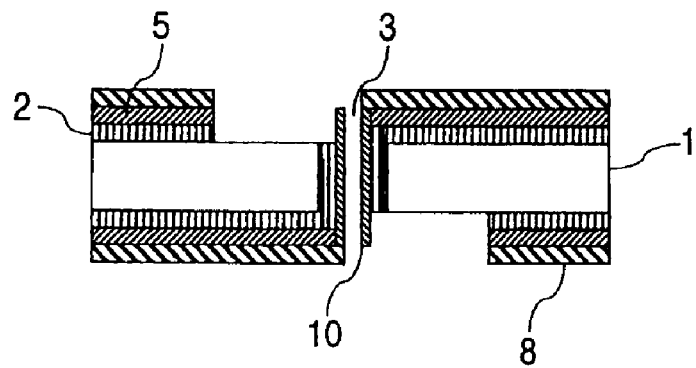
FIG. 42 is a cross sectional view showing one step in a method for manufacturing a circuit board of the present invention.

Subsequently, on the exposed portion of the conductive layer in the hole, a fourth resin layer 10 is formed (FIG. 37). Then, the remaining second resin layer 6 is removed with a second resin layer removing solution (FIG. 38). Alternatively, after removing the second resin layer 6 with the second resin layer removing solution (FIG. 21), on the exposed portion of the conductive layer in the hole, the fourth resin layer 10 is formed by a means such as an electrodeposition method (FIG. 38). A positive or negative electrostatic latent image is formed on the exposed photoconductive layer 5 (FIG. 39). By utilizing the electrostatic latent image, at the circuit part, a third resin layer 8 is further formed by a means such as an electrodeposition method (FIG. 40). After removing the portion of the photoconductive layer 5 not covered with the third resin layer 8 by a developer for the photoconductive layer (FIG. 41), the exposed portion of the conductive layers 2 corresponding to a non circuit part are removed by etching (FIG. 42). The remaining third resin layer 8, photoconductive layer 5, and fourth resin layer 10 are removed by peeling, thereby to manufacture a circuit board (FIG. 32).

Figure 43:
FIG. 43 is a cross sectional view showing one step in a method for manufacturing a circuit board of the present invention.
Figure 44:
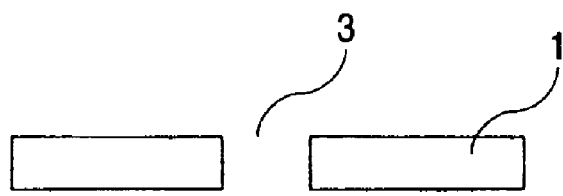
FIG. 44 is a cross sectional view showing one step in a method for manufacturing a circuit board of the present invention.
Figure 45:
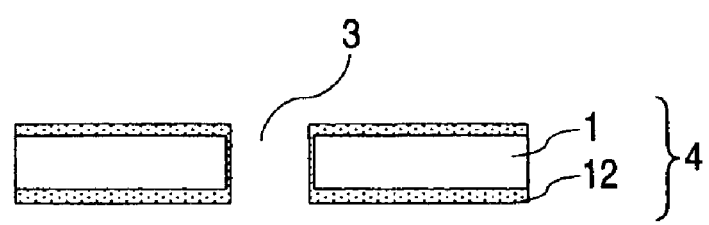
FIG. 45 is a cross sectional view showing one step in a method for manufacturing a circuit board of the present invention.
Figure 46:
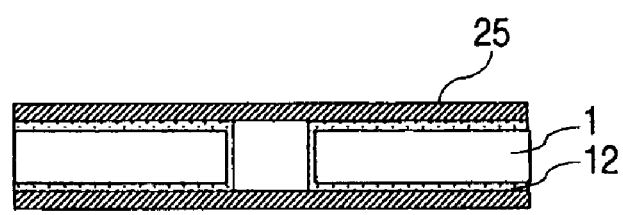
FIG. 46 is a cross sectional view showing one step in a method for manufacturing a circuit board of the present invention.
Figure 47:
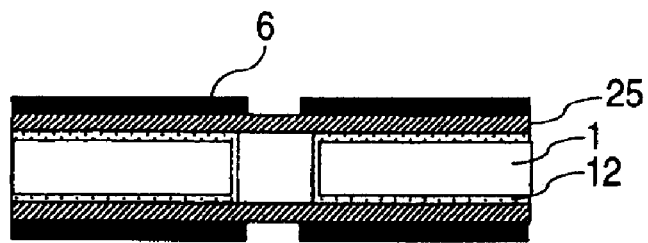
FIG. 47 is a cross sectional view showing one step in a method for manufacturing a circuit board of the present invention.
Figure 48:
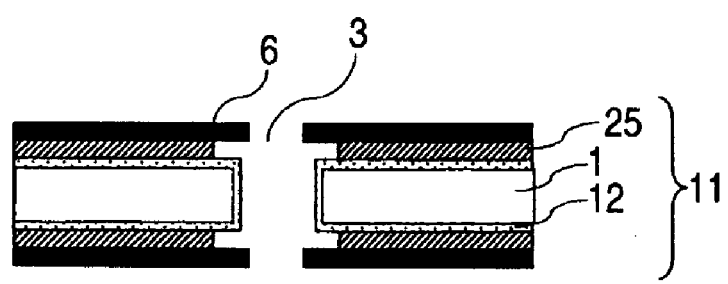
FIG. 48 is a cross sectional view showing one step in a method for manufacturing a circuit board of the present invention.

Method of Manufacturing Circuit Board by Semiadditive Method Using Photo-Crosslinkable Resin Layer as First Resin Layer In a method (8) of manufacturing a circuit board according to the invention, first of all, the hole 3 is formed (FIG. 44) on the insulating substrate 1 (FIG. 43). Subsequently, a thin first conductive layer 12 is provided on a surface of the insulating substrate 1 (FIG. 45). Next, a photo-crosslinkable resin layer 25 is provided as a first resin layer on the first conductive layer 12 so as to tent the hole (FIG. 46). Subsequently, the second resin layer 6 is formed on the photo-crosslinkable resin layer 25 provided on the first conductive layer 12 by means such as an electrodeposition (FIG. 47). Then, the photo-crosslinkable resin layer 25 provided over the hole 3 which is not covered with the second resin layer 6 is removed with a photo-crosslinkable resin layer removing solution to manufacture the open substrate 11 having a resin (FIG. 48). By regulating the amount of removal of the photo-crosslinkable resin layer, it is possible to obtain a hole having a desirable land width.

Figure 49:
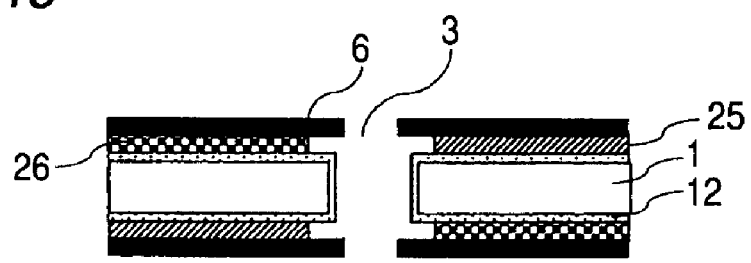
FIG. 49 is a cross sectional view showing one step in a method for manufacturing a circuit board of the present invention.
Figure 50:
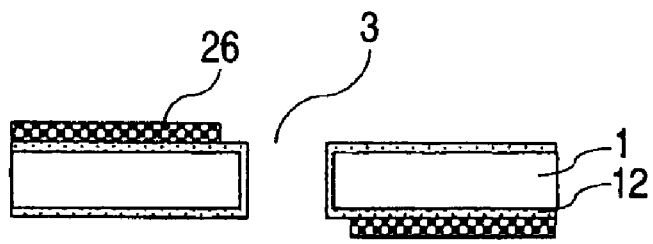
FIG. 50 is a cross sectional view showing one step in a method for manufacturing a circuit board of the present invention.
Figure 51:
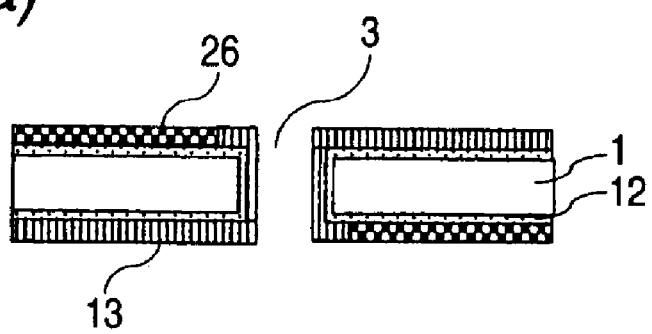
FIGS. 51(*a*) and (*b*) show the cross sectional views showing one step in a method for manufacturing a circuit board of the present invention.
Figure 51:
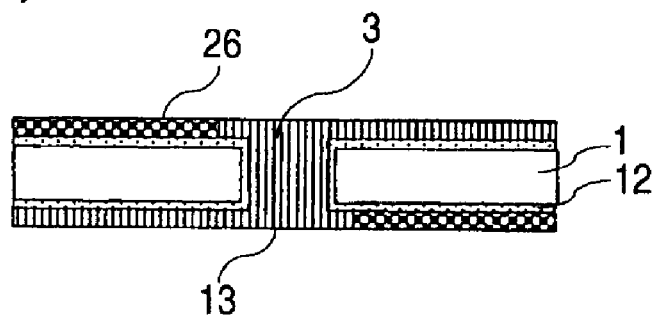
Figure 52:
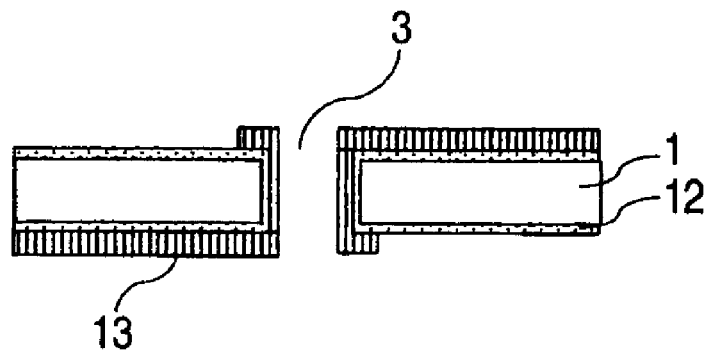
FIGS. 52(*a*) and (*b*) show the cross sectional views showing one step in a method for manufacturing a circuit board of the present invention.
Figure 52:
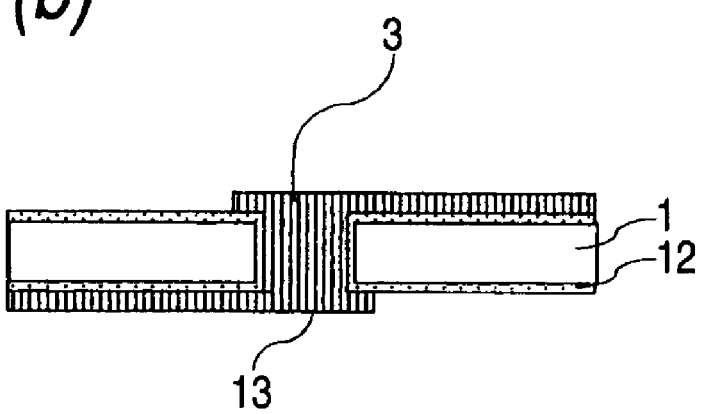
Figure 53:
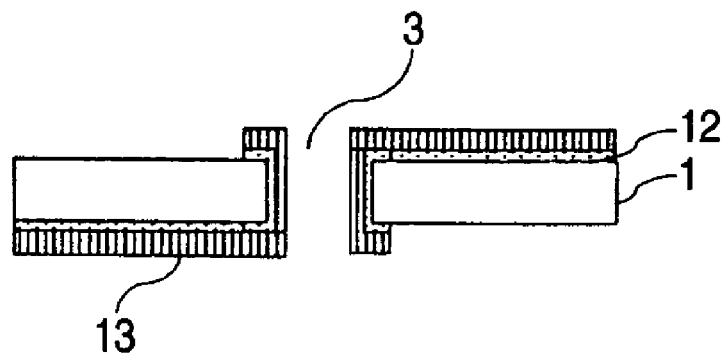
FIGS. 53(*a*) and (*b*) show the cross sectional views showing one step in a method for manufacturing a circuit board of the present invention.
Figure 53:
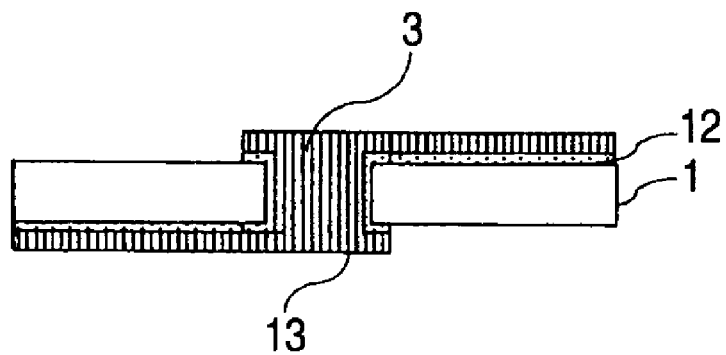

Thereafter, an exposing step is carried out to crosslink the photo-crosslinkable resin layer 25 in a portion corresponding to a non-circuit portion (FIG. 49). Subsequently, the second resin layer and the unreacted photo-crosslinkable resin layer are removed to form a plated resist layer constituted by a crosslinked portion 26 (FIG. 50). After the plated resist layer is formed, a second conductive layer 13 is formed on a surface in a portion, in which the first conductive layer 12 is exposed by an electrolytic plating processing (FIG. 51). Then, the crosslinked portion 26 (the plated resist layer) is removed (FIG. 52) and the thin first conductive layer 12 provided under the plated resist layer is removed by etching, thereby forming a circuit board (FIG. 53). The hole may be filled or not filled with the second conductive layer. FIGS. 51(*a*), 52(*a*) and 53(*a*) show a state in which the hole is not filled with the second conductive layer 13, and furthermore, FIGS. 51(*b*), 52(*b*) and 53(*b*) show a state in which the hole is filled with the second conductive layer 13.

Step of Forming Second Resin Layer

In a method (9) of manufacturing a circuit board according to the invention, a charging step is utilized in the step of forming the second resin layer on the first resin layer other than the portion provided over the hole in the methods (1), (2), (3), (5), (6), (7) and (8) of manufacturing a circuit board according to the invention. In the method (9) of manufacturing a circuit board according to the invention, first of all, the surface of the first resin layer is charged in order to form the second resin layer. In the case in which the first resin layer provided on the surface conductive layer and the first resin layer provided on an insulating layer such as air or an insulating substrate are subjected to the charging processing on the same condition, an absolute value of a charging potential in the first resin layer provided on the insulating layer is greater than a value on the first resin layer provided on the surface conductive layer. When the charging potential difference is regarded as an electrostatic latent image and the second resin layer is formed on the first resin layer by means such as an electrodepositing method, a difference is made between the amount of the second resin layer bonded onto the first resin layer provided over the hole and the amount of the second resin bonded onto the first resin layer provided on the surface conductive layer. The second resin layer is provided on the first resin layer formed on the surface conductive layer up to such a thickness as to generate a resisting property to a developing solution for the first resin layer, and the second resin layer is formed on such an amount as to be eroded with the developing solution for the first resin layer on the first resin layer provided over the hole. By removing the first resin layer provided over the hole with the second resin layer set to be a resist, it is possible to expose the conductive layer on the internal wall of the hole and around the hole accurately and selectively.

While description will be given to an example in which the method (9) of manufacturing a circuit board according to the invention is applied to the method (1) of manufacturing a circuit board according to the invention, it can also be applied to the methods (3), (5), (6), (7) and (8) of manufacturing a circuit board according to the invention in the same manner.

Figure 3:
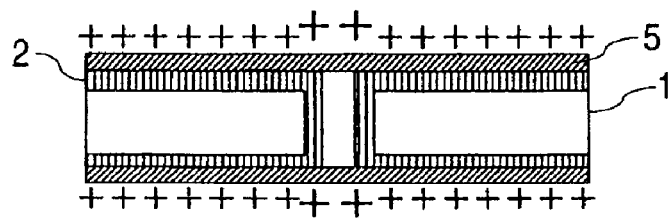
FIG. 3 is a cross sectional view showing one step in a method for manufacturing a circuit board of the present invention.

The first resin layer 5 is provided on the surface of the insulating substrate (FIG. 1) having the conductive layer on the surface and the internal wall of the through hole or/and the non-through hole (FIG. 2). Subsequently, the surface of the first resin layer 5 is subjected to the charging processing almost uniformly by means such as corona charging and is thus charged to have a positive or negative charge, thereby inducing a potential difference between the first resin layer 5 provided over the hole 3 and the first resin layer 5 provided on the second conductive layer 13 (FIG. 3). FIG. 3 shows the case in which charging to be positive is carried out, in which a value of a potential is represented by a size of a character. In other words, the first resin layer 5 provided over the hole 3 in contact with the air has a higher charging potential than the first resin layer 5 provided on the conductive layer 13. By utilizing the potential difference, next, the second resin layer 6 is formed on the first resin layer 5 provided on the second conductive layer 13 by means such as an electrodeposition (FIG. 4). Furthermore, only the first resin layer 5 provided over the hole 3 having a smaller amount of bonding of the second resin layer is removed with a developing solution for the first resin layer so that the open substrate 11 having a resin is manufactured (FIG. 5).

Figure 8:
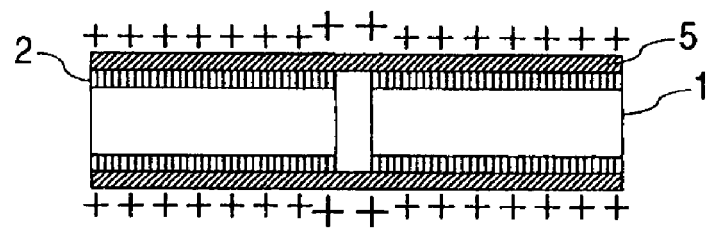
FIG. 8 is a cross sectional view showing one step in a method for manufacturing a circuit board of the present invention.

Next, description will be given to an example in which the method (9) of manufacturing a circuit board according to the invention is applied to the method (2) of manufacturing a circuit board according to the invention. The first resin layer 5 is stacked to the circuit forming substrate 4 which is constituted by an insulating substrate having the hole 3 and the conductive layer 2 on the surface as shown in FIG. 6 in order to be tenting for closing the hole 3 (FIG. 7). Subsequently, the surface of the first resin layer 5 is subjected to the charging processing almost uniformly by means such as the corona charging and is thus charged to have a positive or negative charge, thereby inducing a potential difference between the first resin layer 5 provided over the hole 3 and the first resin layer 5 provided on the second conductive layer 13 (FIG. 8). FIG. 8 shows the case in which charging to be positive is carried out, in which a value of a potential is represented by a size of a character. In other words, the first resin layer 5 provided over the hole 3 in contact with the air has a higher charging potential than the first resin layer 5 provided on the conductive layer 13 depending on the same charging conditions. By utilizing the potential difference, next, the second resin layer 6 is formed on the first resin layer 5 provided on the second conductive layer 13 by means such as an electrodeposition (FIG. 9). Furthermore, the first resin layer 5 provided over the hole 3 on which the second resin layer is not formed is removed with the developing solution for the first resin layer so that the open substrate 11 having a resin is manufactured (FIG. 10).

Subtractive Method Corresponding to Fine Wiring

Figure 54:
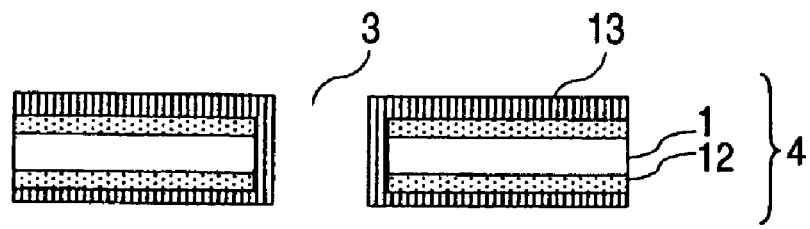
FIG. 54 is a substrate used for forming a circuit.

In general, the subtractive method is not suitable for a fine wiring, which is caused by the fact that a hole is usually provided on a laminated plate having a conductive layer bonded to an insulating substrate and a conductive layer is then provided on a surface of the laminated plate including an internal wall of the hole by a nonelectrolytic plating processing and an electrolytic plating processing as shown in FIG. 54. When the conductive layer is provided thickly by plating in order to have a conducting reliability of the internal wall of the hole, a thickness of the conductive layer provided on the surface is also increased. Consequently, side etching becomes a problem when the conductive layer in a non-circuit portion is to be removed by etching. Thus, there is a problem in that it is impossible to correspond to the microfabrication of a wiring pattern. Therefore, it is required that the conductive layer provided on the internal wall of the hole has a sufficient thickness and the thickness of the conductive layer provided on the surface is thinned as greatly as possible.

Figure 55:
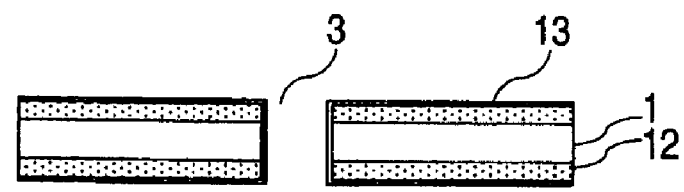
FIG. 55 is a cross sectional view showing one step in a method for manufacturing a circuit board of the present invention.
Figure 56:
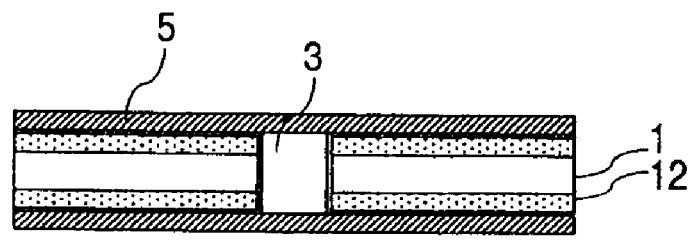
FIG. 56 is a cross sectional view showing one step in a method for manufacturing a circuit board of the present invention.
Figure 57:
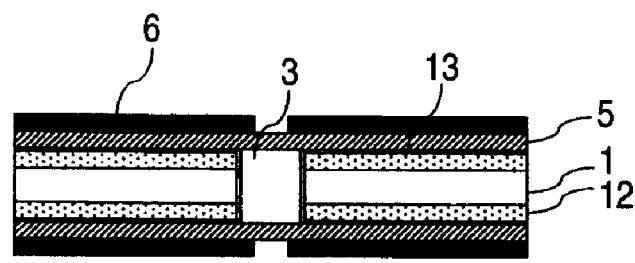
FIG. 57 is a cross sectional view showing one step in a method for manufacturing a circuit board of the present invention.
Figure 58:
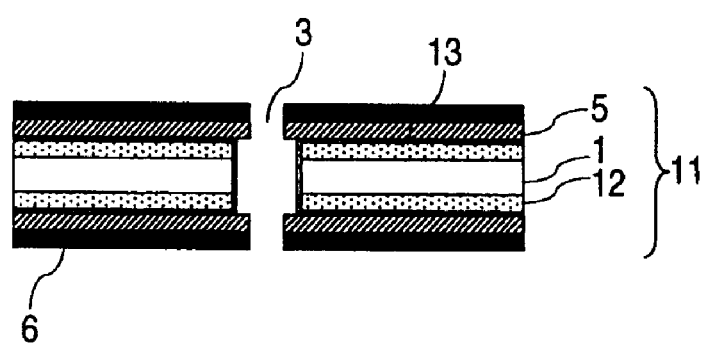
FIG. 58 is a cross sectional view showing one step in a method for manufacturing a circuit board of the present invention.

Description will be given to a method (10) of manufacturing a circuit board according to the invention. A first resin layer is bonded to an insulating substrate having a conductive layer on a surface and an internal wall of a hole shown in FIG. 55 so as to be tenting for closing the hole (FIG. 56). For the insulating substrate having the conductive layer on the surface and the internal wall of the hole, it is possible to use an insulating substrate obtained by forming the hole 3 on the insulating substrate 1 having the conductive layer 12 bonded to both surfaces and then providing the thin conductive layer 13 in the hole 3 and on the surface by the nonelectrolytic plating processing. Next, the second resin layer 6 is formed on the first resin layer 5 provided on the surface conductive layer by means such as an electrodeposition (FIG. 57). Furthermore, only the first resin layer 5 provided over the hole 3 on which the second resin layer is not formed is removed with the developing solution for the first resin layer (FIG. 58).

Figure 59:
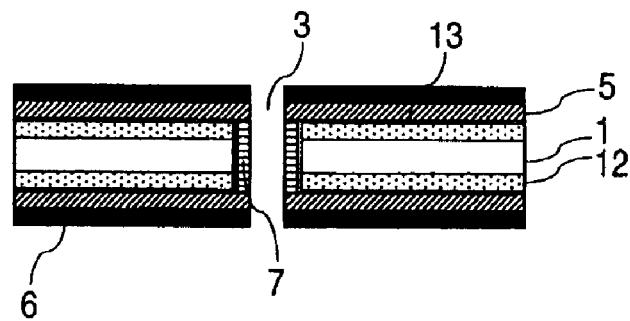
FIG. 59 is a cross sectional view showing one step in a method for manufacturing a circuit board of the present invention.
Figure 60:
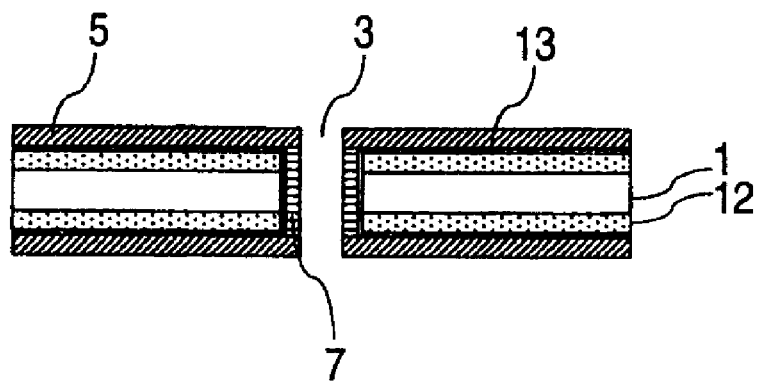
FIG. 60 is a cross sectional view showing one step in a method for manufacturing a circuit board of the present invention.
Figure 61:
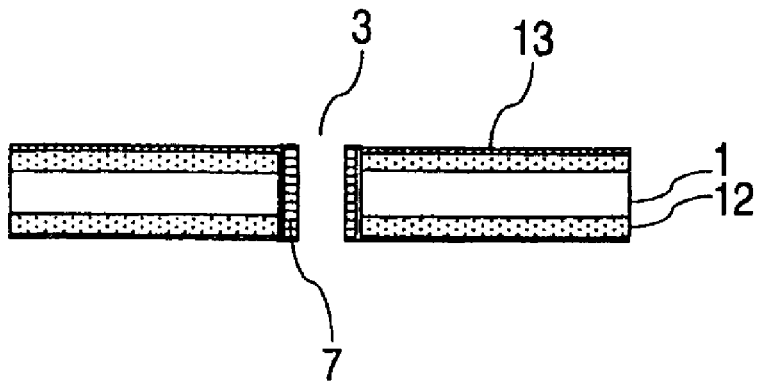
FIG. 61 is a cross sectional view showing one step in a method for manufacturing a circuit board of the present invention.

Next, the plated conductive layer 7 is provided on the exposed conductive layer 13 by means such as electrolytic plating (FIG. 59). Subsequently, the second resin layer is removed (FIG. 60), and furthermore, the first resin layer is removed (FIG. 61). Consequently, only the conductive layer in the hole can be thickened. The second resin layer and the first resin layer may be removed at a time.

In other words, by applying the method (10) of manufacturing a circuit board according to the invention to the methods (1), (3), (5), (6) and (7) of manufacturing a circuit board according to the invention, it is possible to provide a plated conductive layer on the conductive layer in the exposed hole by means such as the electrolytic plating processing after removing the first resin layer formed over the hole portion. Thus, it is possible to cause the thickness of the conductive layer provided on the surface to be small and uniform while maintaining the thickness of the conductive layer in the hole. Consequently, it is also possible to form a fine wiring by the subtractive method.

Figure 62:
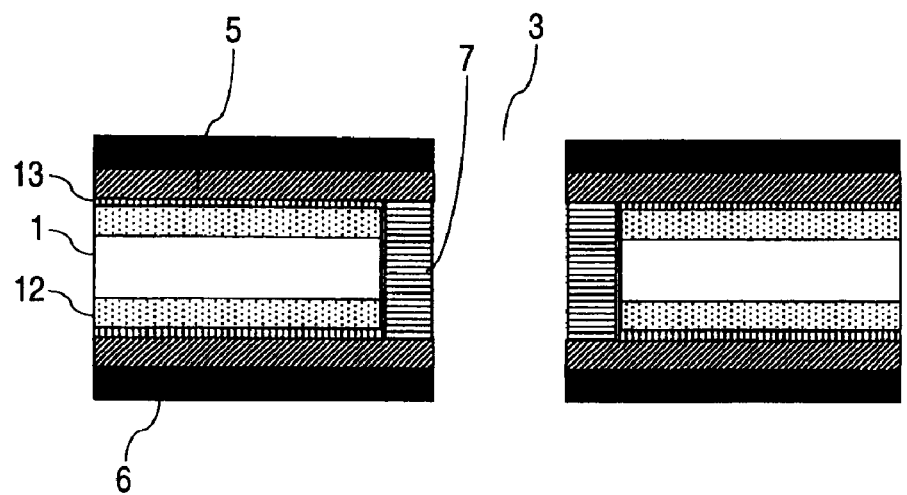
FIG. 62 is a cross sectional view showing one step in a method for manufacturing a circuit board of the present invention.
Figure 63:
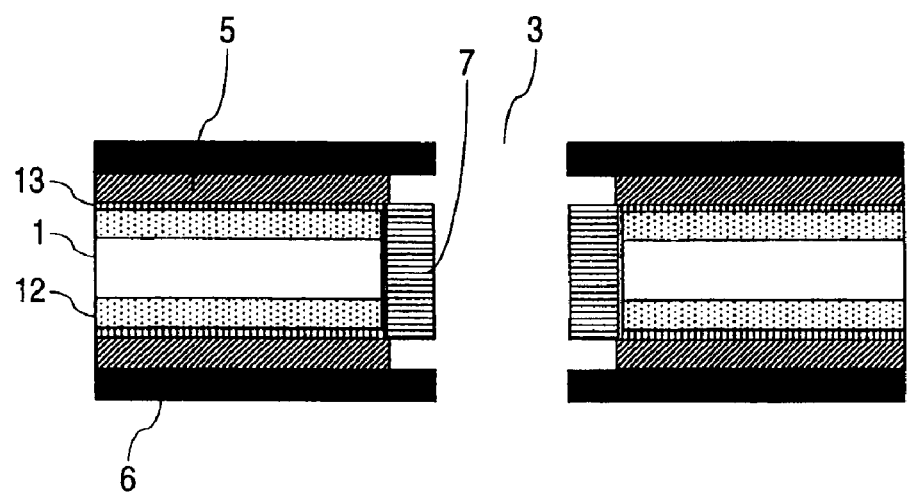
FIG. 63 is a cross sectional view showing one step in a method for manufacturing a circuit board of the present invention.
Figure 64:
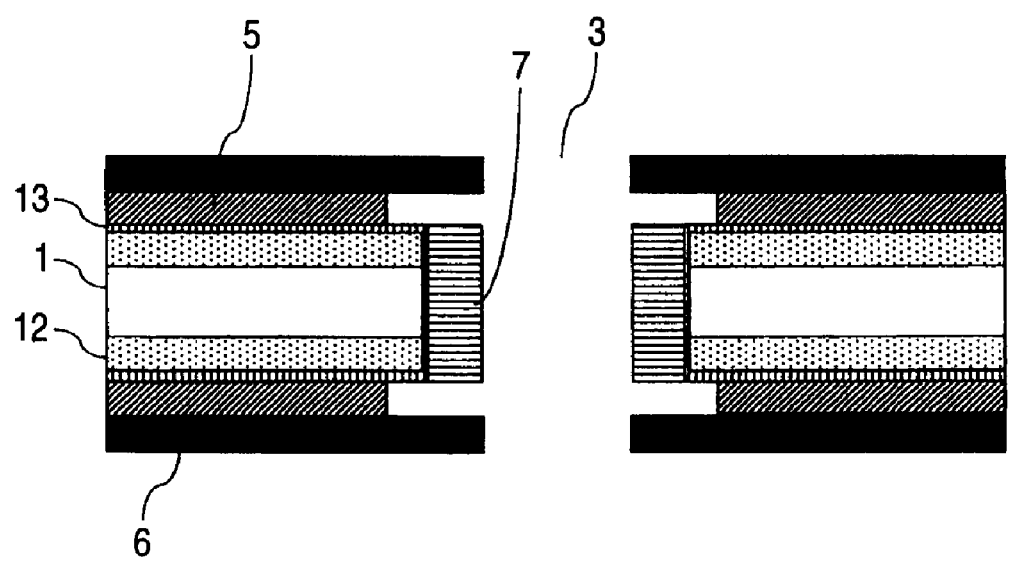
FIG. 64 is a cross sectional view showing one step in a method for manufacturing a circuit board of the present invention.
Figure 99:
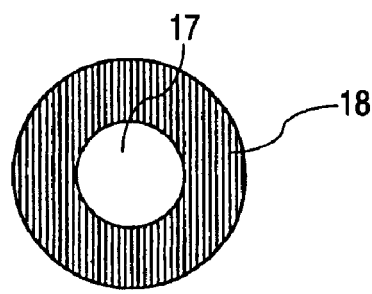
FIG. 99 is a schematical view showing a hole and a land.

In a method (11) of manufacturing a circuit board according to the invention, the plated conductive layer 7 is provided on the internal wall of the hole by means such as electrolytic plating (FIG. 61) and the first resin 5 is then removed in a desirable amount with the developing solution for the first resin layer again in the same manner as the method (10) of manufacturing a circuit board according to the invention. In this case, by regulating the amount of removal of the first resin layer, it is possible to manufacture a circuit board having a desirable land width as shown in FIGS. 62 to 64. According to the method, moreover, a land of the hole has a uniform width as shown in FIG. 99. The method (11) of manufacturing a circuit board according to the invention can be applied to the methods (1), (3), (5), (6) and (7) of manufacturing a circuit board according to the invention.

Circuit Board

Description will be given to a circuit board obtained by the method of manufacturing a circuit board according to the invention.

A circuit board (12) according to the invention in which a circuit portion is formed on an insulating substrate by a conductive layer and which has a through hole and/or a non-through hole having an internal wall covered or filled with the conductive layer, is characterized in that a land of the through hole and/or the non-through hole is formed continuously like a concentric circle with respect to the hole, a maximum height of the conductive layer in a non-coupling portion of the land is equal to or greater than −5 μm with a corner portion of the insulating substrate set to be a reference point and is equal to or smaller than a thickness of the conductive layer in the circuit portion, and a land width from the reference point is 0 to 40 μm.

A circuit board (13) according to the invention is characterized in that a difference between maximum and minimum values of the land width is equal to or smaller than 8 μm. In other words, a land 18 of a hole 17 is formed continuously like a concentric circle and satisfies a requirement for an increase in a density, that is, a reduction in the land width.

Figure 104:
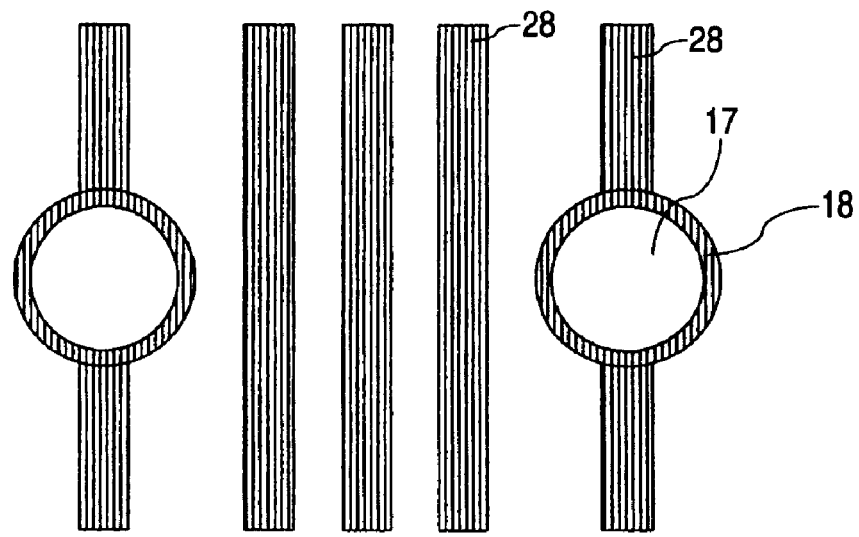
FIGS. 104(*a*) and (*b*) show schematic plan views showing a comparison of (a) a hole having a small land width with (b) a hole having a large land width in circuit boards in which hole diameters, distances between the holes and widths of conductive layers in circuit portions are equal, and FIGS. 105(*a*) and (*b*) show schematic plan views showing a comparison of positional shifts with (a) a hole having a small land width, and with (b) a hole having a large land width in circuit boards in which hole diameters, distances between the holes and widths of conductive layers in circuit portions are equal.
Figure 104:
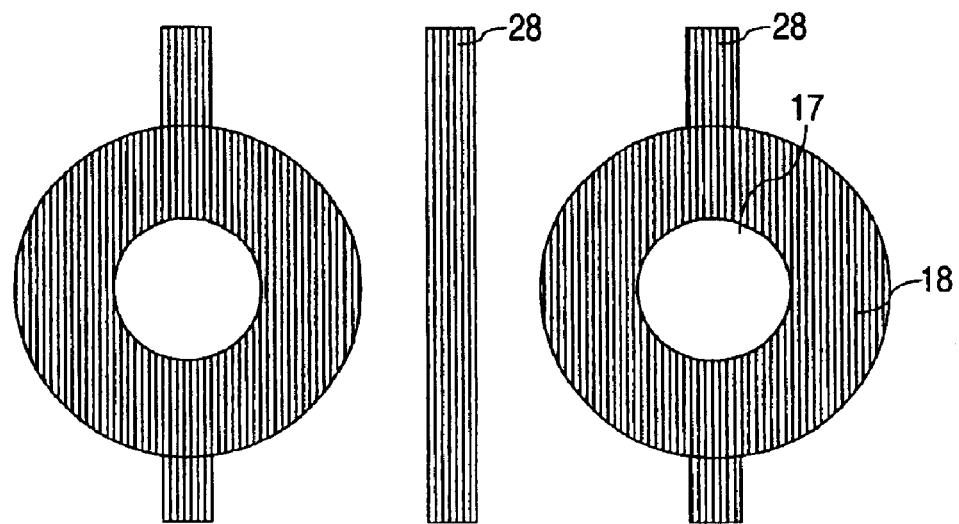
Figure 105:
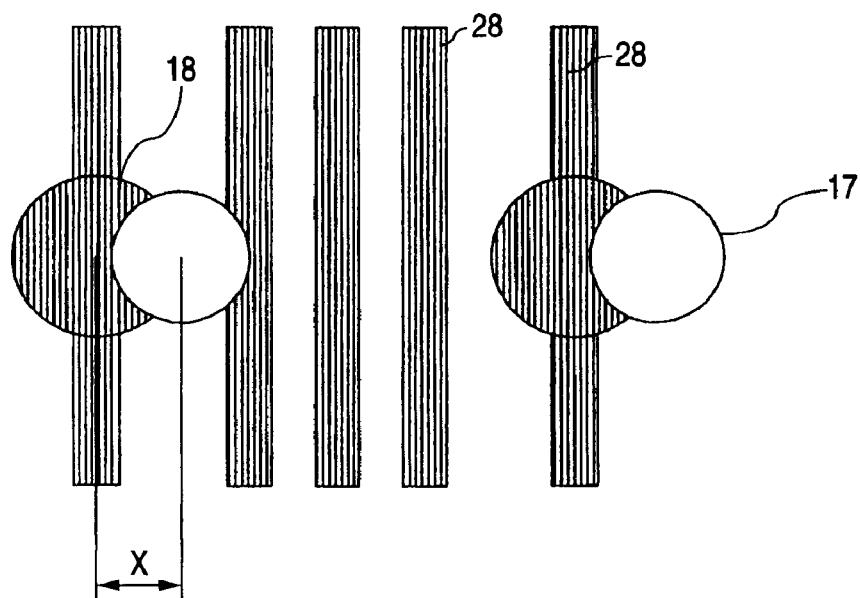
Figure 105:
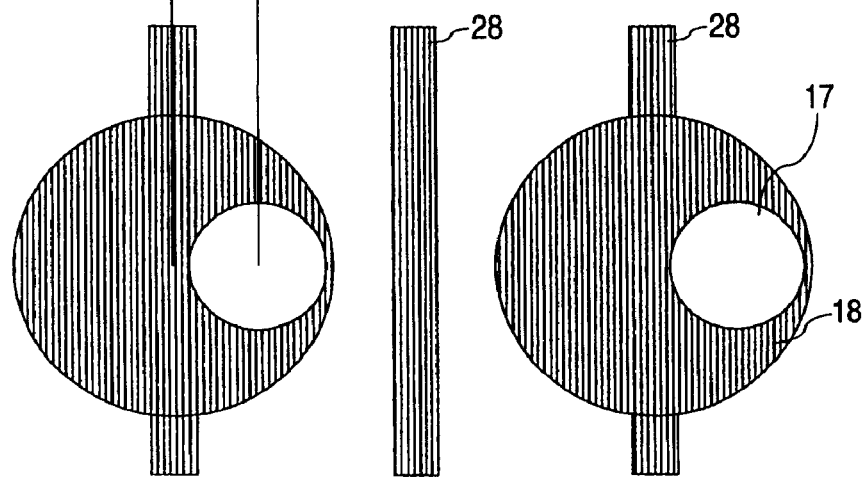

FIG. 104 is a schematic plan view showing a comparison of (a) a hole having a small land width with (b) a hole having a large land width in circuit boards in which hole diameters, distances between the holes and widths of conductive layers in circuit portions are equal. FIG. 105 shows the case in which a positional shift having a distance X is generated in the circuit boards. In both the hole having the small land width in FIG. 105(a) and the hole having the large land width in FIG. 105(b), uniform land widths cannot be formed. In the hole having the large land width in FIG. 105(b), the land is formed on the whole periphery of the hole. In the hole having the small land width in FIG. 105(a), there is a problem in that the land is cut away from the peripheral portion of the hole. In the circuit board (13) according to the invention, the land width is uniform and such a problem is not caused. In the hole having the small land width in the circuit board (13) according to the invention, moreover, the density can be increased as shown in FIG. 104(a). When the land width exceeds 40 μm, it is set to be large. Consequently, a circuit board having a low density is obtained as shown in FIG. 104(b) so that it is impossible to correspond to an increase in the density.

Moreover, a maximum height of the conductive layer in a non-coupling portion of the hole land is equal to or greater than −5 μm and is equal to or smaller than a thickness of the conductive layer in the circuit portion. In the non-coupling portion of the land of the hole, therefore, the circuit board is hardly influenced by a temperature and a humidity. Thus, the circuit board has a high reliability. The reason is that a corner portion of ten insulating substrate which is presumed to receive a load most greatly in the circuit board is protected with the conductive layer. When a height of the conductive layer in the non-coupling portion of the hole land is smaller than −5 μm, an exposure area of the insulating substrate is increased so that the influence of the temperature and the humidity is increased. When the thickness of the conductive layer in the circuit portion is exceeded, moreover, the hole portion becomes convex so that a resistance to a mechanical shock is reduced or a hindrance to a step of mounting the circuit board is caused.

A circuit board (14) according to the invention is characterized in that a sectional shape of the conductive layer in the circuit portion is different from that of the conductive layer in the land portion. A circuit board (15) according to the invention is characterized in that a portion having a maximum height is present within a range of a thickness of the conductive layer in the hole, which is formed from the internal wall of the hole in the conductive layer of the land.

Figure 65:
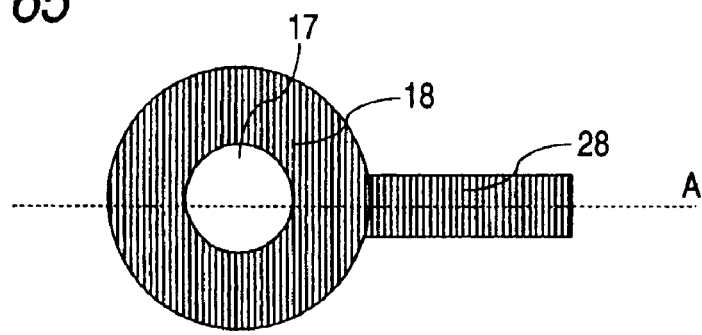
FIG. 65 is a schematic plan view showing a hole land portion of a circuit board according to the invention.

FIG. 65 is a schematic plan view showing a hole land portion of a circuit board according to the invention, the land 18 constituted by the conductive layer is formed around the hole 17 and a wiring 28 is coupled from the land. In the circuit board according to the invention, the land 18 is formed concentrically with respect to the hole 17. Moreover, a maximum height T1 of the conductive layer 18 in a non-coupling portion of the land is equal to or greater than −5 μm and is equal to or smaller than a thickness T2 of the conductive layer in a circuit portion with a corner portion of an insulating substrate set to be a reference point G. Moreover, a land width L from the reference point G is equal to or smaller than 40 μm. FIGS. 66(a) and 66(b) show the case in which T1 is equal to the thickness T2 of the conductive layer in the circuit portion and the land width L is greater than 0 μm and is equal to or smaller than 40 μm.

Figure 68:
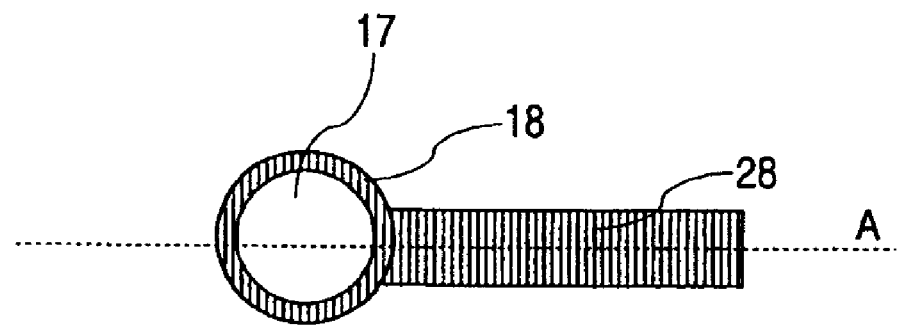
FIG. 68 is a schematic plan view showing a hole land portion of a circuit board according to the invention.
Figure 69:
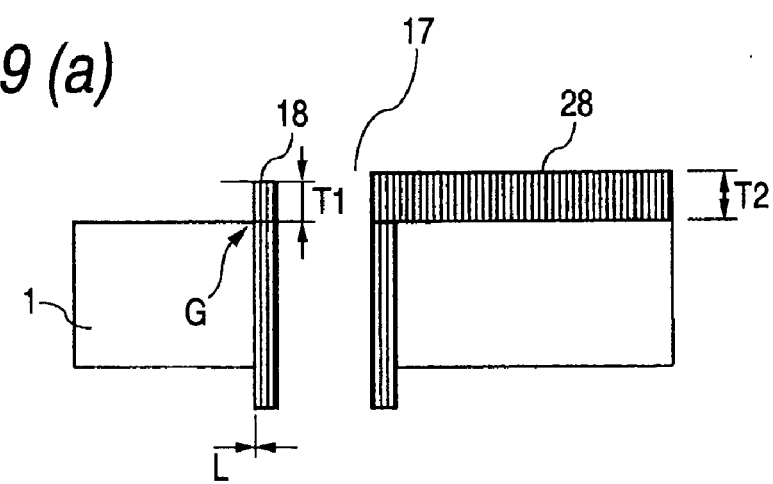
FIGS. 69(*a*), (*b*) and (*c*) show the schematical cross sectional views of line A portion of FIG. 68.
Figure 69:
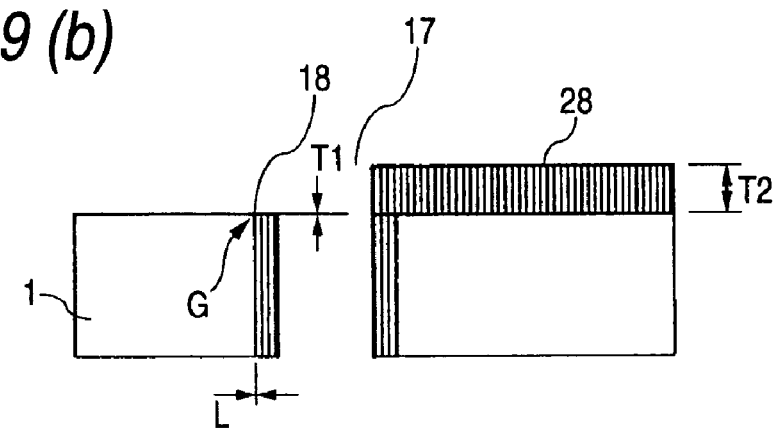
Figure 69:
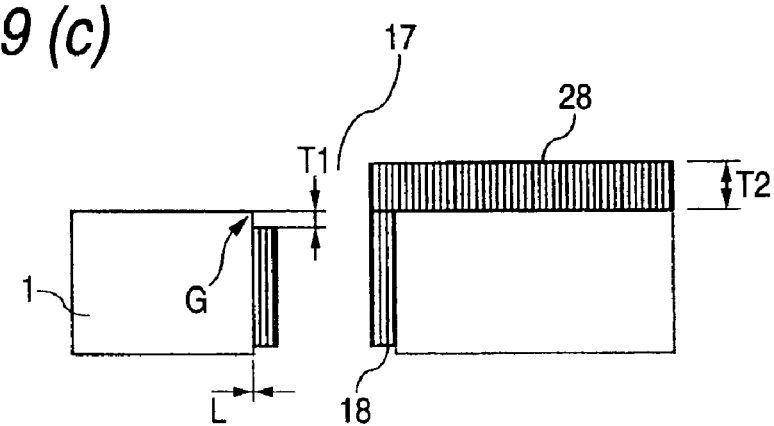
Figure 70:
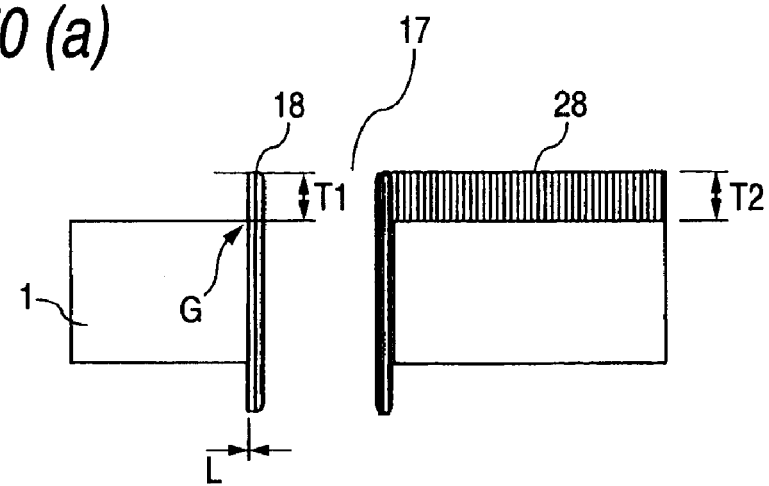
FIGS. 70(*a*), (*b*) and (*c*) show the schematical cross sectional views of line A portion of FIG. 68.
Figure 70:
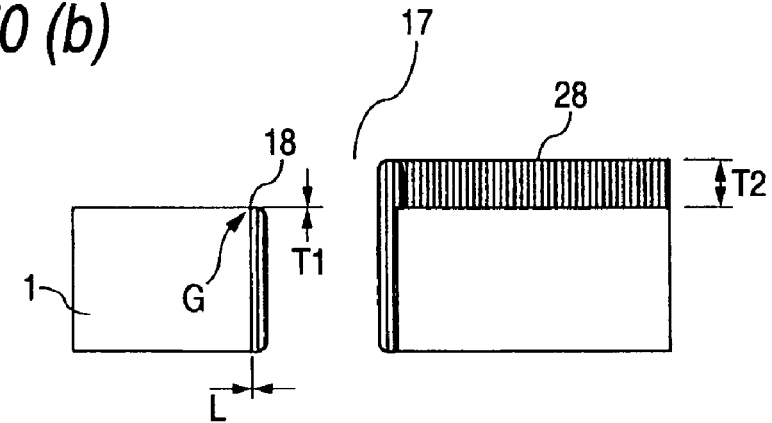
Figure 70:
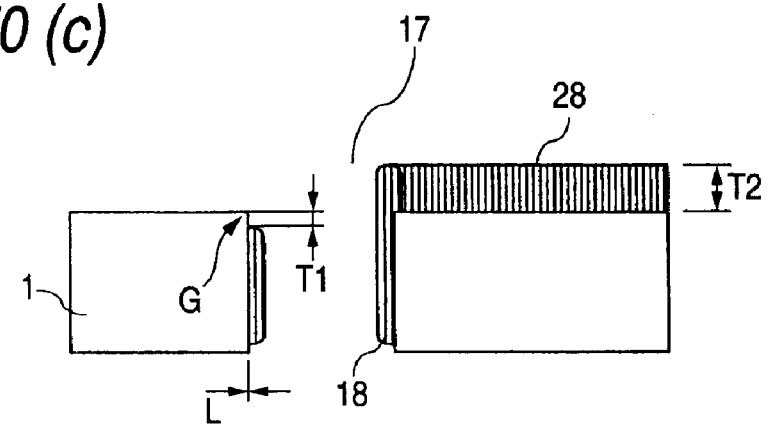
Figure 71:
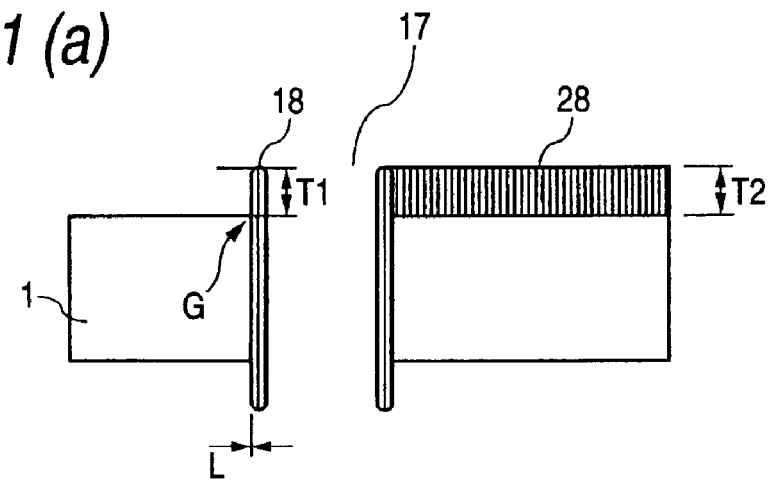
FIGS. 71(*a*), (*b*) and (*c*) show the schematical cross sectional views of line A portion of FIG. 68.
Figure 71:
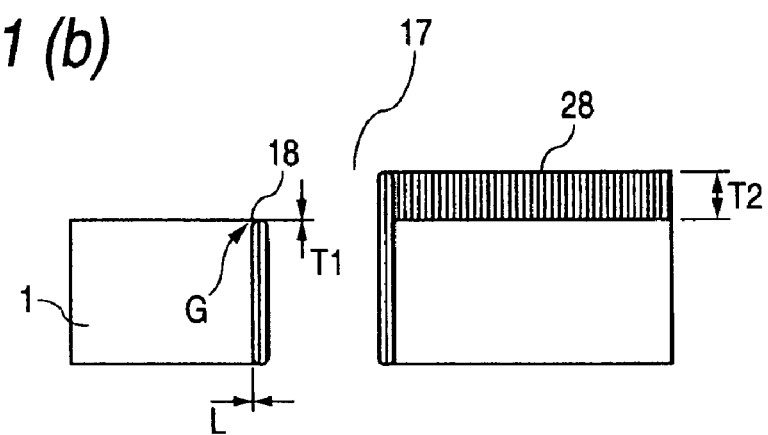
Figure 71:
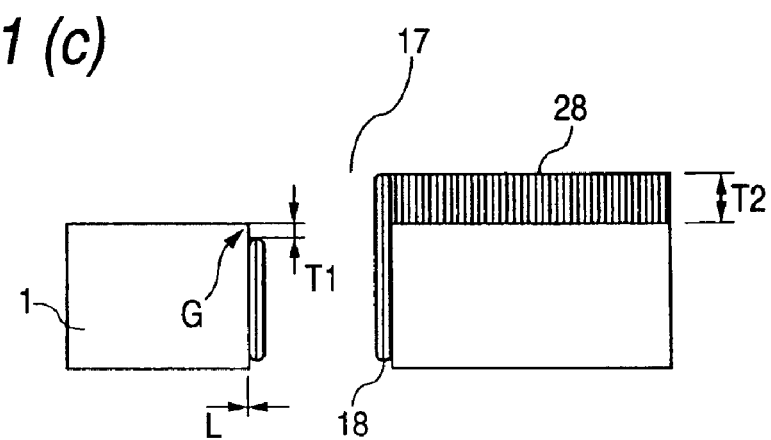
Figure 72:
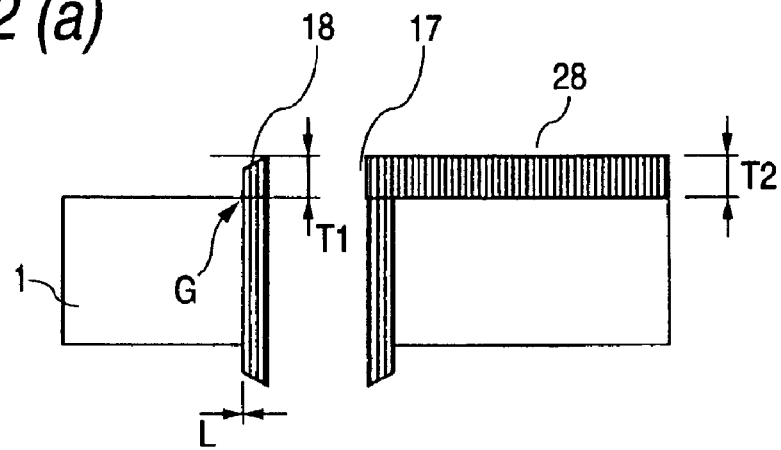
FIGS. 72(*a*), (*b*) and (*c*) show the schematical cross sectional views of line A portion of FIG. 68.
Figure 72:
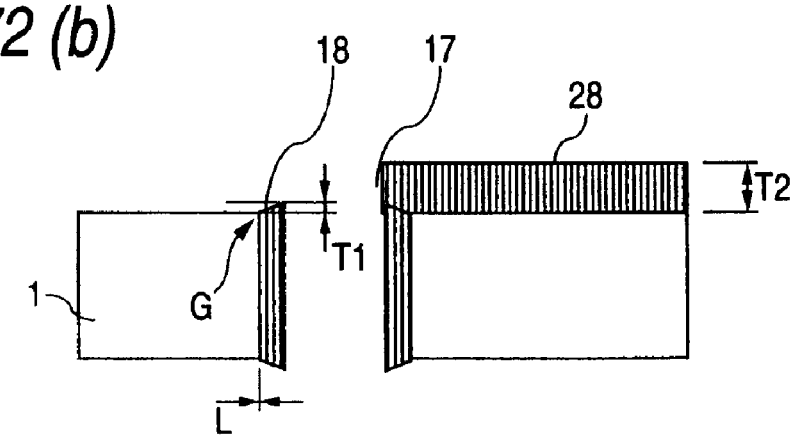
Figure 72:
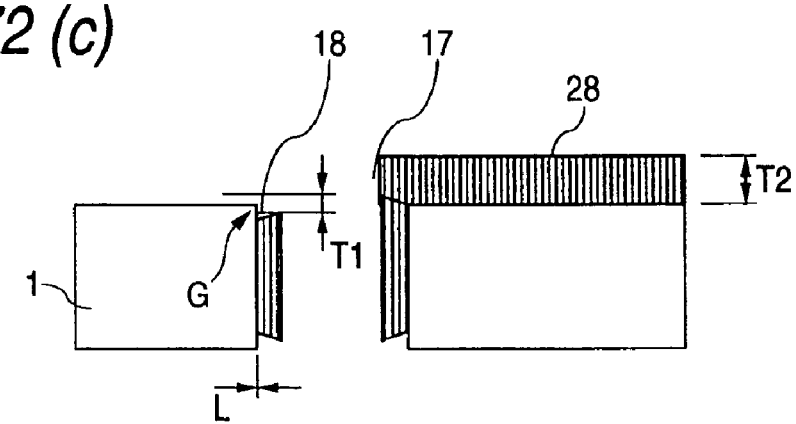
Figure 73:
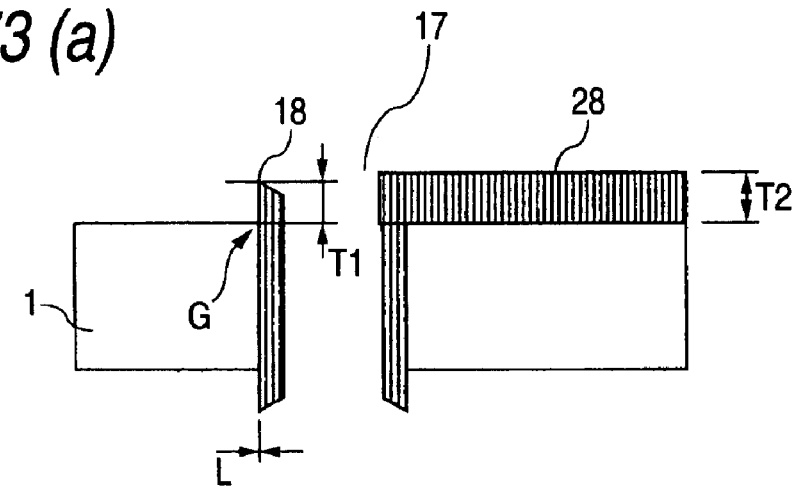
FIGS. 73(*a*), (*b*) and (*c*) show the schematical cross sectional views of line A portion of FIG. 68.
Figure 73:
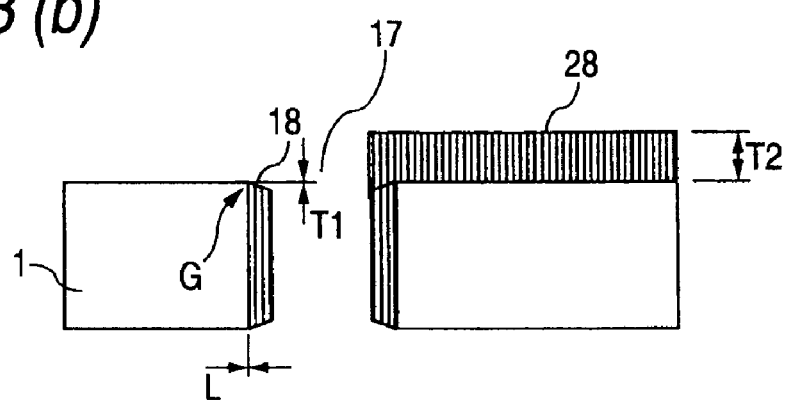
Figure 73:
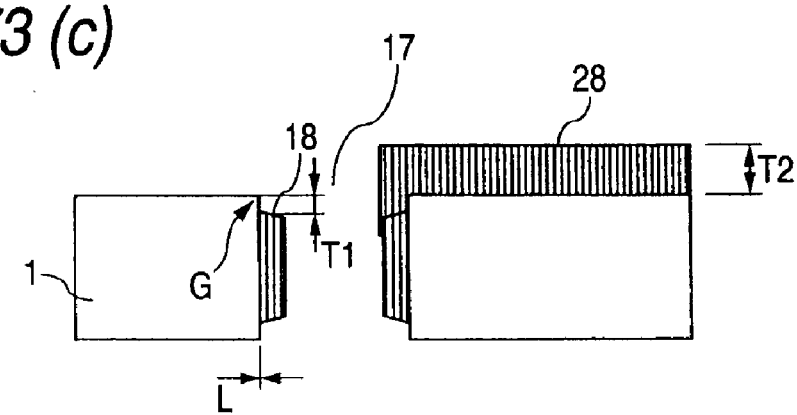

FIG. 68 is a schematic plan view showing the case in which the land width L is 0 μm in the circuit board according to the invention. The land implies a conductive layer provided around the hole. In the invention, in the case in which the land width L is 0 μm, the conductive layer in the land which can be confirmed when the hole is seen from an upper part is set to be a land having the land width L of 0 μm. FIGS. 69 to 73 are schematic sectional views showing the circuit board taken along a line A in FIG. 68. The land width L is 0 μm and T1 is equal to or greater than −5 μm and is equal to or smaller than the thickness T2 of the conductive layer in the circuit portion. In FIG. 69, an upper end face in the conductive layer of the land portion is perpendicular to an internal wall of the hole. FIG. 69(a) illustrates that T1 is equal to T2, FIG. 69(b) illustrates that T1 is 0 μm, and FIG. 69(c) illustrates that T1 is equal to or greater than −5 μm and is smaller than 0 μm. In FIG. 70, the upper end face in the conductive layer of the land portion is fan-shaped. FIG. 70(a) illustrates that T1 is equal to T2, FIG. 70(b) illustrates that T1 is 0 μm, and FIG. 70(c) illustrates that T1 is equal to or greater than −5 μm and is smaller than 0 μm. In FIG. 71, the upper end face in the conductive layer of the land portion is convex. FIG. 71(a) illustrates that T1 is equal to T2, FIG. 71(b) illustrates that T1 is 0 μm, and FIG. 71(c) illustrates that T1 is equal to or greater than −5 μm and is smaller than 0 μm. In FIG. 72, the upper end face in the conductive layer of the land portion becomes higher from the internal wall of the hole toward the central part of the hole. FIG. 72(a) illustrates that T1 is equal to T2, FIG. 72(b) illustrates that T1 is greater than 0 μm and is equal to or smaller than the thickness of T2, and FIG. 72(c) illustrates that T1 is equal to or greater than −5 μm and is smaller than 0 μm. In FIG. 73, the upper end face in the conductive layer of the land portion becomes lower from the internal wall of the hole toward the central part of the hole. FIG. 73(a) illustrates that T1 is equal to T2, FIG. 73(b) illustrates that T1 is 0 μm, and FIG. 73(c) illustrates that T1 is equal to or greater than −5 μm and is smaller than 0 μm. In the invention, T1 is equal to or greater than −5 μm and is equal to or smaller than T2. When an exposure around an opening portion of the hole, that is, around the reference point G is smaller, however, the reliability of the circuit board is enhanced more greatly. Therefore, it is more preferable that T1 is equal to or greater than 0 μm and is equal to or smaller than T2.

Figure 74:
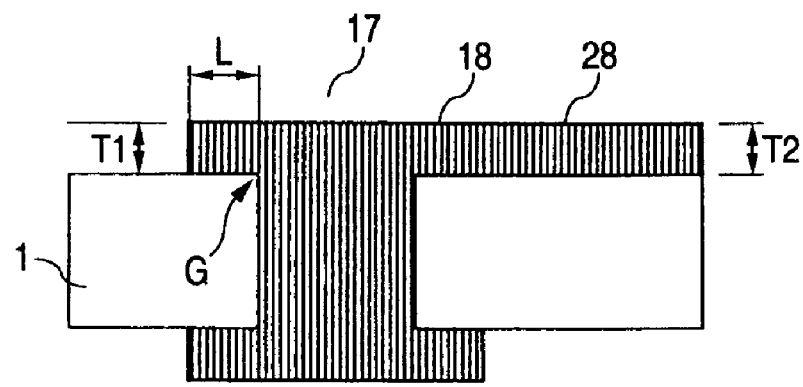
FIGS. 74(*a*) and (*b*) show the schematical cross sectional views of an example of a circuit board in the present invention.
Figure 74:
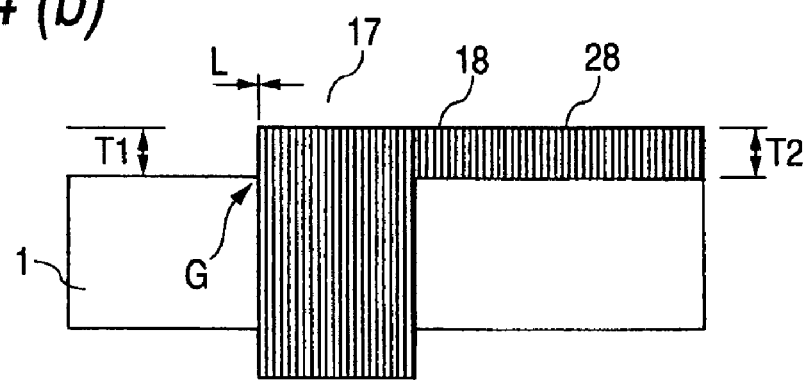

FIG. 74 is a schematic sectional view showing a through hole in which the hole is filled with a conductive layer. FIG. 74(a) shows an example in which the land width is greater than 0 μm and is equal to or smaller than 40 μm. In FIG. 74(b), the land width is 0 μm. In the circuit board according to the invention, if the height T1 of the conductive layer in the non-coupling portion of the land is equal to or greater than −5 μm, and is equal to or smaller than the height T2 of the conductive layer in the coupling portion of the land and the land width L is equal to or smaller than 40 μm, the inner part of the hole may be thus filled with the conductive layer.

Figure 75:
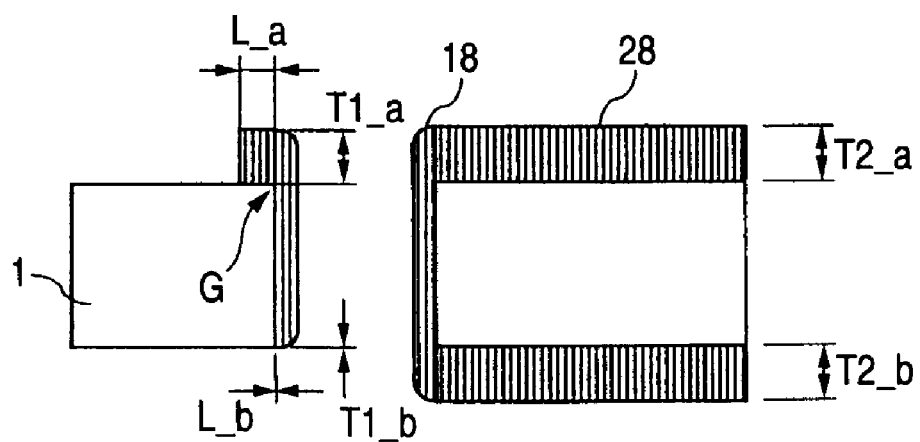
FIG. 75 is a schematical cross sectional view of an example of a circuit board in the present invention.

FIG. 75 is a schematic sectional view showing an example in which a land shape is different between one of opening portions of the through hole and the other opening portion. In one of the opening portions, a maximum height T1_a of the conductive layer in the non-coupling portion of the land is equal to or greater than 0 μm and is equal to or smaller than a height T2_a of the conductive layer in the coupling portion of the land, and a land width L_a is equal to or smaller than 40 μm. In the other opening portion, a maximum height T1_b of the conductive layer in the non-coupling portion of the land is 0 μm and a land width L_b is 0 μm.

Figure 76:
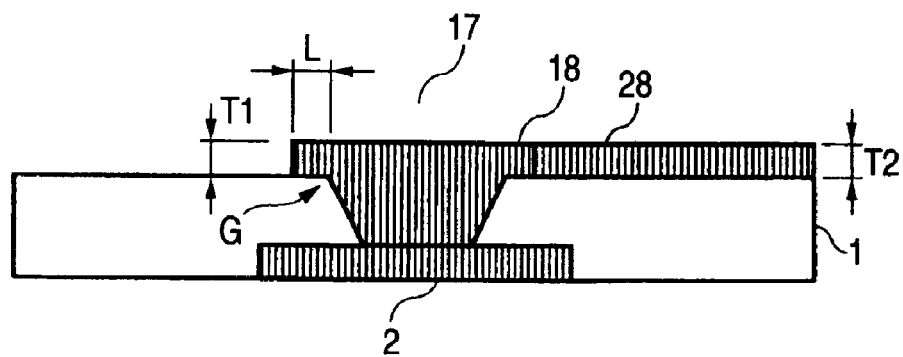
FIGS. 76(*a*) and (*b*) show the schematical cross sectional views of an example of a circuit board in the present invention.
Figure 76:
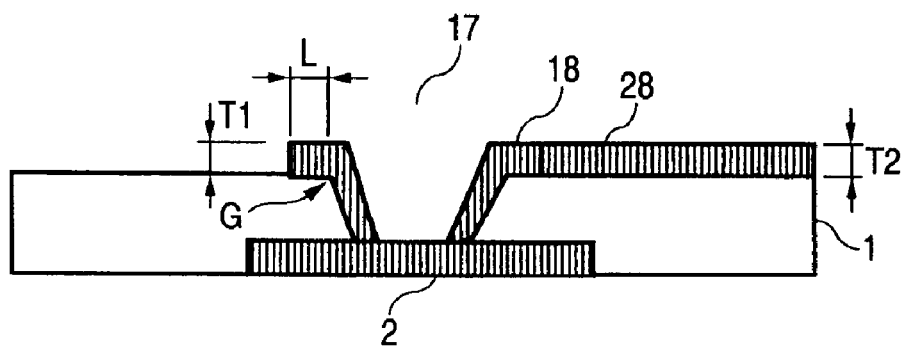

FIG. 76 is a schematic sectional view showing a via hole. FIG. 76(a) shows an example in which the via hole is filled with the conductive layer, the height T1 of the conductive layer in the non-coupling portion of the land is equal to or greater than 0 μm, but equal to or smaller than the height T2 of the conductive layer in the coupling portion of the land, and the land width L is equal to or smaller than 40 μm. FIG. 76(b) shows an example in which the via hole is not filled with the conductive layer, the height T1 of the conductive layer in the non-coupling portion of the land is equal to or greater than 0 μm, but equal to or smaller than the height T2 of the conductive layer in the coupling portion of the land, and the land width L is equal to or smaller than 40 μm.

Figure 67:
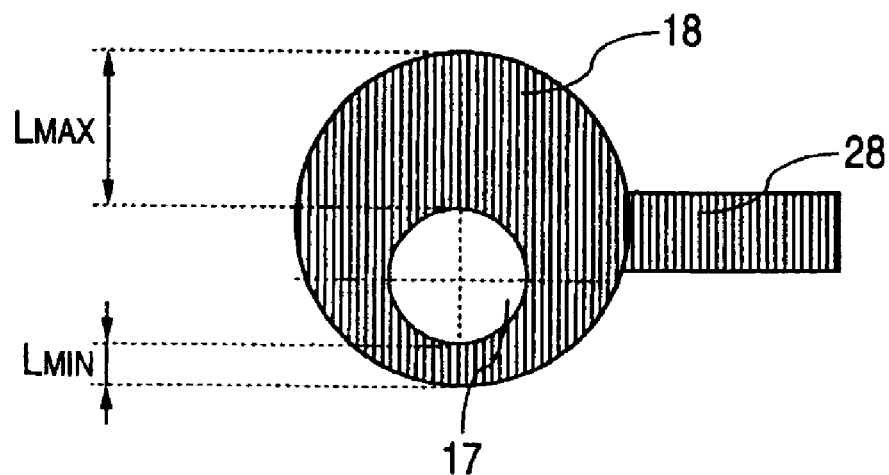
FIG. 67 is a schematic plan view showing a hole land portion of a circuit board according to the invention.
Figure 77:
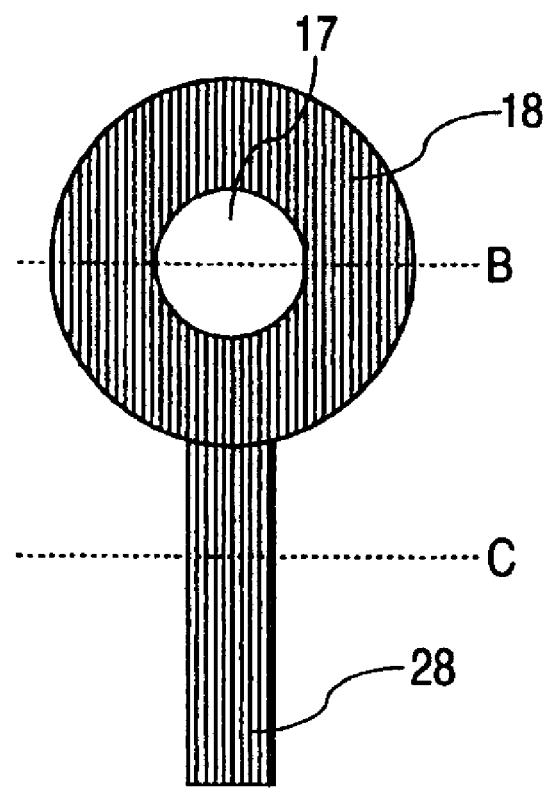
FIG. 77 is a schematic plan view showing a hole land portion of a circuit board according to the invention.
Figure 78:
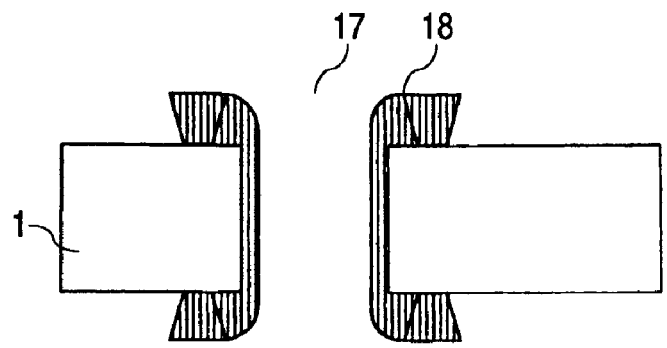
FIGS. 78(*a*), (*b*) and (*c*) show the schematical cross sectional views of line B portion of FIG. 77.
Figure 78:
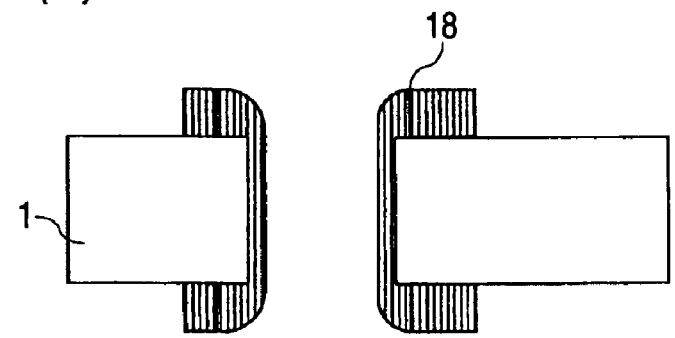
Figure 78:
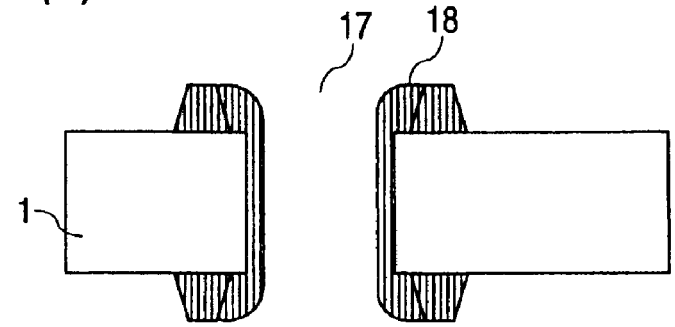
Figure 79:
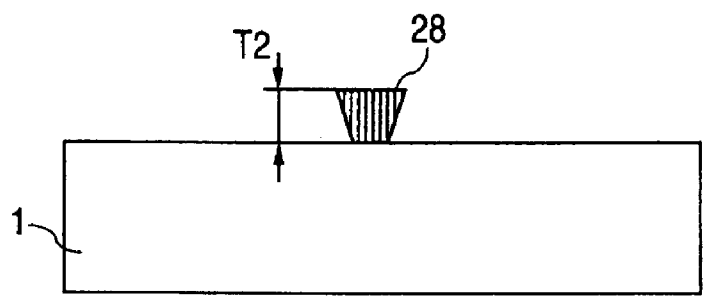
FIGS. 79(*a*), (*b*) and (*c*) show the schematical cross sectional views of line C portion of FIG. 77.
Figure 79:
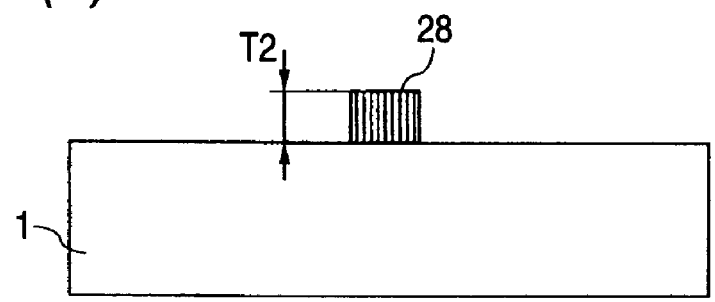
Figure 79:
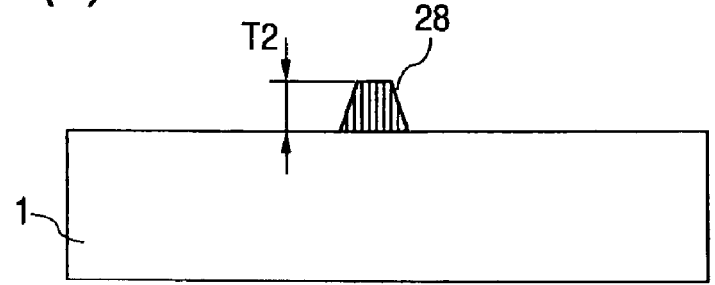
Figure 100:
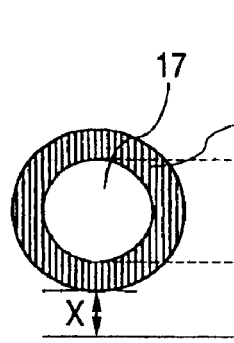
FIGS. 100(*a*) and (*b*) show schematical views showing positional shifts between a hole and a land.
Figure 100:
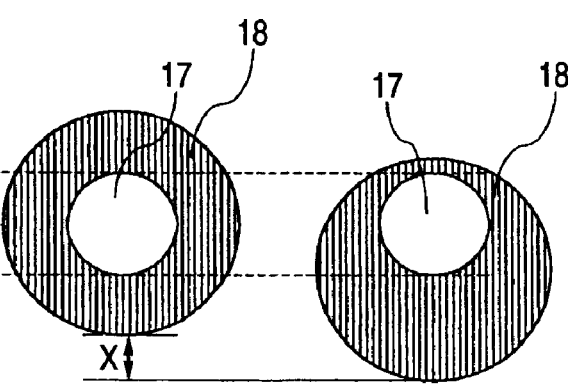
Figure 101:
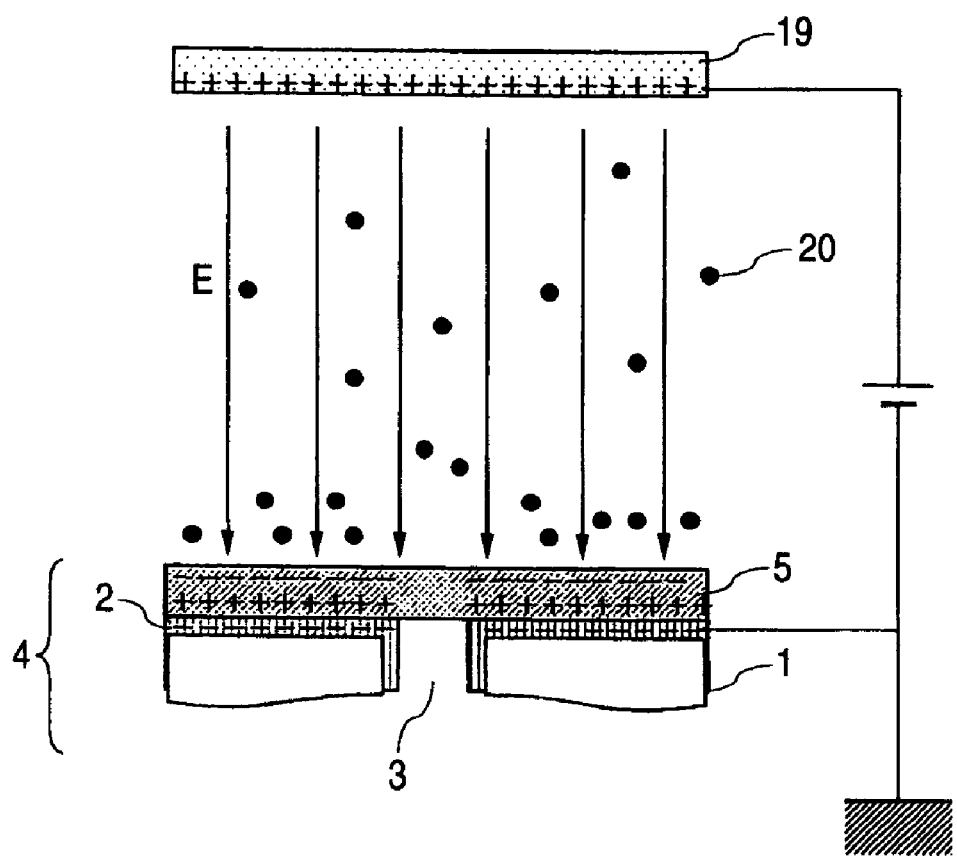
FIG. 101 is a cross sectional view showing second resin layer forming step in a method for manufacturing a circuit board of the present invention.
Figure 102:
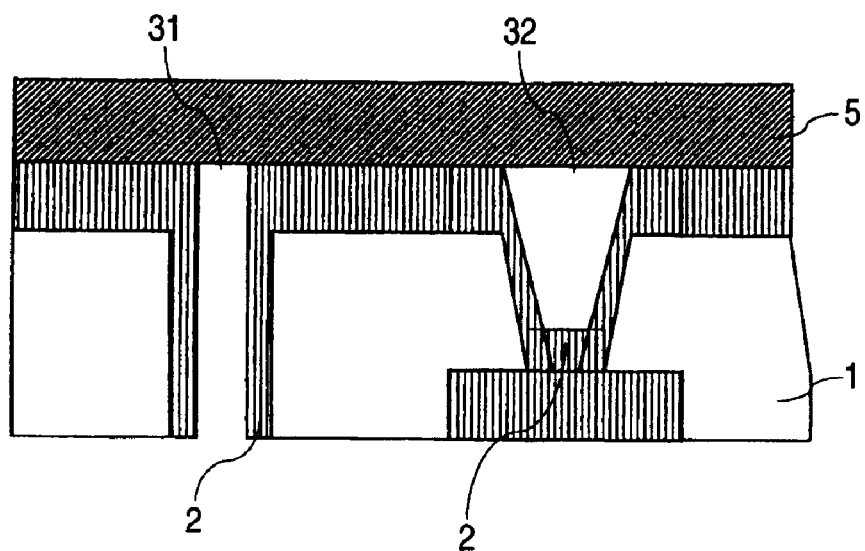
FIG. 102 is a cross sectional view showing one step in a method for manufacturing a circuit board of the present invention.
Figure 103:
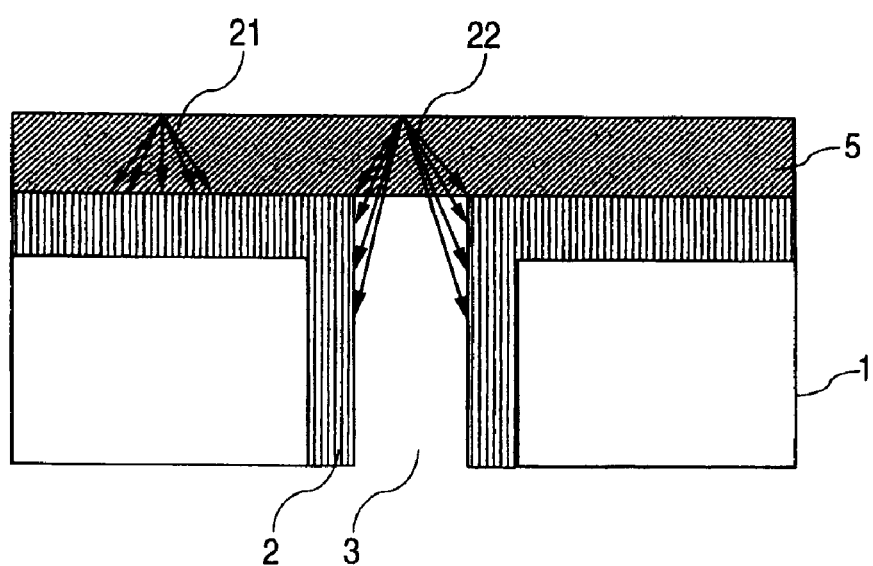
FIG. 103 is a cross sectional view showing one step in a method for manufacturing a circuit board of the present invention.

FIG. 67 is a schematic plan view showing the hole land portion of the circuit board according to the invention. In the circuit board according to the invention, it is desirable that a difference between maximum and minimum values of the land width should be equal to or smaller than 8 μm, and should be more preferably equal to or smaller than 5 μm. In this state, the hole and the land are formed continuously like a concentric circle. In the state in which the difference between the maximum value and the minimum value is equal to or smaller than 8 μm, a center of the hole and that of the land are rarely shifted from each other. Therefore, the circuit board according to the invention satisfies a requirement for causing the land width to be uniform. In other words, the circuit board according to the invention is hardly influenced by precision in a positional shift in a manufacturing process. When the difference is greater than 8 μm, the land is not formed in a uniform width around the hole as shown in FIG. 100(*a*). Consequently, the circuit board has a low reliability. FIG. 77 is a schematic plan view showing a hole land portion of the circuit board according to the invention. FIG. 78 is a schematic sectional view taken along a line B in FIG. 77 and FIG. 79 is a schematic sectional view taken along a line C in FIG. 77. In the circuit board according to the invention, it is preferable that a sectional shape of the conductive layer in the circuit portion and that of the conductive layer in the land portion should be different from each other. In such a case, a volume in a connecting portion of the conductive layer in the circuit portion and that in the land portion is increased. Consequently, it is possible to obtain an advantageous effect that an electrical reliability in the connecting portion can be enhanced. A combination of the sectional shape of the conductive layer in the circuit portion and that of the land portion can include FIG. 78(*a*)-FIG. 79(*b*), FIG. 78(*a*)-FIG. 79(*c*), FIG. 78(*b*)-FIG. 79(*a*), FIG. 78(*b*)-FIG. 79(*c*), FIG. 78(*c*)-FIG. 79(*a*), and FIG. 78(*c*)-FIG. 79(*b*), for example.

Figure 80:
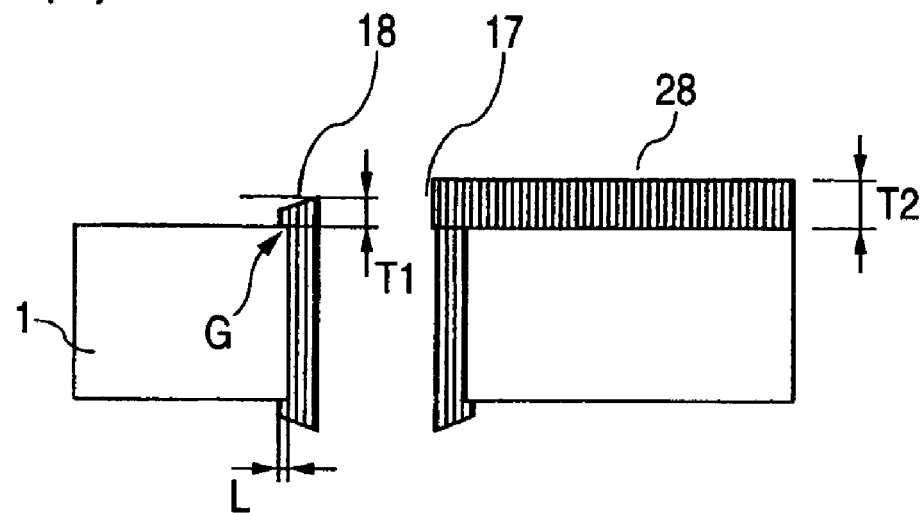
FIGS. 80(*a*) and (*b*) show the schematical cross sectional views of an example of a circuit board in the present invention.
Figure 80:
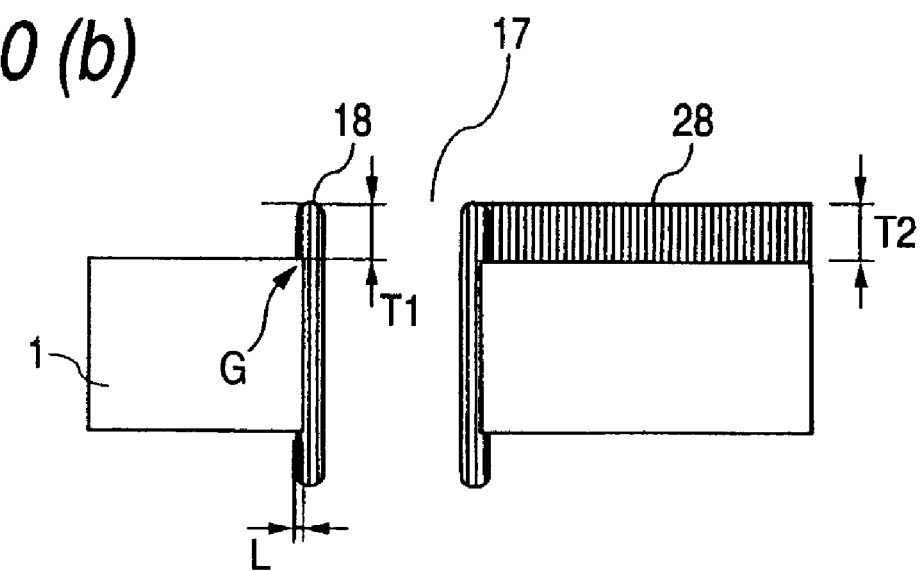

In the conductive layer of the land, the circuit board (4) according to the invention in which a portion having a maximum height is present within a range from the internal wall of the hole to a thickness of the conductive layer in the hole indicates a landless hole or a hole having a small land width in which a land width is small as shown in FIG. 80. Irrespective of a cylindrical shape, a tapered shape and a perforating shape, the circuit boards having such holes can correspond to an increase in a density and can provide an effective embodiment of the circuit board according to the invention.

Material and Step

Description will be given to a method of manufacturing a circuit board and a material related to the circuit board according to the invention. For an insulating substrate having a conductive layer on a surface and an internal wall of a through hole or/and a non-through hole according to the invention, it is possible to use a configuration in which a hole is provided on a laminated plate in which a conductive layer foil is bonded to the insulating substrate and a plated conductive layer is then provided on a surface of the laminated plate including the internal wall of the hole by a plating processing, a configuration in which the hole is provided on the insulating substrate and a conductive layer is then provided on the surface including the internal wall of the hole by a sputtering method, an evaporation method, a nonelectrolytic plating processing, a nonelectrolytic plating processing—electrolytic plating processing, or a coating processing, and a configuration in which a hole is provided on the laminated plate having the conductive layer foil bonded to the insulating substrate and a conductive layer is separately provided on only the internal wall of the hole by means such as a nonelectrolytic plating method. The conductive layer foil can also be subjected to an etching processing to be a thin film after the bonding.

For the insulating substrate having the through hole or/and the non-through hole and including the conductive layer in addition to the internal wall of the hole according to the invention, it is possible to use a configuration in which the hole is provided on the laminated plate obtained by bonding the conductive layer to the insulating substrate.

For the insulating substrate, it is possible to use a substrate formed of a paper base material phenol resin or a glass base material epoxy resin, a polyester film, a polyimide film and a liquid crystal polymeric film. For the conductive layer, it is possible to use copper, silver, gold, aluminum, stainless, alloy, Nichrome, tungsten, ITO, a conductive polymer or various metal complexes. These examples have been described in "Printed Circuit Technique Manual" (edited by Japan Electronics Packaging and Circuits Association and issued in 1987 by THE NIKKAN KOGYO SHIMBUN LTD.).

A first resin layer according to the invention is not particularly restricted if it has such a characteristic as to be freely thermo-compression bonded to a circuit forming substrate and laminated to be tenting for a hole portion and to have a dissolubility with respect to the developing solution for the first resin layer, and furthermore, to be required at a subsequent step in a serial process included in the method of manufacturing a circuit board according to the invention. Specific examples include a film formed by an acrylic resin, an epoxy resin, an urethane resin, a phenol resin, a novolak resin, a styrene maleate copolymer, a vinyl acetate resin, or a vinyl benzoate resin, a film dissolved in an alkaline solution obtained by introducing an acid group into the resins, and a non-photosensitive film such as a water-soluble film, for example, polyethylene glycol or polyvinyl alcohol. Moreover, it is also possible to use a negative dry film photoresist for manufacturing a circuit board and an organic photosemiconductor resist utilizing a photoconductive layer.

The photo-crosslinkable resin layer to be used as the first resin layer according to the methods (5) and (8) of manufacturing a circuit board according to the invention includes a photo-crosslinking type (negative) dry film photoresist for manufacturing a circuit board which is used generally. Examples will be given, and any photo-crosslinkable resin can also be applied if it does not depart from the gist of the invention. For example, such a photo-crosslinkable resin might be a binder polymer containing a calboxylic acid group, a photopolymerizing multifunctional monomer, a photopolymerizing initiator, a solvent and other negative photosensitive resin compositions constituted by additives. Their mixing ratio is determined depending on demanded properties such as a sensitivity, a resolution, a hardness and a tenting property. These examples have been described in "Photopolymer Handbook" (edited by Photopolymer Special Meeting and issued in 1989 by Kogyo Chosakai Publishing Co., Ltd.) and "Photopolymer Technology" (edited by Aya Yamaoka and Mototaroh Nagamatsu and issued in 1988 by THE NIKKAN KOGYC SHIMBUN LTD.). For example, it is possible to use Riston manufactured by DuPont MRC Dry Film Co., Ltd., PhoTec manufactured by Hitachi Chemical Co., Ltd., and SUNFORT manufactured by ASAHI KASEI CORPORATION as products put on the market.

If the photo-crosslinkable resin layer to be used as the first resin layer according to the invention has a three-layer structure interposed between a carrier film (polyethylene terephthalate) and a protective film (polyethylene), it is suitable for preservation and the usage of bonding. If blocking does not become a problem, it is also possible to use a two-layer structure which does not use the protective film.

The photo-crosslinkable resin layer to be used as the first resin layer according to the invention may have a multilayer structure. For example, an alkali soluble resin layer is provided on either side or both sides of the photo-crosslinkable resin layer. A multilayer photo-crosslinkable resin layer has an advantage that a charging capability can be enhanced and a resistance to a damage in a delivery system can be improved as compared with a single layer photo-crosslinkable resin layer.

The photoconductive layer to be used as the first resin layer according to the method (6) or (7) of manufacturing a circuit board according to the invention is divided roughly into a conventional type and a memory type depending on a method of forming an electrostatic latent image. In the conventional type, first of all, a surface of the photoconductive layer is charged to be almost uniformly positive or negative in the dark or a safe light and a conducting capability of the photoconductive layer is then caused to come into effect by an exposure, thereby decreasing the amount of charging of an exposing portion. Thus, an electrostatic latent image corresponding to a circuit pattern is formed. Subsequently, a charged resin particle to form a third resin layer is electrodeposited and fixed along the electrostatic latent image, thereby forming the third resin layer in a circuit portion. In the conventional type, it is possible to use photoconductive layers described in publications of German Patent First No. 117391, German Patent Second No. 526720, German Patent No. 3210577, JP-A-52-2437, JP-A-57-48736, JP-A-59-168462, JP-A-63-129689, JP-A-2001-352148, Japanese Patent No. 3281476 and Japanese Patent No. 3281486.

In the memory type, an exposing processing corresponding to a circuit pattern is carried out to cause the exposing portion to express the conducting capability in the dark or the safe light, and a positive or negative charging processing is then carried out over the surface of the photoconductive layer to charge the surface of the photoconductive layer other than the exposing portion, thereby forming an electrostatic latent image corresponding to the circuit pattern. Subsequently, the charged resin particle to form the third resin layer is electrodeposited and fixed along the electrostatic latent image, thereby forming the third resin layer in the circuit portion. In the memory type, it is possible to use photoconductive layers described in publications of JP-A-2002-158422 and JP-A-2002-23470. If the photoconductive layer according to the invention has a three-layer structure interposed between a carrier film (polyethylene terephthalate) and a protective film (polyethylene), it is suitable for storage and sticking. If the blocking does not become a problem, it is also possible to use a two-layer structure which does not use the protective film.

Any method of sticking the first resin layer to the surface conductive layer may used if it is possible to provide the first resin layer without generating an unevenness and a waviness of the first resin layer and mixing air or dust into a sticking surface. For example, there is used an apparatus for pressing a thermal rubber roll for a printed board by pressure, thereby carrying out a lamination.

After the first resin layer is stacked, the carrier film is peeled. In this case, peeling charging is generated so that the surface of the first resin layer is charged unevenly. When the charging unevenness is generated, the second resin is electrodeposited and applied along the charging unevenness. Therefore, it is necessary to remove the charging or to carry out the charging evenly. For example, it is possible to employ a method of carrying out blowing through an ion blower, a method of carrying out heating (annealing) at 50° C. or more, and a method of blowing steam or water.

The developing solution for the first resin layer according to the invention serves to dissolve the first resin layer therein, and a developing solution corresponding to a composition of the first resin layer to be used is utilized. The first resin layer provided over the hole is removed with the developing solution and only the upper part of the hole is opened. For the developing solution for the first resin layer, it is possible to use any solution on the condition that the first resin layer is dissolved to the extent of the film thickness (that is, the second resin layer is not swollen and a shape is not changed at the step of forming an opening portion) even if the second resin layer is insoluble or the second resin layer is slightly dissolved. In the case in which an alkali soluble resin is used for the first resin layer, an alkali solution is usefully utilized. For example, it is possible to use a solution of an inorganic basic compound such as alkali metal silicate, alkali metal hydroxide, alkali metal phosphate and carbonate, or ammonium phosphate and carbonate, and an organic basic compound such as ethanol amines, ethylenediamine, propanediamines, triethylene tetramine and morpholine. These solutions control the solubility of the second resin layer. Therefore, it is necessary to regulate a concentration, a temperature and a spray pressure. After opening with the developing solution, the progress of the development is stopped by washing or an acid treatment.

The second resin layer according to the invention is insoluble or slightly soluble in the developing solution for the first resin layer, and any resin which can be used in an electrodepositing method may be employed. For the second resin layer, a solution used for the second resin layer is a obtained by dispersing the particle state resin in a liquid. The particle is charged to be positive or negative. For the liquid, it is possible to use water or an electrical insulating liquid. In the case in which the water is used, the second resin layer contains, as a principal component, a polymer having a proper acid value and is neutralized with organic amine, thereby forming a colloidal particle charged in the water. In the case in which the electrical insulating liquid is used, a resin such as an acrylic resin, a vinyl acetate resin, a vinyl chloride resin, a vinylidene chloride resin, or a vinyl acetal resin such as polyvinyl butyral, polystyrene, polyethylene, polypropylene and their chlorides, a polyester resin such as polyethylene terephthalate or polyethylene isophthalate or a polyamide resin, a vinyl denatured alkyd resin, gelatin, a cellulose ester derivative such as carboxymethyl cellulose is dispersed in a particle state in an electrical insulating liquid. The resin particle can be also made by containing a charge control agent. It is necessary to separately use the charges to be positive or negative depending on the positive or negative state of a bias voltage in the formation of the second resin layer. For a solution obtained by dispersing the resin for forming the second resin layer in the electrical insulating liquid, it is possible to suitably use a wet toner for electrophotography.

The second resin layer can be formed by disposing a development electrode to be opposed to a circuit forming substrate to which the first resin layer is bonded and filling a solution having a charged resin particle dispersed in a liquid between the circuit forming substrate and a development electrode, grounding the conductive layer of the circuit forming substrate and applying a proper bias voltage. For example, it is possible to use developing apparatuses described in publications of JP-A-2004-163605 and JP-A-2002-132049. It is possible to determine the thickness of the second resin layer by controlling the charge of the resin particle and a voltage to be applied, a delivery speed and an amount of supply of a resin particle dispersing solution. The resin particle stacked by the electrodepositing method is fixed onto the first resin layer by heating, pressure, light or a solvent so that the second resin layer is obtained. By setting the second resin layer to be a resist layer, the first resin layer provided over the hole is removed with the developing solution for the first resin layer.

In the invention, the third resin layer contains a resin which is insoluble or slightly soluble in a developing solution for a photoconductive layer and a conductive layer etchant. It is preferable that the third resin layer should also be formed by the electrodepositing method. The electrodepositing method includes a positive developing method of providing the third resin layer on a non-exposing portion, that is, a charged photoconductive layer by using a resin particle including a charge having a reverse polarity to an electrostatic latent image and an inversion developing method of providing the third resin layer on the photoconductive layer in the exposing portion, that is, a non-charging portion under an application of a proper bias voltage by using a resin particle including a charge having the same polarity as the electrostatic latent image. In the invention, it is necessary to provide the third resin layer on the conductive layer in and/or around a hole which is not charged. For this reason, it is preferable to use the inversion developing method.

In the method (6) or (7) of manufacturing a circuit board according to the invention, a solution obtained by dispersing, in a liquid, a resin used for the third resin layer in a particle state is utilized to form the third resin layer. The resin particle is charged to be positive or negative. For the liquid, it is possible to use water or an electrical insulating liquid. In the case in which the water is used, the third resin layer contains, as a principal component, a polymer having a proper acid value and is neutralized with organic amine, thereby forming a colloidal particle charged in the water. In the case in which the electrical insulating liquid is used, a resin such as an acrylic resin, a vinyl acetate resin, a vinyl chloride resin, a vinylidene chloride resin, or a vinyl acetal resin such as polyvinyl butyral, polystyrene, polyethylene, polypropylene and their chlorides, a polyester resin such as polyethylene terephthalate or polyethylene isophthalate, a polyamide resin, a vinyl denatured alkyd resin, gelatin or a cellulose ester derivative such as carboxymethyl cellulose is dispersed in a particle state in an electrical insulating liquid. The resin particle can be caused to contain the charge control agent. It is necessary to separately use the charges to be positive or negative depending on the positive or negative state of a bias voltage in the formation of the third resin layer. For a solution obtained by dispersing the resin for forming the third resin layer in the electrical insulating liquid, it is possible to suitably use a wet toner for electrophotography. It is possible to determine the thickness of the third resin layer by controlling the charge of the resin particle and a voltage to be applied, a delivery speed and an amount of supply of a resin particle dispersing solution. The charged resin particle stacked by the electrodepositing method is fixed by heating, pressure, light and a solvent so that the third resin layer is obtained.

Figure 81:
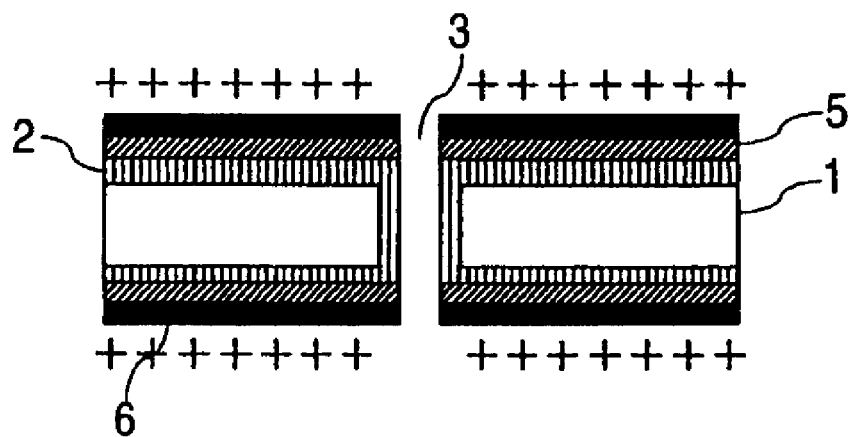
FIG. 81 is a cross sectional view showing one step in a method for manufacturing a circuit board of the present invention.
Figure 82:
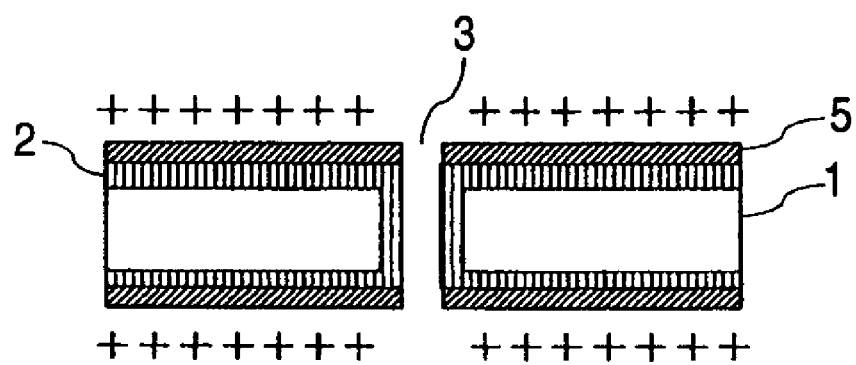
FIG. 82 is a cross sectional view showing one step in a method for manufacturing a circuit board of the present invention.

The fourth resin layer according to the invention contains a resin which is insoluble or slightly soluble in a first resin layer removing solution, a second resin layer removing solution and a conductive layer etchant. It is preferable that the fourth resin layer should also be formed by the electrodepositing method. For the electrodepositing method, it is possible to use a water system electrodepositing method capable of carrying out selective sticking onto the conductive layer. As shown in FIGS. 81 and 82, alternatively, it is preferable to use an inversion developing method capable of charging the surface of the first resin layer or the second resin layer and providing the fourth resin layer on the conductive layer in or/and around the hole which is not charged. When the inversion developing method is to be carried out, a proper electric field is applied. The conditions of the charge of a particle and the potential of an electrode are controlled in such a manner that the third resin is stacked onto the conductive layer in a sufficient thickness. For the developing apparatus, for example, it is possible to use developing apparatuses described in publications of JP-A-2004-163605 and JP-A-2002-132049.

For a component of the fourth resin layer according to the invention, for example, it is possible to use a water soluble electrodepositing resin and a wet toner resin to be used for electrophotography. For some water soluble electrodepositing resins, a polymer having a proper acid value is contained as a principal component and is neutralized with organic amine to be a water dispersing resin, and a giant charged colloidal particle is formed in the water. A component of the wet toner resin to be used for the electrophotography includes a resin particle dispersed in an electrical insulating liquid, and specific examples of the resin particle include an acrylic resin, a vinyl acetate resin, a vinyl chloride resin, a vinylidene chloride resin, or a vinyl acetal resin such as polyvinyl butyral, polystyrene, polyethylene, polypropylene and their chlorides, a polyester resin such as polyethylene terephthalate or polyethylene isophthalate, a polyamide resin, a vinyl denatured alkyd resin, gelatin, and a cellulose ester derivative such as carboxymethyl cellulose. The particle can be caused to contain a charge control agent. For a charge, it is necessary to use positive and negative separately corresponding to the charging polarity of the first resin layer or the second resin layer.

Examples of the method of removing the fourth resin layer include a method using an organic solvent, an alkali solution, an acid solution or an aqueous solution, a tape peeling method or a polishing method. For example, an acid solution includes sulfuric acid, acetic acid, hydrochloric acid, aqueous ammonium chloride, aqueous hydrogen peroxide and a copper ion containing solution, a copper ion containing solution, or an iron ion containing solution. Moreover, it is possible to use the tape peeling method and the polishing method.

The photo-crosslinkable resin layer according to the method (4) of manufacturing a circuit board according to the invention includes a negative (photo-crosslinking type) dry film photoresist for manufacturing a circuit board which is generally used. Examples will be given below, and any photo-crosslinkable resin can be applied if it does not depart from the gist of the invention. For example, it is possible to use a negative photosensitive resin composition constituted by a binder polymer containing a carboxylic acid group, a photopolymerizing multifunctional monomer, a photopolymerizing initiator, a solvent and other additives. Their mixing ratio is determined by a balance of demanded properties such as a sensitivity, a resolution, a hardness and a tenting property. These examples have been described in "Photopolymer Handbook" (edited by Photopolymer Special Meeting and issued in 1989 by Kogyo Chosakai Publishing Co., Ltd.) and "Photopolymer Technology" (edited by Aya Yamaoka and Mototaroh Nagamatsu and issued in 1988 by THE NIKKAN KOGYO SHIMBUN LTD.). For example, it is possible to use Riston manufactured by DuPont MRC Dry Film Co., Ltd., PhoTec manufactured by Hitachi Chemical Co., Ltd., and SUNFORT manufactured by ASAHI KASEI CORPORATION as products put on the market.

The photo-crosslinkable resin layer related to the method (4) of manufacturing a circuit board according to the invention can be provided by a thermo-compression bonding method. The conductive layer in the hole portion is protected by the fourth resin layer. Therefore, it is not necessary to carry out the tenting over the hole portion. Accordingly, it is possible to use the photo-crosslinkable resin layer having a small thickness. Moreover, it is necessary to have a solubility for the photo-crosslinkable resin layer removing solution.

For an unreacted photo-crosslinkable resin layer removing solution, there is used a developing solution which can dissolve or disperse the photo-crosslinkable resin layer and corresponds to a composition of the photo-crosslinkable resin layer to be used. In general, an alkali solution is utilized usefully and it is possible to use a solution of an inorganic basic compound such as alkali metal silicate, alkali metal hydroxide, alkali metal phosphate and carbonate, or ammonium phosphate and carbonate, and an organic basic compound such as ethanol amines, ethylenediamine, propanediamines, triethylene tetramine and morpholine. In these solutions, it is necessary to regulate a concentration, a temperature and a spray pressure. It is possible to quickly stop the removal of the photo-crosslinkable resin layer by carrying out washing or an acid treatment subsequently to a treatment performed by the photo-crosslinkable resin layer removing solution. In order to remove a crosslinked portion in the photo-crosslinkable resin layer after use as the etching resist layer, it is possible to use a strong alkali solution containing sodium hydroxide, potassium hydroxide or metasodium silicate, alcohol and an organic solvent such as ketone.

For a method of charging the surface of the first resin layer or that of the second resin layer, there have conventionally been known a non-contact charging method such as a corotron method and a scorotron method and a contact charging method such as conductive roll charging, and any of the methods may be employed.

In the method of manufacturing a circuit board according to the invention, a method of exposing a light to a photoconductive layer and a crosslinking reaction of the photo-crosslinkable resin layer are carried out by laser direct drawing, an adhesion exposure through a photomask and a projection exposure. It is possible to use an extra-high pressure mercury lamp, a high pressure mercury lamp, a metal halide lamp or a xenon lamp.

It is sufficient that an etchant to be used in the etching of the conductive layer according to the invention can dissolve and remove the conductive layer. For example, it is possible to use general etchants such as alkaline ammonia, sulfuric acid-hydrogen peroxide, copper(II) chloride, peroxosulfate and iron(III) chloride. For the apparatus and the method, moreover, it is possible to use an apparatus and a method such as horizontal spray etching or immersion etching. These details have been described in "Printed Circuit Technique Manual" (edited by Japan Electronics Packaging and Circuits Association and issued in 1987 by THE NIKKAN KOGYO SHIMBUN LTD.). Moreover, a plating method which can be used in the invention has been described in the same manual, for example.

In the method of manufacturing a circuit board according to the invention, it is possible to use a method of removing the crosslinked photo-crosslinkable resin layer with a high pH alkaline solution or an organic solvent as a method of carrying out the removal.

It is sufficient that the etchant to be used in the etching of the first conductive layer which is related to the method (8) of manufacturing a circuit board according to the invention can dissolve and remove the first conductive layer. For example, it is possible to use general etchants such as alkaline ammonia, sulfuric acid-hydrogen peroxide, copper(II) chloride, peroxosulfate and iron(III) chloride. For the apparatus and the method, moreover, it is possible to use an apparatus and a method such as horizontal spray etching or immersion etching. These details have been described in the "Printed Circuit Technique Manual" (edited by Japan Electronics Packaging and Circuits Association and issued in 1987 by THE NIKKAN KOGYO SHIMBUN LTD.).

For the nonelectrolytic plating processing and the electrolytic plating processing according to the invention, it is possible to use a processing described in the "Printed Circuit Technique Manual" (edited by Japan Electronics Packaging and Circuits Association and issued in 1987 by THE NIKKAN KOGYO SHIMBUN LTD.), for example.

EXAMPLE

Example 1

Formation of First Resin Layer

By using a coating solution having a composition shown in Table 1, a resin film for a first resin layer (a thickness of the film after drying is 15 µm) formed by an alkali soluble resin was manufactured on a polyethylene terephthalate film having a thickness of 25 µm (manufactured by Mitsubishi Chemical Polyester Film Co., Ltd.) by using a curtain coating method.

TABLE 1

| | |
|---|---|
| n-butyl methacrylate/n-butyl acrylate/methacrylic acid copolymer (molecular weight of 20000, monomer composition ratio (mass) = 4/3/3) | 15 parts by mass |
| dibutyl phthalate | 2.5 parts by mass |
| 1-methoxy-2-propanol | 82.5 parts by mass |

As a circuit forming substrate, a copper-clad laminate including a copper foil having a thickness of 12 µm in a size of 200×200×0.4 mm was used to form a plurality of through holes having a diameter of 0.15 mm by means of a drill, and nonelectrolytic copper plating-electrolytic copper plating processings (OKUNO CHEMICAL INDUSTRIES CO., LTD., OPC Process M) was executed to form a copper plated layer having a thickness of 12.5 µm on a surface of the substrate and internal walls of the through holes. Next, the resin film was laminated on the 120° C. preheating condition by using a laminator for a dry film. Then, a polyethylene terephthalate film was peeled at room temperature and heating was carried out at 80° C. for one minute to eliminate an unevenness of peeling and charging on the first resin layer which is generated by peeling the polyethylene terephthalate film.

Formation of Second Resin Layer

By using a positive charge toner for the Mitsubishi OPC printing system ("ODP-TW" manufactured by the Mitsubishi Paper Mills Ltd.), a bias voltage of +200V was applied to carry out electrodeposition coating so that the toner was electrodeposited on a whole surface other than a hole portion. Subsequently, heating was carried out at 70° C. for two minutes to fix the toner so that an excellent second resin layer was obtained.

<Manufacture of Open Substrate having Resin>

Figure 83:
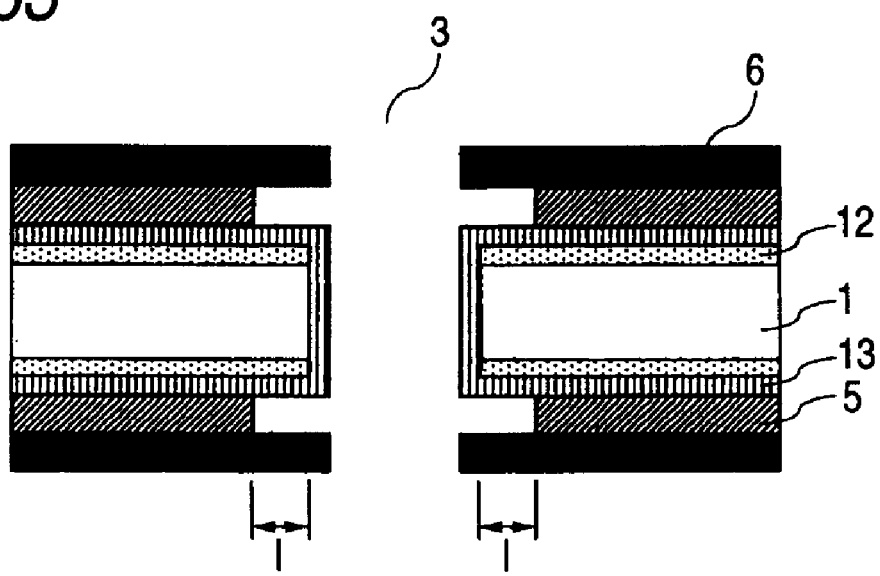
FIG. 83 is a cross sectional view of an example of an open substrate having resin by a method for manufacturing a circuit board of the present invention.

Only the first resin layer formed over the hole which is not provided with the second resin layer was eluted and removed by using an alkali solution so that an open substrate having a resin was formed. A portion provided around the hole in the open substrate having a resin in which the first resin layer and the second resin layer are not present was observed by means of a microscope. An eluting distance 1 of the first resin layer was measured by setting a cut of perforation as a base point as shown in FIG. 83. Consequently, a result shown in Table 2 was obtained. It was confirmed that a desirable eluting distance can be obtained by adjusting the eluting conditions.

TABLE 2

| Alkali species | Concentration [%] | Temperature [° C.] | Eluting time [second] | First resin layer eluting distance 1 [μm] |
|---|---|---|---|---|
| Sodium carbonate | 1 | 20 | 12 | −21 |
| Sodium carbonate | 1 | 20 | 24 | −2 |
| Sodium carbonate | 3 | 30 | 24 | 33 |
| Sodium silicate | 3 | 20 | 10 | 19 |

Example 2

Formation of First Resin Layer

By using a coating solution having the composition shown in the Table 1, a resin film for a first resin layer (a thickness of the film after drying is 15 μm) formed by an alkali soluble resin was manufactured on a polyethylene terephthalate film having a thickness of 25 μm (manufactured by Mitsubishi Chemical Polyester Film Co., Ltd.) by using a curtain coating method.

As a circuit forming substrate, a copper-clad laminate including a copper foil having a thickness of 12 μm in a size of 200×200×0.4 mm was used to form a plurality of through holes having a diameter of 0.15 mm by means of a drill. Next, the first resin layer was laminated on the 120° C. preheating condition by using a laminator for a dry film. Then, a polyethylene terephthalate film was peeled at room temperature. Thereafter, heating was carried out at 80° C. for one minute to eliminate an unevenness of peeling and charging on the first resin layer which is generated by peeling the polyethylene terephthalate film.

Formation of Second Resin Layer

By using a positive charge toner for the Mitsubishi OPC printing system ("ODP-TW" manufactured by the Mitsubishi Paper Mills Ltd.), a bias voltage of +200V was applied to carry out electrodeposition coating so that the toner was electrodeposited on a whole surface other than a hole portion. Subsequently, heating was carried out at 70° C. for two minutes to fix the toner so that an excellent second resin layer was obtained.

<Manufacture of Open Substrate having Resin>

Figure 84:
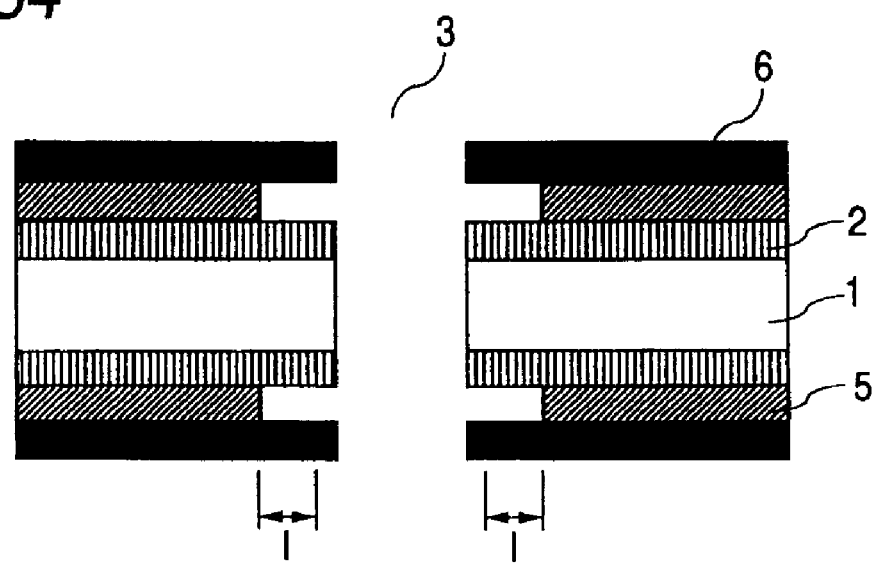
FIG. 84 is a cross sectional view of an example of an open substrate having resin by a method for manufacturing a circuit board of the present invention.

Only the first resin layer formed over the hole which is not provided with the second resin layer was eluted and removed by using an alkali solution so that an open substrate having a resin was formed. A portion provided around the hole in the open substrate having a resin in which the first resin layer and the second resin layer are not present was observed by means of a microscope. An eluting distance 1 of the first resin layer was measured by setting a cut of perforation as a base point as shown in FIG. 84. Consequently, a result shown in Table 3 was obtained. It was confirmed that a desirable eluting distance can be obtained by adjusting the eluting conditions.

TABLE 3

| Alkali species | Concentration [%] | Temperature [° C.] | Eluting time [second] | First resin layer eluting distance 1 [μm] |
|---|---|---|---|---|
| Sodium carbonate | 1 | 20 | 12 | −15 |
| Sodium carbonate | 1 | 20 | 24 | 2 |
| Sodium carbonate | 3 | 30 | 24 | 36 |
| Sodium silicate | 3 | 20 | 10 | 23 |

Example 3

Formation of First Resin Layer

By using a coating solution having the composition shown in the Table 1, a first resin layer (a thickness of the film after drying is 15 μm) formed by an alkali soluble resin was manufactured on a polyethylene terephthalate film having a thickness of 25 μm (manufactured by Mitsubishi Chemical Polyester Film Co., Ltd.) by using a curtain coating method.

A copper-clad laminate including a copper foil having a thickness of 12 μm in a size of 200×200×0.4 mm was used to form a plurality of through holes having a diameter of 0.15 mm by means of a drill, and nonelectrolytic copper plating-electrolytic copper plating processings (OKUNO CHEMICAL INDUSTRIES CO., LTD., OPC Process M) was executed to form a copper plated layer having a thickness of approximately 12.5 μm on a surface and internal walls of the through holes. Next, the first resin layer was thermo-compression bonded on the 120° C. preheating condition by using a laminator for a dry film. Then, a polyethylene terephthalate film was peeled at room temperature and heating was carried out at 80° C. for one minute to eliminate an unevenness of peeling and charging.

Formation of Second Resin Layer

By using a positive charge toner for the Mitsubishi OPC printing system ("ODP-TW" manufactured by the Mitsubishi Paper Mills Ltd.), next, a bias voltage of +300V was applied to carry out electrodeposition coating so that the toner was electrodeposited on the first resin layer provided on the surface conductive layer. Subsequently, heating was carried out at 70° C. for two minutes to fix the toner so that an excellent second resin layer was obtained.

<Removal of First Resin Layer Over the Hole>

Figure 85:
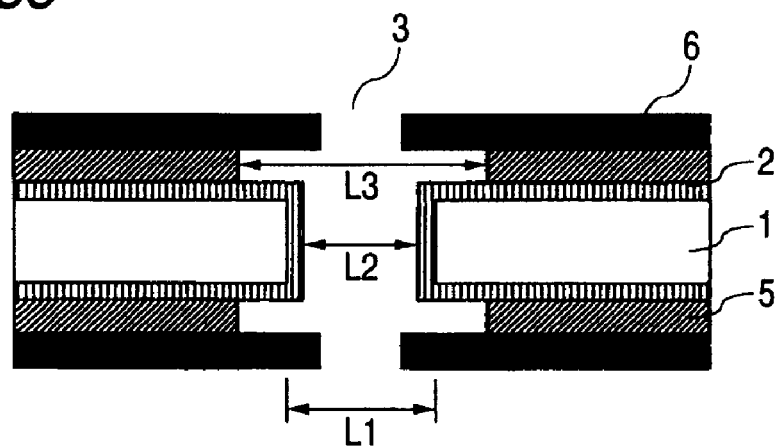
FIG. 85 is a cross sectional view showing one step in a method for manufacturing a circuit board of the present invention.

Next, the first resin layer provided over the hole was dissolved and removed by using a 1% by mass sodium carbonate solution (30° C.). The through hole portion was observed by means of a microscope. Consequently, there were obtained a through hole diameter of L1=150 μm in perforation, a through hole diameter of L2=125 μm in copper plating and a diameter of the first resin layer removing portion of L3=188 μm as shown in FIG. 85.

Formation of Fourth Resin Layer

A corona charger (a charging transformer output; 4.2 kV) was used to apply a charge to both surfaces of the second resin layer. A surface potential was measured to be 250 V. By using an acrylic resin type emulsion (a toner described in example 1 of JP-A-2002-296847 publication), next, a bias voltage of +200V was applied to carry out an inversion development, thereby sticking a toner onto a conductive layer on an internal wall of the hole. The toner was thermally fixed at 90° C. for two minutes so that a fourth resin layer was obtained.

<Removal of First Resin Layer, Removal of Second Resin Layer>

The second resin layer and the first resin layer were removed at a time with a 3% sodium hydroxide solution at 50° C. and were dried at 90° C. for 20 minutes after washing so that a substrate in which the conductive layer provided on the internal wall of the hole was covered with the fourth resin layer was obtained.

Figure 86:
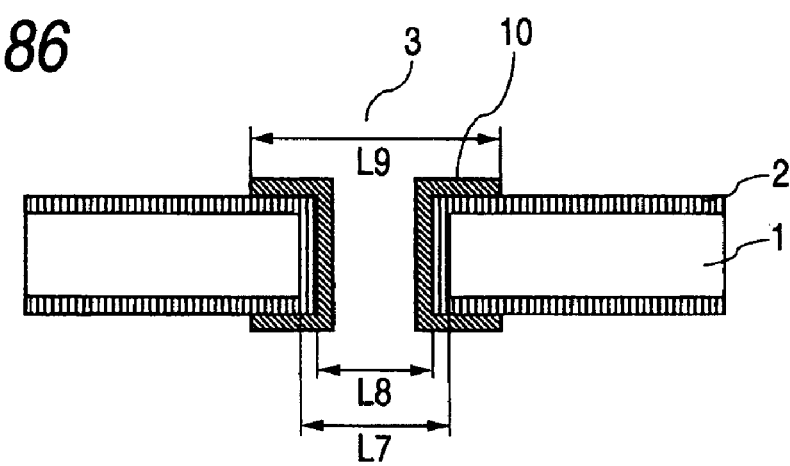
FIG. 86 is a cross sectional view showing one step in a method for manufacturing a circuit board of the present invention.

The through hole portion was observed by means of the microscope. Consequently, there were obtained a through hole diameter of L7=150 µm in perforation, a through hole diameter of L8=125 µm in copper plating and a diameter of the fourth resin layer covering portion of L9=188 µm as shown in FIG. 86.

<Formation of Etching Resist Layer by Photo-Crosslinkable Resin Layer>

By using a laminator for a dry film photoresist under an yellow safe light, a dry film resist having a thickness of 10 µm which is put on the market was thermo-compression bonded to both sides of the substrate so that a photo-crosslinkable resin layer was provided on a conductive layer formed on a surface. A photomask having a circuit pattern drawn thereon (a conductor width and a gap: 50 µm) was mounted and an ultraviolet exposure was carried out for 30 seconds by using a high pressure mercury lamp light source apparatus for printing which has a chucking mechanism (UNILEC URM300 manufactured by USHIO INC.). Furthermore, the substrate was inverted to carry out the exposure to the photo-crosslinkable resin layer on a reverse surface in the same manner so that a crosslinked portion of the circuit pattern was formed. After the carrier film was peeled, an uncured photo-crosslinkable resin layer was eluted and removed by using a 1% by mass sodium carbonate solution (30° C.) so that an etching resist layer formed by the crosslinked portion was formed.

<Manufacture of Circuit Board>

Figure 87:
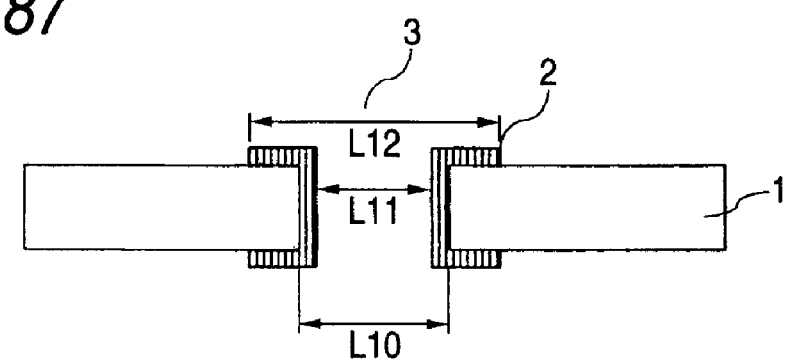
FIG. 87 is a cross sectional view showing one step in a method for manufacturing a circuit board of the present invention.

A treatment was carried out with an iron(III) chloride type etchant (40° C., a spray pressure of 3.0 kgf/cm$^2$) to remove an electrolytic copper plated layer, a nonelectrolytic copper plated layer and a copper layer of a copper-clad laminate which were exposed. The crosslinked portion of the photo-crosslinkable resin layer and the fourth resin layer which were used as the etching resist layers were removed with a 3% by mass sodium hydroxide solution (40° C.) and methyl ethyl ketone so that a circuit board was obtained. The circuit board thus obtained was observed by means of a microscope. Consequently, a land to be the conductive layer in the peripheral portion of the through hole was formed concentrically with the through hole. Thus, there were obtained a through hole diameter of L10=150 µm in perforation, a through hole diameter of L11=125 µm in copper plating and a land diameter of L12=178 µm as shown in FIG. 87. Moreover, a disconnection was not confirmed in the circuit portion and the through hole portion.

Example 4

Formation of First Resin Layer

By using a coating solution having the composition shown in the Table 1, a first resin layer (a thickness of the film after drying is 15 µm) formed by an alkali soluble resin was manufactured on a polyethylene terephthalate film having a thickness of 25 µm (manufactured by Mitsubishi Chemical Polyester Film Co., Ltd.) by using a curtain coating method.

A copper-clad laminate including a copper foil having a thickness of 12 µm in a size of 200×200×0.4 mm was used to form a plurality of through holes having a diameter of 0.15 mm by means of a drill, and nonelectrolytic copper plating-electrolytic copper plating processings (OKUNO CHEMICAL INDUSTRIES CO., LTD., OPC Process M) was executed to form a copper plated layer having a thickness of approximately 12.5 µm on a surface and internal walls of the through holes. Next, the first resin layer was thermo-compression bonded on the 120° C. preheating condition by using a laminator for a dry film. Then, a polyethylene terephthalate film was peeled at room temperature and heating was carried out at 80° C. for one minute to eliminate an unevenness of peeling and charging.

Formation of Second Resin Layer

A corona charger (a charging transformer output; +5.0 kV) was used to apply a charge to both surfaces of the first resin layer. A surface potential was measured. Consequently, it was confirmed that the first resin layer portion on the surface conductive layer had a potential of +100V and the first resin layer portion over the hole had a potential of +300V, and a charging potential difference was made between the surface conductive layer and the hole. By using a positive charge toner for the Mitsubishi OPC printing system ("ODP-TW" manufactured by the Mitsubishi Paper Mills Ltd.), next, a bias voltage of +200V was applied to carry out an inversion development, thereby electrodepositing the toner onto the whole surface of the first resin layer provided on the surface conductive layer. Subsequently, heating was carried out at 70° C. for two minutes to fix the toner so that an excellent second resin layer was obtained.

<Removal of First Resin Layer over the Hole>

Only the first resin layer over the hole which is not provided with the second resin layer was dissolved and removed by using a 1% by mass sodium carbonate solution (30° C.). The through hole portion was observed by means of a microscope. Consequently, there were obtained a through hole diameter of L1=150 µm in perforation, a through hole diameter of L2=125 µm in copper plating and a diameter of the first resin layer removing portion of L3=160 µm as shown in FIG. 85.

<Removal of Second Resin Layer and Formation of Fourth Resin Layer>

After the second resin layer was removed with xylene, a charge was applied to the surface of the first resin layer by using a corona charger (a charging transformer output; +4.2 kV). A surface potential was measured to be 260 V. By using an acrylic resin type emulsion (a toner described in the example 1 of the JP-A-2002-296847 publication), next, a bias voltage of +200V was applied to carry out an inversion development so that the toner was stacked onto the conductive layer provided on the internal wall of the hole. The toner was thermally fixed at 90° C. for two minutes so that a fourth resin layer was obtained.

<Removal of First Resin Layer>

The first resin layer was dissolved and removed with a 1% sodium carbonate solution and was dried at 90° C. for 20 minutes after washing so that there was obtained a substrate in which the conductive layer on the internal wall of the hole and in the peripheral portion of the hole was covered with the fourth resin layer.

Figure 88:
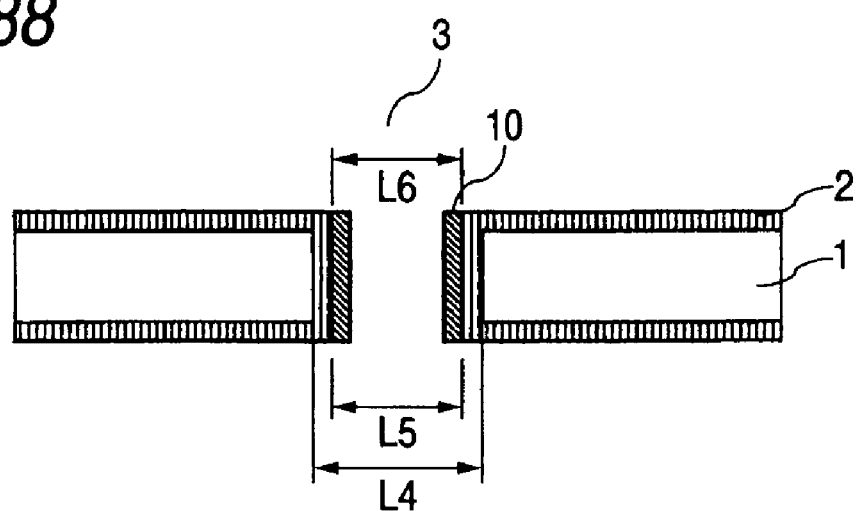
FIG. 88 is a cross sectional view showing one step in a method for manufacturing a circuit board of the present invention.

The through hole portion was observed by means of the microscope. Consequently, there were obtained a through hole diameter of L4=150 µm in perforation, a through hole diameter of L5=125 µm in copper plating and a diameter of a fourth resin layer covering portion of L6=125 µm as shown in FIG. 88.

<Formation of Etching Resist Layer>

By using a coating solution having a composition shown in Table 4, a film (a thickness of the film after drying is 10 µm) formed by a photoconductive layer was manufactured on a polyethylene terephthalate film having a thickness of 25 µm (manufactured by Mitsubishi Chemical Polyester Film Co., Ltd.) by using a curtain coating method. The photoconductive layer film was thermo-compression bonded to both sides of the substrate so that the photoconductive layer was provided on the conductive layer. Under an yellow safe light, a photomask having a circuit pattern drawn thereon (a conductor width and a gap: 50 μm) was mounted and an ultraviolet exposure was carried out for 30 seconds by using a high pressure mercury lamp light source apparatus for baking which has a sucking and adhering mechanism (UNILEC URM300 manufactured by USHIO INC.). Furthermore, the substrate was inverted to carry out the exposure to the photoconductive layer on a reverse surface in the same manner.

TABLE 4

| | |
|---|---|
| n-butyl methacrylate/n-butyl acrylate/methacrylic acid copolymer (molecular weight of 20000, monomer composition ratio (mass) = 4/3/3) | 15 parts by mass |
| compound expressed in formula (A) | 5 parts by mass |
| 1-methoxy-2-propanol | 80 parts by mass |

Formula 1

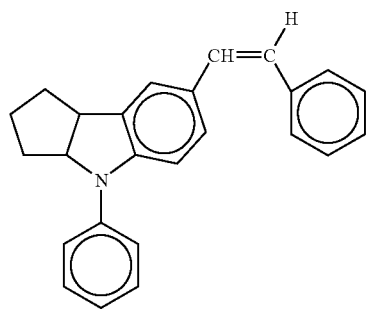

(A)

By using a corona charger (a charging transformer output of +5.0 kV) for the substrate subjected to the exposing processing, both sides were charged to form an electrostatic latent image. After one minute since the charging processing, a surface potential of an unexposed portion was 330V and a surface potential of an exposed portion was 100V. By using the Mitsubishi OPC printing system positive charge toner (ODP-TW manufactured by Mitsubishi Paper Mills Ltd.), subsequently, a bias voltage of 220V was applied to carry out an inversion development so that a toner image was obtained in a circuit portion provided on the photoconductive layer. The toner was thermally fixed at 90° C. for two minutes. The photoconductive layer which was not covered with the toner was eluted and removed by using the 1% by mass sodium carbonate solution (30° C.) so that an electrolytic copper plated layer in a non-circuit portion was exposed.

<Manufacture of Circuit Board>

Figure 89:
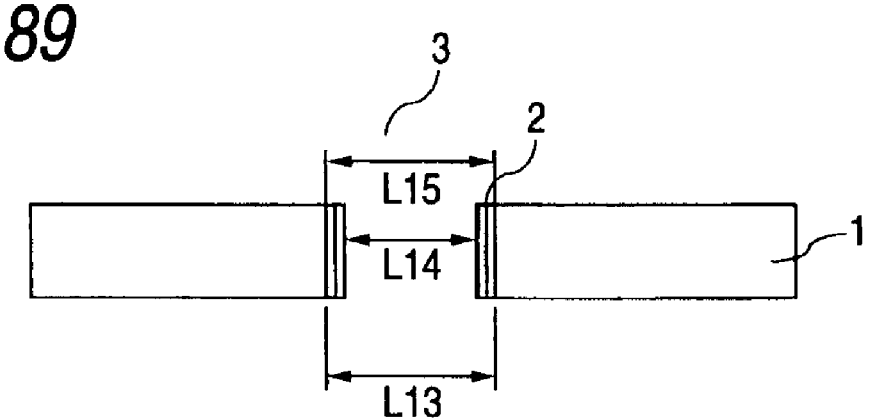
FIG. 89 is a cross sectional view showing one step in a method for manufacturing a circuit board of the present invention.

A treatment was carried out with an iron(III) chloride type etchant (40° C., a spray pressure of 3.0 kgf/cm²) and the electrolytic copper plated layer, the nonelectrolytic copper plated layer and the copper layer of the copper-clad laminate which were exposed were removed. The toner, the photoconductive layer and the fourth resin layer which were used as the etching resist layers were removed with a 3% by mass sodium hydroxide solution (40° C.) and methyl ethyl ketone so that a circuit board was obtained. The circuit board thus obtained was observed by means of the microscope. Consequently, a land to be the conductive layer in the peripheral portion of the through hole was formed concentrically with the through hole. There were obtained a through hole diameter of L13=150 μm in perforation, a through hole diameter of L14=125 μm in copper plating and a land diameter of L15=150 μm as shown in FIG. 89. Moreover, a disconnection was not confirmed in the circuit portion and the through hole portion.

Example 5

Formation of First Resin Layer

The following experiment has been performed under the yellow safe light.

In a copper-clad glass base epoxy resin substrate (the area 340 mm×510 mm, the base thickness 0.1 mm, and the copper layer thickness 12 μm), a 150 μm diameter through hole was opened. Then, an electroless copper plating processing and an electrolytic copper plating processing were carried out, thereby to provide an electroless copper plated layer with a thickness of 0.5 μm and an electrolytic copper plated layer with a thickness of 12 μm on the inner wall of the through hole and each surface. By using a laminator for a dry film photoresist, 20-μm thick circuit forming dry film resists were bonded by thermocompression on the opposite sides of the substrate, so that photo-crosslinkable resin layers were provided on the conductive layers. Thereafter, at room temperature, each carrier film was peeled off, and the substrate was heated at 80° C. for 1 minute. As a result, the uneven peeling charge on the dry film resist generated by peeling of the carrier film was eliminated.

<Formation of Second Resin Layer>

By using a positive-charge toner (manufactured by MITSUBISHI PAPER MILLS LIMITED., "ODP-TW") for Mitsubishi OPC printing system, a bias voltage of +200 V was applied to perform electrodeposition coating. As a result, the toner was electrolytically deposited on the portion of the photo-crosslinkable resin layer on each surface conductive layer. Subsequently, the toner was heated at 70° C. for 2 minutes, and fixed, resulting in a favorable second resin layer.

<Removal of First Resin Layer Over the Hole>

The portion of the photo-crosslinkable resin layer over the hole was dissolved and removed by using a 1 mass % sodium carbonate aqueous solution (30° C.). The through hole part was observed under a microscope. As a result, as shown in FIG. 85, it was found as follows: the through hole diameter L1 after finishing the hole-making processing=150 μm, the through hole diameter L2 upon copper plating=125 μm, and the diameter L3 of the photo-crosslinkable resin layer-removed part=158 μm.

<Formation of Fourth Resin Layer>

The second resin layer was uniformly charged to +200 V by means of a corona charging device. By using an acrylic resin emulsion (the toner described in Example 1 of JP-A-2002-296847), a bias voltage of +100 V was applied to perform reversal development, so that the toner was electrolytically deposited on the inner wall of the hole. The toner was heated at 70° C. for 2 minutes, and fixed, resulting in a favorable fourth resin layer.

<Manufacture of Circuit Board>

Then, a photomask (conductor width and space: 50 μm) having a circuit pattern drawn thereon was mounted. Thus, by using a high pressure mercury lamp light source device for burning having a chucking mechanism (UNILEC URM 300, manufactured by USHIO INC.), exposure to ultraviolet radiation was carried out for 30 seconds. Further, the substrate was inverted, so that the exposure was also carried out in the same manner on the photo-crosslinkable resin layer on the opposite side. As a result, the crosslinked portion of the circuit pattern was formed.

For the substrate which had completely undergone the exposing processing, the second resin layer and the unhardened portion of the photo-crosslinkable resin layer were dissolved and removed by using xylene and a 1 mass % sodium carbonate aqueous solution (30° C.), thereby to form a resist circuit made up of the crosslinked portion. Then, the substrate was processed with a ferric chloride type etchant (40° C., spray pressure 3.0 kgf/cm$^2$), thereby to remove the exposed portion of the electrolytic copper plated layer, and the underlying electroless copper plated layer and the copper layer of the copper-clad laminate. The crosslinked portion of the photo-crosslinkable resin layer and the fourth resin layer used as an etching resist were removed with a 3 mass % sodium hydroxide aqueous solution (40° C.) and methyl ethyl ketone, resulting in a circuit board. The obtained circuit board was observed under a microscope. As a result, as shown in FIG. 89, it was found as follows: the through hole diameter L13 after finishing the hole-making processing=150 μm, the through hole diameter L14 upon copper plating=125 μm, and the land diameter L15=150 μm; and a landless through hole was formed. Whereas, no disconnection was observed in the circuit part and the through hole part.

Example 6

Formation of First Resin Layer

The following experiment has been performed under the yellow safe light.

In a copper-clad glass base epoxy resin substrate (the area 340 mm×510 mm, the base thickness 0.1 mm, and the copper layer thickness 12 μm), a 150 μm diameter through hole was opened. Then, an electroless copper plating processing was carried out, thereby to provide an electroless copper plated layer with a thickness of 0.5 μm on the inner wall of the through hole and each surface. By using a laminator for a dry film photoresist, 20-μm thick circuit forming dry film resists were bonded by thermocompression on the opposite sides of the substrate, so that photo-crosslinkable resin layers were provided on the conductive layers.

Formation of Second Resin Layer

At room temperature, each carrier film was peeled off. Then, the photo-crosslinkable resin layer surfaces on the opposite sides were charged by means of a corona charging device (charging transformer output +5.0 kV). Subsequently, by using a positive-charge toner (manufactured by MITSUBISHI PAPER MILLS LIMITED., "ODP-TW") for Mitsubishi OPC printing system, a bias voltage of °200 V was applied to perform reversal development. As a result, the toner was electrolytically deposited on the entire surface except for the hole part. Subsequently, the toner was heated at 70° C. for 2 minutes, and fixed, resulting in a favorable second resin layer.

<Removal of First Resin Layer over the Hole and Formation of Plated Conductive Layer in the Hole>

Figure 90:
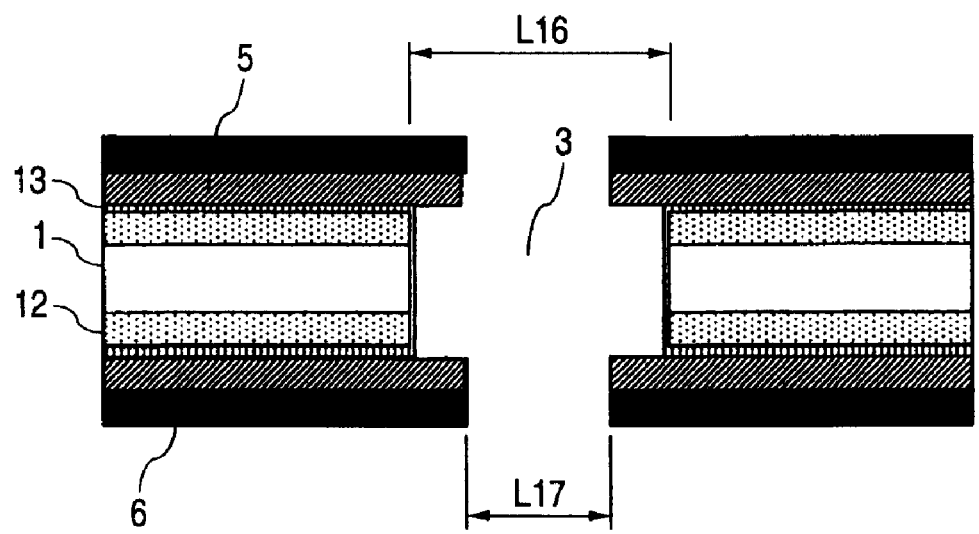
FIG. 90 is a cross sectional view showing one step in a method for manufacturing a circuit board of the present invention.

Only the portion of the photo-crosslinkable resin layer over the hole was dissolved and removed by using a 1 mass % sodium carbonate aqueous solution (30° C.). The through hole part was observed under a microscope. As a result, as shown in FIG. 90, it was found as follows: the through hole diameter L16 after finishing the hole-making processing=150 μm, and the diameter L17 of the photo-crosslinkable resin layer-removed part=110 μm. Subsequently, an electrolytic copper plating processing was carried out, thereby to form an electrolytic copper plated layer with a thickness of 12 μm on the portion of the electroless copper plated layer in the through hole.

<Removal of First Resin Layer at Periphery of the Hole>

Figure 91:
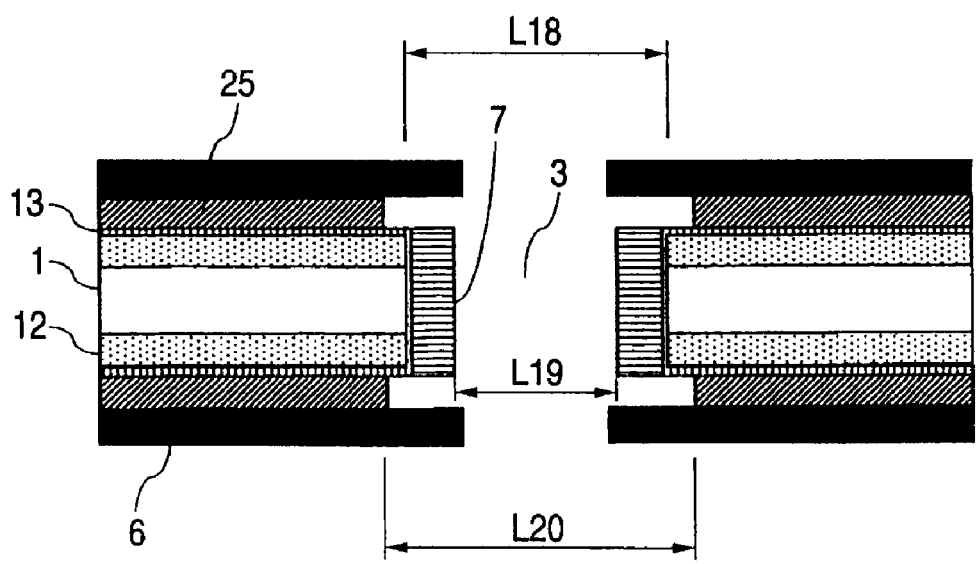
FIG. 91 is a cross sectional view showing one step in a method for manufacturing a circuit board of the present invention.

Subsequently, the portion of the photo-crosslinkable resin layer in the periphery of the through hole was dissolved and removed by using a 1 mass % sodium carbonate aqueous solution (30° C.). The through hole part was observed under a microscope. As a result, it was found that the portion of the photo-crosslinkable resin layer in the periphery of the through hole was removed concentrically with the through hole. As shown in FIG. 91, it was found as follows: the through hole diameter L18 after finishing the hole-making processing=150 μm, the through hole diameter L19 after electrolysis copper plating=125 μm, and the diameter L20 of the photo-crosslinkable resin layer-removed part=190 μm.

Formation of Fourth Resin Layer

Then, the second resin layer surface was uniformly charged to +200 V by means of a corona charging device. By using an acrylic resin emulsion (the toner described in Example 1 of JP-A-2002-296847), a bias voltage of +100 V was applied to perform reversal development, so that the toner was electrolytically deposited on the inner wall of the hole. The toner was heated at 70° C. for 2 minutes, and fixed, resulting in a favorable fourth resin layer.

<Manufacture of Circuit Board>

Then, a photomask (conductor width and space: 50 μm) having a circuit pattern drawn thereon was mounted. Thus, by using a high pressure mercury lamp light source device for burning having a suction contact mechanism (UNILEC URM 300, manufactured by USHIO INC.), exposure to ultraviolet radiation was carried out for 30 seconds. Further, the substrate was inverted, so that the exposure was also carried out in the same manner on the photo-crosslinkable resin layer on the opposite side. As a result, the crosslinked portion of the circuit pattern was formed.

Figure 92:
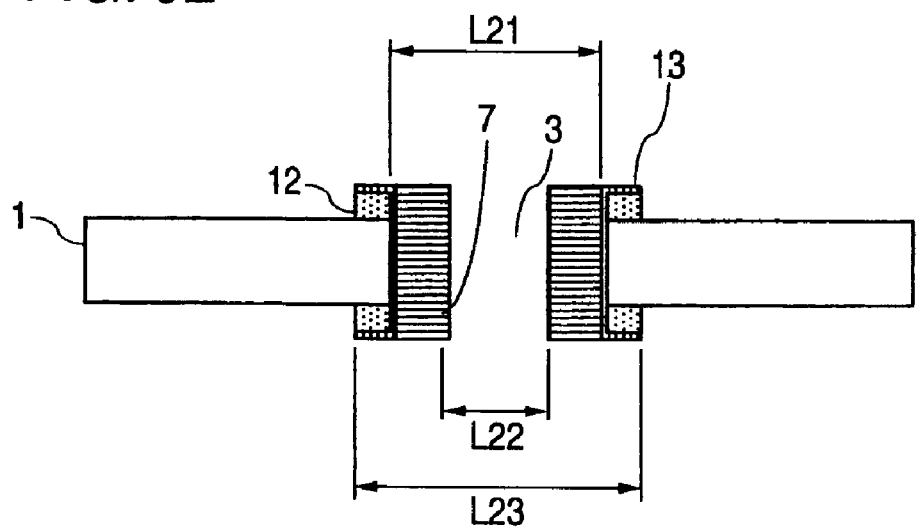
FIG. 92 is a cross sectional view showing one step in a method for manufacturing a circuit board of the present invention.

For the substrate which had completely undergone the exposing processing, the second resin layer and the unhardened portion of the photo-crosslinkable resin layer were dissolved and removed by using xylene and a I mass % sodium carbonate aqueous solution (30° C.), thereby to form a resist circuit made up of the crosslinked portion. Then, the substrate was processed with a ferric chloride type etchant (40° C. spray pressure 3.0 kgf/cm$^2$), thereby to remove the exposed portion of the electroless copper plated layer and the copper layer of the copper-clad laminate. The crosslinked portion of the photo-crosslinkable resin layer and the fourth resin layer used as an etching resist were removed with a 3 mass % sodium hydroxide aqueous solution (40° C.) and methyl ethyl ketone, resulting in a circuit board. The obtained circuit board was observed under a microscope. As a result, it was found that the land which is the portion of the conductive layer in the periphery of the through hole was formed concentrically with the through hole. As shown in FIG. 92, it was found as follows: the through hole diameter L21 after finishing the hole-making processing=150 μm, the through hole diameter L22 upon copper plating=125 μm, and the land diameter L23=180 μm; and a narrow land width through hole was formed. Whereas, no disconnection was observed in the circuit part and the through hole part.

Example 7

Formation of First Resin Layer

The following experiment has been performed under the yellow safe light. By using a coating solution of the composition of Table 4, on a 25-μm thick polyethylene terephthalate film (manufactured by Mitsubishi Polyester Film Corp.), a film (the film thickness after drying 20 μm) made up of a photoconductive layer was manufactured with a curtain coat method.

In a copper-clad glass base epoxy resin substrate (the area 340 mm×510 mm, the base thickness 0.1 mm, and the copper layer thickness 12 μm), a 0.15 mm diameter through hole was opened. Then, an electroless copper plating processing was carried out, thereby to provide an electroless copper plated layer with a thickness of about 0.5 μm on the inner wall of the through hole and each surface. By using a laminator for a dry film photoresist, the photoconductive layer films were bonded by thermocompression on the opposite sides of the substrate, so that photoconductive layers were provided on the conductive layers. Thereafter, at room temperature, each polyethylene terephthalate film was peeled off, and the substrate was heated at 80° C. for 1 minute. As a result, the uneven peeling charge on the photoconductive layer generated by peeling of the polyethylene terephthalate film was eliminated.

Formation of Second Resin Layer

By using a positive-charge toner (manufactured by MITSUBISHI PAPER MILLS LIMITED., "ODP-TW") for Mitsubishi OPC printing system, a bias voltage of +200 V was applied to perform electrodeposition coating. As a result, the toner was electrolytically deposited on the entire surface except for the hole part. Subsequently, the toner was heated at 70° C. for 2 minutes, and fixed, resulting in a favorable second resin layer.

<Removal of First Resin Layer Over the Hole and Formation of Plated Conductive Layer in the Hole>

Only the portion of the photoconductive layer over the hole was dissolved and removed by using a 1 mass % sodium carbonate aqueous solution (30° C.). The through hole part was observed under a microscope. As a result, as shown in FIG. 90, it was found as follows: the through hole diameter L16 after finishing the hole-making processing=150 μm, and the diameter L17 of the photoconductive layer-removed part=110 μm. Subsequently, an electrolytic copper plating processing was carried out, thereby to provide an electrolytic copper plated layer with a thickness of about 12 μm on the portion of the electroless copper plated layer in the through hole. Then, by using propylene carbonate as a solvent which dissolves the second resin layer, but does not dissolve the photoconductive layer, only the second resin layer was dissolved and removed from the surface. After washing with water, drying was carried out at 90° C. for 20 minutes.

<Manufacture of Circuit Board>

A photomask (conductor width and space: 50 μm) having a circuit pattern drawn thereon was mounted. Thus, by using a high pressure mercury lamp light source device for burning having a suction contact mechanism (UNILEC URM 300, manufactured by USHIO INC.), exposure to ultraviolet radiation was carried out for 30 seconds. Further, the substrate was inverted, so that the exposure was also carried out in the same manner on the photoconductive layer on the opposite side. As a result, conductivity was induced in the exposed portion on the photoconductive layer.

The opposite sides of the substrate which had completely undergone the exposing processing were charged by means of a corona charging device (charging transformer output +5.0 kV), so that an electrostatic latent image was formed thereon. The surface potential of the unexposed portion after 1 minute from the charging processing was 330 V, and the surface potential at the exposed portion was 100 V. Subsequently, by using a positive-charge toner ("ODP-TW" manufactured by MITSUBISHI PAPER MILLS LIMITED.,) for Mitsubishi OPC printing system, a bias voltage of 220 V was applied to perform reversal development. As a result, a toner image was obtained on the exposed portion of the conductive layer and on the circuit part of the photoconductive layer. Then, the toner was thermally fixed at 90° C. for 2 minutes, resulting in a third resin layer.

Figure 93:
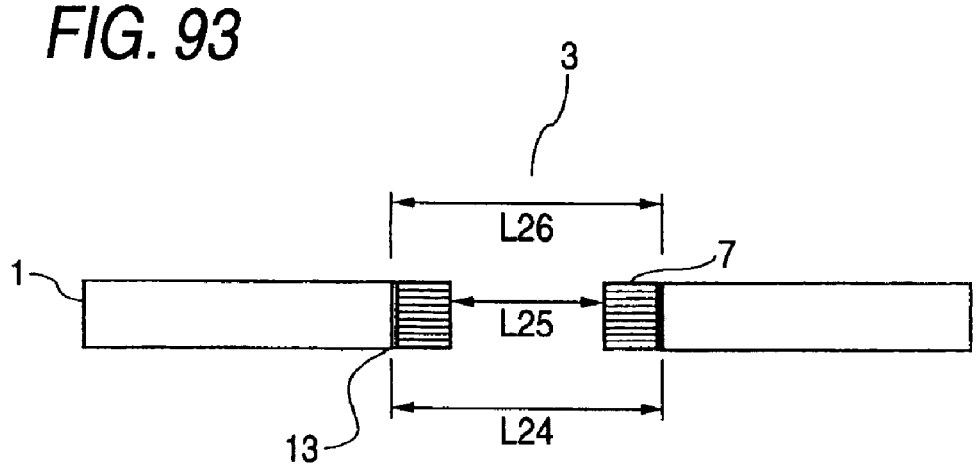
FIG. 93 is a cross sectional view showing one step in a method for manufacturing a circuit board of the present invention.

The portion of the photoconductive layer not covered with the third resin layer was dissolved and removed by using a 1 mass % sodium carbonate aqueous solution (30° C.), thereby to expose the portion of the electroless copper plated layer corresponding to a non circuit part. Then, the substrate was processed with a ferric chloride type etchant (40° C., spray pressure 3.0 kgf/cm$^2$), thereby to remove the exposed portion of the electroless copper plated layer and the underlying copper layer of the copper-clad laminate. The photoconductive layer and the third resin layer used as an etching resist were removed with a 3 mass % sodium hydroxide aqueous solution (40° C.), resulting in a circuit board. The obtained circuit board was observed under a microscope. As a result, as shown in FIG. 93, it was found as follows: the through hole diameter L24 after finishing the hole-making processing=150 μm, the through hole diameter L25 upon copper plating =125 μm, and the through hole land diameter L26=150 μm; and a landless through hole was formed. Whereas, no disconnection was observed in the circuit part and the through hole part.

Example 8

Formation of First Resin Layer

The following experiment has been performed under the yellow safe light.

By using a coating solution of the composition of Table 1, on a 25-μm thick polyethylene terephthalate film (manufactured by Mitsubishi Polyester Film Corp.), a film (the film thickness after drying 20 μm) made up of a photoconductive layer was manufactured with a curtain coat method.

In a copper-clad glass base epoxy resin substrate (the area 340 mm×510 mm, the base thickness 0.1 mm, and the copper layer thickness 12 μm), a 0.15 mm diameter through hole was opened. Then, an electroless copper plating processing was carried out, thereby to provide an electroless copper plated layer with a thickness of about 0.5 μm on the inner wall of the through hole and each surface. By using a laminator for a dry film photoresist, the photoconductive layer films were bonded by thermocompression on the opposite sides of the substrate, so that the photoconductive layers were provided on the conductive layers.

Formation of Second Resin Layer

Thereafter, at room temperature, each polyethylene terephthalate film was peeled off. Then, the opposite sides of the photoconductive layers were charged by means of a corona charging device (charging transformer output +5.0 kV). The surface potential was measured, and found to be +100 V for the portion of the photoconductive layer on the surface conductive layer, and +300 V for the portion of the photoconductive layer over the hole. Thus, it has been shown that a contrast in electric charge are caused between on the surface conductive layer and over the hole. Subsequently, by using a positive-charge toner (manufactured by MITSUBISHI PAPER MILLS LIMITED., "ODP-TW") for Mitsubishi OPC printing system, a bias voltage of +200 V was applied to perform reversal development. As a result, the toner was electrolytically deposited on the entire surface except for the hole part. Subsequently, the toner was heated at 70° C. for 2 minutes, and fixed, resulting in a favorable first resin layer.

<Removal of First Resin Layer Over the Hole and Formation of Plated Conductive Layer in the Hole>

Then, only the portion of the photoconductive layer over the hole was dissolved and removed by using a 1 mass % sodium carbonate aqueous solution (30° C.). The through hole part was observed under a microscope. As a result, as shown in FIG. 90, it was found as follows: the through hole diameter L16 after finishing the hole-making processing=150 µm, and the diameter L17 of the photoconductive layer-removed part=110 µm. Subsequently, an electrolytic copper plating processing was carried out, thereby to provide an electrolytic copper plated layer with a thickness of about 12 µm on the portion of the electroless copper plated layer in the through hole.

<Removal of First Resin Layer at Periphery of the Hole>

Further, again, by using a 1 mass % sodium carbonate aqueous solution (30° C.), the portion of the photoconductive layer at the through hole part was dissolved and removed. The portion of the photoconductive layer in the periphery of the through hole was removed concentrically with the through hole. As shown in FIG. 91, it was found as follows: the through hole diameter L18 after finishing the hole-making processing=150 µm, the through hole diameter L19 upon copper plating=125 µm, and the diameter L20 of the photoconductive layer-removed part=190 µm.

<Formation of Fourth Resin Layer>

Then, the opposite sides were charged by means of a corona charging device (charging transformer output +5.0 V). The surface potential was measured, and found to be +380 V. Subsequently, by using an acrylic resin emulsion (the toner described in Example 1 of JP-A-2002-296847), a bias voltage of +300 V was applied to perform reversal development, so that the toner was deposited on the portion of the conductive layer on the inner wall of the hole. The toner was thermally fixed at 90° C. for 2 minutes, resulting in a fourth resin layer. Then, by using propylene carbonate as a solvent which dissolves the first resin layer, but does not dissolve the fourth resin layer and the photoconductive layer, only the first resin layer was dissolved and removed from the surface. After washing with water, drying was carried out at 90° C. for 20 minutes.

<Manufacture of Circuit Board>

Subsequently, a photomask (conductor width and space: 50 µm) having a circuit pattern drawn thereon was mounted. Thus, by using a high pressure mercury lamp light source device for burning having a suction contact mechanism (UNILEC URM 300, manufactured by USHIO INC.), exposure to ultraviolet radiation was carried out for 30 seconds. Further, the substrate was inverted, so that the exposure was also carried out in the same manner on the photoconductive layer on the opposite side. As a result, conductivity was induced in the exposed portion on the photoconductive layer.

The opposite sides of the substrate which had completely undergone the exposing processing were charged by means of a corona charging device (charging transformer output +5.0 V), so that an electrostatic latent image was formed thereon. The surface potential of the unexposed portion after 1 minute from the charging processing was 330 V, and the surface potential at the exposed portion was 100 V. Subsequently, by using an acrylic resin emulsion (the toner described in Example 1 of JP-A-2002-296847), a bias voltage of 220 V was applied to perform reversal development. As a result, a toner image was obtained on the circuit part of the photoconductive layer. Then, the toner was thermally fixed at 90° C. for 2 minutes, resulting in a second resin layer.

The portion of the photoconductive layer not covered with the second resin layer was dissolved and removed by using a 1 mass % sodium carbonate aqueous solution (30° C.) thereby to expose the portion of the electroless copper plated layer corresponding to a non circuit part. Then, the substrate was processed with a ferric chloride type etchant (40° C. spray pressure 3.0 kgf/cm²), thereby to remove the exposed portion of the electroless copper plated layer and the underlying copper layer of the copper-clad laminate. The photoconductive layer, the second resin layer, and the third resin layer used as an etching resist were removed with a 3 mass % sodium hydroxide aqueous solution (40° C.) and isopropyl alcohol, resulting in a circuit board. The obtained circuit board was observed under a microscope. As a result, as shown in FIG. 92, it was found as follows: the through hole diameter L21 after finishing the hole-making processing=150 µm, the through hole diameter L22 upon copper plating=125 µm, and the through hole land diameter L23=180 µm; and a narrow land width through hole was formed. Whereas, no disconnection was observed in the circuit part and the through hole part.

Example 9

Formation of First Resin Layer

A next experiment was carried out under an yellow safe light.

A through hole having a size of 0.15 mmϕ was formed on a glass base material epoxy resin substrate (an area of 340 mm×510 mm and a thickness of a base material of 0.1 mm) and a desmear processing was then carried out. Subsequently, a nonelectrolytic plating processing was carried out to provide a nonelectrolytic copper plated layer having a thickness of 0.5 µm as a first conductive layer on an internal wall of the through hole and a surface of the substrate. An alkali soluble resin shown in the Table 1 was applied to either side of a dry film photoresist for circuit formation which had a thickness of 20 µm to form an alkali soluble resin layer having a thickness of 5 µm, and a dry film photoresist was stacked in contact with a first conductive layer so that a multilayer photo-crosslinkable resin layer was provided on the first conductive layer. Then, a Mylar film was peeled at room temperature and heating was carried out at 80° C. for one minute so that charging unevenness by peeling was eliminated.

By using a positive charge toner for the Mitsubishi OPC printing system ("ODP-TW" manufactured by Mitsubishi Paper Mills Ltd.), subsequently, a bias voltage of +200V was applied to carry out electrodeposition coating so that the toner was electrodeposited on a whole surface other than the hole portion. Then, heating was carried out at 70° C. for two minutes to fix the toner so that an excellent second resin layer was obtained.

<Removal of First Resin Layer Over the Hole>

Figure 94:
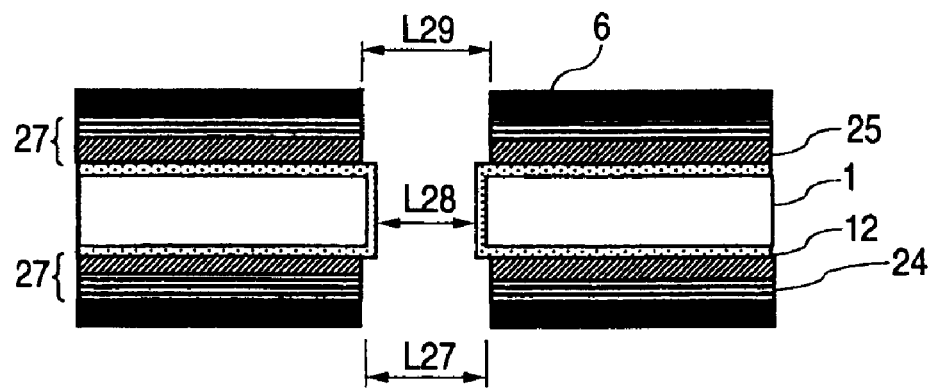
FIG. 94 is a cross sectional view showing one step in a method for manufacturing a circuit board of the present invention.

Next, the multilayer photo-crosslinkable resin layer provided over the hole was dissolved and removed by using a 1% by mass sodium carbonate solution (30° C.). The through hole portion was observed by means of a microscope. Consequently, there were obtained a through hole diameter of L27=150 μm in perforation, a through hole diameter of L28=149 μm in copper plating and a diameter of a multilayer photo-crosslinkable resin layer removing portion of L29=150 μm as shown in FIG. 94.

<Manufacture of Circuit Board>

Next, the second resin layer was removed from the multilayer photo-crosslinkable resin layer with xylene. Then, a photomask having a circuit pattern drawn thereon (a conductor width and a gap: 50 μm) was mounted and an ultraviolet exposure was carried out for 30 seconds by using a high pressure mercury lamp light source apparatus for baking which has a sucking and adhering mechanism (UNILEC URM300 manufactured by USHIO INC.). Furthermore, the substrate was inverted to carry out the exposure to a reverse surface in the same manner so that a crosslinked portion was formed.

For the substrate subjected to the exposing processing, thereafter, an alkali soluble resin layer and an unreacted dry film photoresist were eluted and removed by using a 1% by mass sodium carbonate solution (30° C.) so that a first conductive layer corresponding to a circuit portion was exposed. Next, electrolytic copper plating was carried out to form an electrolytic copper plated layer having a thickness of 12 μm as a second conductive layer on the first conductive layer. Subsequently, a treatment was carried out with a sodium hydroxide solution and the crosslinked portion of the dry film photoresist used as a resist layer was peeled and removed.

Figure 95:
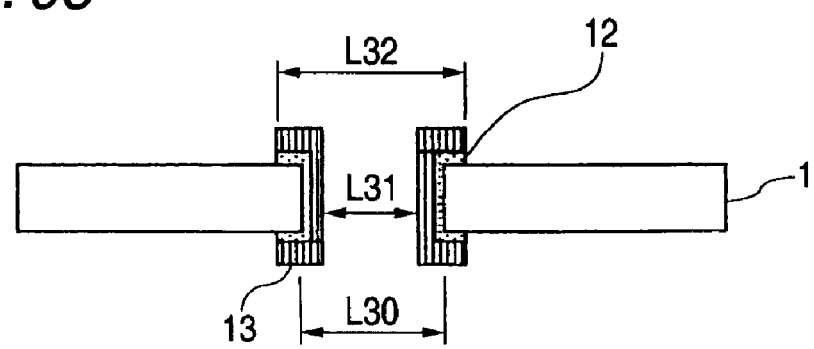
FIG. 95 is a cross sectional view showing one step in a method for manufacturing a circuit board of the present invention.

Furthermore, a treatment was carried out with an etchant of a sulfuric acid-hydrogen peroxide type etchant (30° C., a spray pressure of 2.0 kgf/cm$^2$) and the first conductive layer which was exposed was removed. The circuit board thud obtained was observed by means of the microscope. Consequently, there were obtained a through hole diameter of L30=150 μm in perforation, a through hole-diameter of L31=126 μm in copper plating and a land diameter of L32=149 μm as shown in FIG. 95. A disconnection was not generated in the circuit board.

Example 10

Formation of First Resin Layer

By using a coating solution having the composition shown in the Table 1, a first resin layer (a thickness of the film after drying is 15 μm) formed by an alkali soluble resin was manufactured on a polyethylene terephthalate film having a thickness of 25 μm (manufactured by Mitsubishi Chemical Polyester Film Co., Ltd.) by using a curtain coating method.

A copper-clad laminate including a copper foil having a thickness of 12 μm in a size of 200×200×0.4 mm was used to form a plurality of through holes having a diameter of 0.15 mm by means of a drill, and a nonelectrolytic copper plating processing (OKUNO CHEMICAL INDUSTRIES CO., LTD., OPC Process M) was executed to form a copper plated layer having a thickness of approximately 0.5 μm on a surface and internal walls of the through holes. Next, the first resin layer was thermo-compression bonded on the 120° C. preheating condition by using a laminator for a dry film. Then, a polyethylene terephthalate film was peeled at room temperature and heating was carried out at 80° C. for one minute to eliminate an unevenness of peeling and charging.

<Formation of Second Resin Layer>

By using a positive charge toner for the Mitsubishi OPC printing system ("ODP-TW" manufactured by the Mitsubishi Paper Mills Ltd.), next, a bias voltage of +300V was applied to carry out electrodeposition coating so that the toner was electrodeposited on the whole surface of the first resin layer provided on the surface conductive layer. Subsequently, heating was carried out at 70° C. for two minutes to fix the toner so that an excellent second resin layer was obtained.

<Removal of First Resin Layer Over the Hole>

The first resin layer provided over the hole in which the second resin layer was not provided was dissolved and removed by using a 1% by mass sodium carbonate solution (30° C.). The through hole portion was observed by means of a microscope. Consequently, there were obtained a through hole diameter of L16=150 μm in perforation and a diameter of the first resin layer removing portion of L17=108 μm as shown in FIG. 90.

<Formation of Plated Conductive Layer in Hole>

An electrolytic copper plating processing (OKUNO CHEMICAL INDUSTRIES CO., LTD., OPC Process M) was executed to form an electrolytic copper plated layer having a thickness of approximately 12 μm on the conductive layer provided on the internal wall of the hole.

<Removal of First Resin Layer in Peripheral Portion of Hole>

By using the 1% by mass sodium carbonate solution (30° C.) again, the first resin layer in the through hole portion was removed. By an observation through the microscope, the first resin layer in the through hole portion was removed concentrically from the inner side of the through hole. There were obtained a through hole diameter of L18=150 μm in perforation, a through hole diameter of L19=125 μm in copper plating and a diameter of the first resin layer removing portion of L20=158 μm as shown in FIG. 91.

Formation of Fourth Resin Layer

A corona charger (a charging transformer output; 4.2 kV) was used to apply a charge to both surfaces of the second resin layer. A surface potential was measured to be 250 V. By using an acrylic resin type emulsion (the toner described in the example 1 of the JP-A-2002-296847 publication), next, a bias voltage of +200V was applied to carry out an inversion development, thereby sticking the toner onto a conductive layer on an internal wall of the hole. The toner was thermally fixed at 90° C. for two minutes so that a fourth resin layer was obtained.

<Removal of First Resin Layer, Removal of Second Resin Layer>

Figure 96:
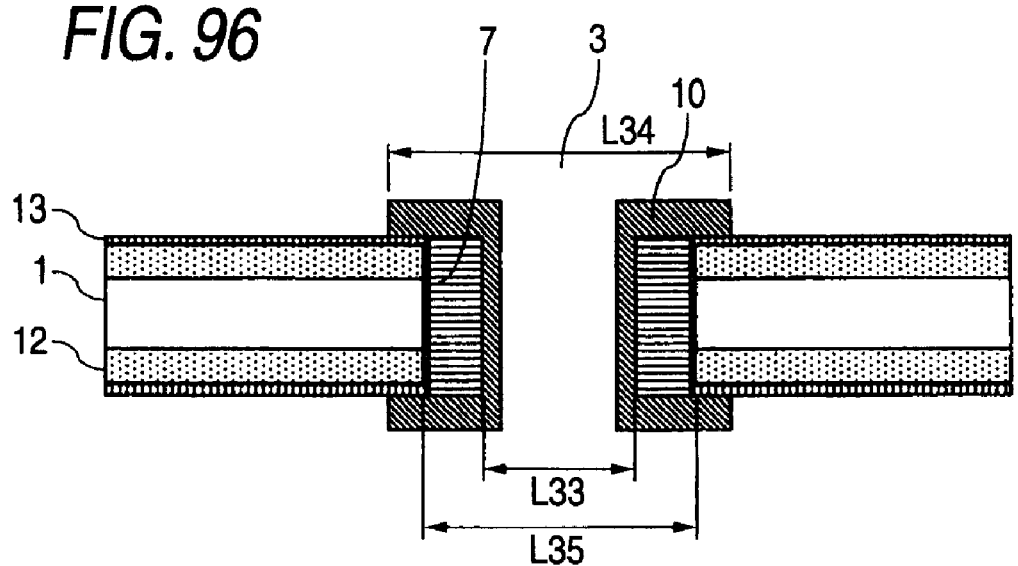
FIG. 96 is a cross sectional view showing one step in a method for manufacturing a circuit board of the present invention.

The second resin layer and the first resin layer were removed at a time with a 3% sodium hydroxide solution at 50° C. and were dried at 90° C. for 20 minutes after washing so that a substrate in which the conductive layer provided on the internal wall of the hole was covered with the fourth resin layer was obtained. The through hole portion was observed by means of the microscope. Consequently, there were obtained a through hole diameter of L33=150 μm in perforation, a through hole diameter of L34=125 μm in copper plating and a diameter of the fourth resin layer covering portion of L35=158 μm as shown in FIG. 96.

<Formation of Etching Resist Layer by Photo-Crosslinkable Resin Layer>

By using a laminator for a dry film-photoresist, a dry film resist having a thickness of 10 μm which is put on the market was thermo-compression bonded to both sides of the substrate on which the conductive layer provided on the internal wall of the hole was covered with the fourth resin layer, and a photo-crosslinkable resin layer was thus provided on the conductive layer. A photomask having a circuit pattern drawn thereon (a conductor width and a gap: 30 μm) was mounted and an ultraviolet exposure was carried out for 30 seconds by using a high pressure mercury lamp light source apparatus for baking which has a sucking and adhering mechanism (UNILEC URM300 manufactured by USHIO INC.). Furthermore, the substrate was shown inverted to carry out the exposure to the photo-crosslinkable resin layer on a reverse surface in the same manner so that a crosslinked portion of the circuit pattern was formed. After the carrier film was peeled, an uncured photo-crosslinkable resin layer was eluted and removed by using a 1% by mass sodium carbonate solution (30° C.) so that an etching resist layer formed by the crosslinked portion was formed.

<Manufacture of Circuit Board>

A treatment was carried out with an iron(III) chloride type etchant (40° C., a spray pressure of 3.0 kgf/cm$^2$) to remove an electrolytic copper plated layer, a nonelectrolytic copper plated layer and a copper layer of a copper-clad laminate which were exposed. The crosslinked portion of the photo-crosslinkable resin layer and the fourth resin layer which were used as the etching resist layers were removed with a 3% by mass sodium hydroxide solution (40° C.) and methyl ethyl ketone so that a circuit board was obtained. The circuit board thus obtained was observed by means of the microscope. Consequently, there were obtained a through hole diameter of L21=150 μm in perforation, a through hole diameter of L22=125 μm in copper plating and a land diameter of L23=150 μm as shown in FIG. 92. Moreover, a disconnection was not confirmed in the circuit portion and the through hole portion.

Example 11

Formation of First Resin Layer

By using a coating solution having the composition shown in the Table 1, a first resin layer film (a thickness of the first resin layer is 20 μm) formed by an alkali soluble resin was manufactured on a polyethylene terephthalate film having a thickness of 25 μm (manufactured by Mitsubishi Chemical Polyester Film Co., Ltd.) by using a curtain coating method.

Copper-clad laminates A to D including a copper foil having a thickness of approximately 12 μm in a size of 510×340× 0.4 mm were used as circuit forming substrates to form a plurality of through holes having a diameter of 0.15 mm by means of a drill, and nonelectrolytic copper plating-electrolytic copper plating processings (OKUNO CHEMICAL INDUSTRIES CO., LTD., OPC Process M) was executed to form a copper plated layer having a thickness of approximately 12.5 μm on a surface and internal walls of the through holes. Next, the first resin layer film was laminated on the 120° C. preheating condition by using a laminator for a dry film so that a first resin layer was obtained. Then, a polyethylene terephthalate film was peeled at room temperature.

Formation of Second Resin Layer

A corona charger (a charging transformer output +5.0 kV) was used to apply a charge to both surfaces of the resin film layer. A surface potential was measured. Consequently, it was confirmed that the first resin layer provided on the surface conductive layer had a surface potential of +100V and the resin film portion provided over the hole had a surface potential of +300V, and a potential difference was made between the surface conductive layer and the hole. By using a positive charge toner for the Mitsubishi OPC printing system ("ODP-TW" manufactured by the Mitsubishi Paper Mills Ltd.), next, a bias voltage of +200V was applied to carry out an inversion development so that the toner was electrodeposited on the whole surface other than the hole portion. Subsequently, heating was carried out at 70° C. for two minutes to fix the toner so that an excellent second resin layer was obtained.

<Manufacture of Open Substrate having Resin>

Only the first resin layer formed over the hole which is not provided with the second resin layer was eluted and removed by using an alkali solution so that an open substrate having a resin shown in FIG. 85 was formed. The open substrate having a resin was observed by means of a microscope. Consequently, there was observed a part of the hole portion in which the first resin layer and the second resin layer were not present. By changing the conditions of the alkali solution, the through hole diameter L1 in the perforation, and the through hole diameter L2 in the copper plating, and the diameter L3 of the first resin layer removing portion shown in FIG. 85 were obtained as shown in Table 5.

TABLE 5

| Substrate | Alkali species | Concentration [%] | Temperature [° C.] | Eluting time [second] | L1 [μm] | L2 [μm] | L3 [μm] |
|---|---|---|---|---|---|---|---|
| A | Sodium carbonate | 1 | 20 | 8 | 150 | 125 | 110 |
| B | Sodium carbonate | 1 | 20 | 24 | | | 160 |
| C | Sodium silicate | 3 | 20 | 10 | | | 190 |
| D | Sodium silicate | 3 | 30 | 36 | | | 230 |

Formation of Fourth Resin Layer

A corona charger (a charging transformer output; +4.2 kV) was used to apply a charge to both surfaces of the second resin layer. A surface potential was measured to be 250 V. By using an acrylic resin type emulsion (the toner described in the example 1 of the JP-A-2002-296847 publication), next, a bias voltage of +200V was applied to carry out an inversion development, thereby sticking the toner onto a conductive layer in the inner part of the hole. The toner was thermally fixed at 90° C. for two minutes so that a fourth resin layer was obtained.

<Removal of First Resin Layer, Removal of Second Resin Layer>

The second resin layer and the first resin layer were removed at a time with a 3% sodium hydroxide solution at 50° C. and were dried at 90° C. for 20 minutes after washing so that a substrate in which the conductive layer formed on the inner part of the hole was covered with the fourth resin layer was obtained. The through hole portion was observed by means of the microscope. Consequently, the fourth resin layer was formed concentrically with the through hole. The through hole diameter L7 in the perforation, the through hole diameter L8 in the copper plating and the diameter L9 of the fourth resin layer covering portion shown in FIG. 86 were obtained as shown in results of Table 6.

TABLE 6

| Substrate | L7 [μm] | L8 [μm] | L9 [μm] |
|---|---|---|---|
| A | 150 | 125 | 125 |
| B | | | 160 |
| C | | | 190 |
| D | | | 230 |

<Formation of Etching Resist Layer by Photo-Crosslinkable Resin Layer>

By using a laminator for a dry film photoresist under an yellow safe light, a dry film resist having a thickness of 10 μm which is put on the market was thermo-compression bonded to both sides of the substrate so that a photo-crosslinkable resin layer was provided on the conductive layer. A photomask having a circuit pattern drawn thereon (a conductor width and a gap: 50 μm) was mounted and an ultraviolet exposure was carried out for 30 seconds by using a high pressure mercury lamp light source apparatus for baking which has a sucking and adhering mechanism (UNILEC URM300 manufactured by USHIO INC.). Furthermore, the substrate was inverted to carry out the exposure to the photo-crosslinkable resin layer on a reverse surface in the same manner so that a crosslinked portion of the circuit pattern was formed. After the carrier film was peeled, an uncured photo-crosslinkable resin layer was eluted and removed by using a 1% by mass sodium carbonate solution (30° C.) so that an etching resist layer formed by the crosslinked portion was formed.

<Manufacture of Circuit Board>

A treatment was carried out with an iron(III) chloride type etchant (40° C., a spray pressure of 3.0 kgf/cm$^2$) to remove an electrolytic copper plated layer, a nonelectrolytic copper plated layer and a copper layer of a copper-clad laminate which were exposed. The crosslinked portion of the photo-crosslinkable resin layer and the fourth resin layer which were used as the etching resist layers were removed with a 3% by mass sodium hydroxide solution (40° C.) and methyl ethyl ketone so that a circuit board was obtained.

<Evaluation of Circuit Board>

(1) Observation of Shape

The circuit board which was obtained was observed by means of the microscope. Consequently, it was found that the land to be the conductive layer in the peripheral portion of the through hole was formed concentrically with the through hole. Thus, the through hole diameter L10 in the perforation, the through hole diameter L11 in the copper plating and the land diameter L12 shown in FIG. 87, and the maximum height T1 of the conductive layer in the non-coupling portion, the thickness T2 of the conductive layer in the circuit portion and the land width L in FIG. 66 were obtained as shown in Table 7. Moreover, a disconnection was not confirmed in the circuit portion and the through hole portion.

TABLE 7

| Substrate | L10 [μm] | L11 [μm] | L12 [μm] | T1 [μm] | T2 [μm] | L [μm] |
|---|---|---|---|---|---|---|
| A | 150 | 125 | 150 | 0 | 24.5 | 0 |
| B | | | 150 | 24.5 | 24.5 | 0 |
| C | | | 180 | 24.5 | 24.5 | 15 |
| D | | | 220 | 24.5 | 24.5 | 35 |

The maximum value $L_{max}$ and the minimum value $L_{min}$ of the land width of the hole shown in FIG. 67 were measured based on 100 points and a maximum value of a difference therebetween is shown in Table 8. L indicates a mean land width. It was confirmed that the difference was equal to or smaller than 8 μm in the circuit boards C and D having small land widths.

TABLE 8

| Substrate | L [μm] | $L_{max}$ [μm] | $L_{min}$ [μm] | Difference between $L_{max}$ and $L_{min}$ [μm] |
|---|---|---|---|---|
| C | 15 | 16 | 13 | 3 |
| D | 35 | 37 | 32 | 5 |

In the circuit boards A to D, the sectional shape of the conductive layer in the land portion and that of the conductive layer in the circuit portion were observed. Consequently, results shown in Table 9 were obtained. In the circuit boards A and B, moreover, it was confirmed that a portion having a maximum height was present within a range from the internal wall of the hole to a thickness of the conductive layer in the hole in the conductive layer of the land.

TABLE 9

| Substrate | Shape of conductive layer in circuit portion | Shape of conductive layer in land portion |
|---|---|---|
| A | FIG. 79(c) | FIG. 70(b) |
| B | FIG. 79(c) | FIG. 72(a) |
| C | FIG. 79(c) | FIG. 78(c) |
| D | FIG. 79(c) | FIG. 78(c) |

(2) Reliability Test (Thermal Shock Test)

20 substrates for evaluation (24 lines for evaluation) were cut out of a circuit board and each conducting resistance after manufacture was measured. A cycle for holding at −65° C. for five minutes and holding at 150° C. for five minutes was repeated 1000 times and the conducting resistance was then measured. A rate of the number of the lines for evaluation which have the conducting resistances increased is shown in Table 10.

(Temperature Cycle Test)

20 substrates for evaluation (24 lines for evaluation) were cut out of a circuit board and each conducting resistance after manufacture was measured. A cycle for holding at −65° C. for 15 minutes and holding at 150° C. for 15 minutes were repeated 1000 times and the conducting resistance was then measured. A rate of the number of the lines for evaluation which have the conducting resistances increased is shown in Table 10.

(Saturated Steam Pressurizing Test)

A circuit board was stored at 121° C., a relative humidity of 100% and a pressure of 0.21 MPa, and whether a crack is generated was confirmed after 168 hours and a result is shown in the Table 10.

TABLE 10

| Substrate | Thermal shock test [%] | Temperature cycle test [%] | Saturated steam pressurizing test |
|---|---|---|---|
| A | 3 | 2 | No crack |
| B | 0 | 0 | No crack |
| C | 0 | 0 | No crack |
| D | 0 | 0 | No crack |

It was confirmed that the circuit boards A to D according to the invention had a very high reliability.

Comparative Example 1

A copper-clad laminate including a copper foil having a thickness of 12 μm in a size of 510×340×0.4 mm was used to form a plurality of through holes having a diameter of 0.15 mm by means of a drill, and nonelectrolytic copper plating-electrolytic copper plating processings (OKUNO CHEMICAL INDUSTRIES CO., LTD. OPC Process M) was executed to form a copper plated layer having a thickness of approximately 12.5 μm on a surface and internal walls of the through holes. By using a laminator for a dry film under an yellow safe light, a dry film resist having a thickness of 10 μm which is put on the market was thermo-compression bonded to both sides of the substrate so that a photo-crosslinkable resin layer was provided on a conductive layer. A photomask having a circuit pattern drawn thereon (a conductor width: 50 μm, a conductor gap: 50 μm, a land diameter 250 μm) was mounted and an ultraviolet exposure was carried out for 30 seconds by using a high pressure mercury lamp light source apparatus for baking which has a sucking and adhering mechanism (UNILEC URM300 manufactured by USHIO INC.). Furthermore, the substrate was inverted to carry out the exposure to the photo-crosslinkable resin layer on a reverse surface in the same manner so that a crosslinked portion of the circuit pattern was formed. After the carrier film was peeled, an uncured photo-crosslinkable resin layer was eluted and removed by using a 1% by mass sodium carbonate solution (30° C.) so that an etching resist layer constituted by the crosslinked portion was formed. The through hole portion was protected by tenting with the photo-crosslinkable resin layer which was crosslinked.

A treatment was carried out with an iron(III) chloride type etchant (40° C., a spray pressure of 3.0 kgf/cm²) to remove an electrolytic copper plated layer, a nonelectrolytic copper plated layer and a copper layer of a copper-clad laminate which were exposed. The photo-crosslinkable resin layer after the end of the etching processing was observed. Consequently, some parts of the photo-crosslinkable resin layer were peeled in the through hole portion. The crosslinked portion of the photo-crosslinkable resin layer used as the etching resist layer was removed with a 3% by mass sodium hydroxide solution (40° C.) so that a circuit board was obtained. The circuit board thus obtained was observed by means of a microscope. Consequently, a through hole diameter in perforation was 150 μm and a through hole diameter of a copper plated portion was 125 μm. A land diameter was 240 μm. A difference between maximum and minimum values of a land width was measured based on 100 points. Consequently, a maximum value was 17 μm and the land was not formed concentrically with the through hole, and the land width was nonuniform. Moreover, a step was generated in a portion from which the photo-crosslinkable resin layer was peeled.

The sectional shape of the circuit board according to the comparative example 1 was observed. Consequently, it was confirmed that the conductive layer in the circuit portion takes a shape shown in FIG. 79(c) and the conductive layer in the land portion takes a shape shown in FIG. 78(c), and they are identical to each other.

A result obtained by the execution of the reliability test described in the example 11 in the circuit board according to the comparative example 1 is shown in Table 11. In the circuit board according to the comparative example 1, a result obtained by the saturated steam pressurizing test was the same as that in the circuit board obtained in the example 1. However, results obtained by the thermal shock test and the temperature cycle test were low.

TABLE 11

| Thermal shock test [%] | Temperature cycle test [%] | Saturated steam pressurizing test |
|---|---|---|
| 12 | 15 | No crack |

Example 12

Formation of First Resin Layer

A through hole having a size of 0.15 mmφ was formed on glass base material epoxy resin substrates F, H and I (340×510×0.1 mm) and a desmear processing was then carried out. Subsequently, a nonelectrolytic plating processing was carried out to provide a nonelectrolytic copper plated layer having a thickness of approximately 0.5 μm as a first conductive layer on a surface including an inner part of the through hole. By using a laminator for a dry film photoresist under an yellow safe light, a dry film photoresist for circuit formation which has a thickness of 20 μm was thermo-compression bonded to both sides of the substrate to provide a photo-crosslinkable resin layer on the conductive layer.

Formation of Second Resin Layer

Subsequently, a carrier film was peeled at room temperature and a charge was then applied to both surfaces of the photo-crosslinkable resin layer by using a corona charger (a charging transformer output; +5.0 kV). By using a positive charge toner for the Mitsubishi OPC printing system ("ODP-TW" manufactured by Mitsubishi Paper Mills Ltd.), subsequently, a bias voltage of +200V was applied to carry out an inversion development so that the toner was electrodeposited on a whole surface other than a hole portion. Then, heating was carried out at 70° C. for two minutes to fix the toner so that an excellent second resin layer was obtained.

Figure 97:
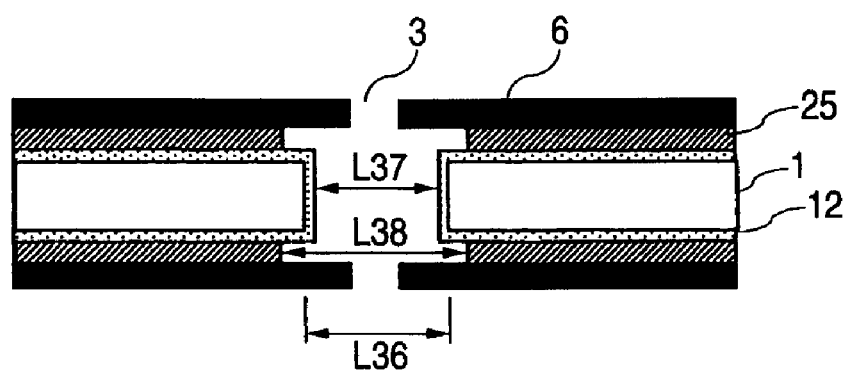
FIG. 97 is a cross sectional view showing one step in a method for manufacturing a circuit board of the present invention.
Figure 98:
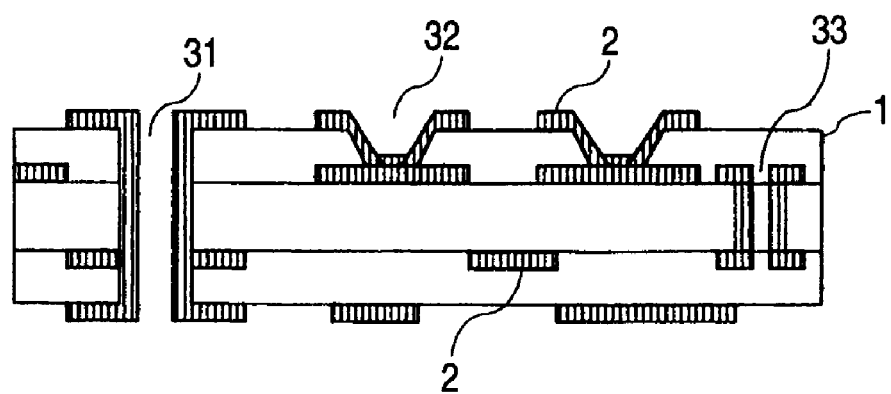
FIGS. 98(*a*) and (*b*) is an example of a circuit board having a through hole and/or a non-through hole.
Figure 98:
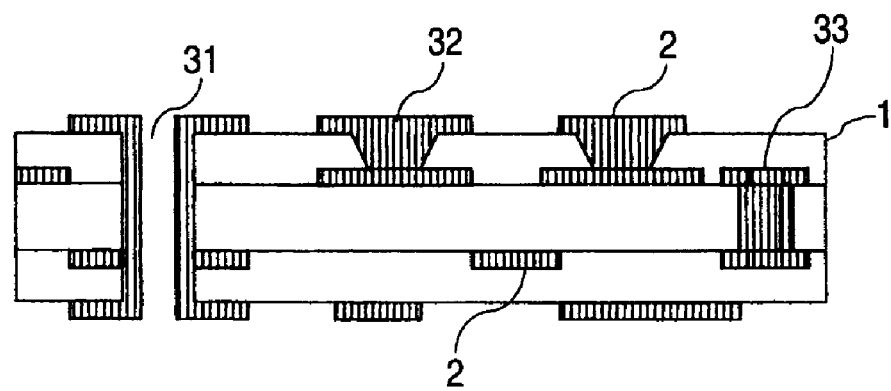

Next, only the photo-crosslinkable resin layer provided over the hole was dissolved and removed by using a photo-crosslinkable resin layer removing solution. The through hole portion was observed by means of a microscope. Consequently, the photo-crosslinkable resin layer in the peripheral portion of the through hole was removed concentrically with the through hole. A through hole diameter L36 in perforation, a through hole diameter L37 in plating and a diameter L38 of the photo-crosslinkable resin layer removing portion shown in FIG. 97 were obtained as shown in Table 12.

TABLE 12

| Substrate | Alkali species | Concentration [%] | Temperature [° C.] | Eluting time [second] | L36 [μm] | L37 [μm] | L38 [μm] |
|---|---|---|---|---|---|---|---|
| F | Sodium carbonate | 1 | 25 | 25 | 150 | 149 | 151 |
| H | Sodium silicate | 3 | 25 | 10 | | | 181 |
| I | Sodium silicate | 3 | 35 | 35 | | | 221 |

<Removal of Unnecessary Plated Resist Layer in Circuit Portion>

Under an yellow safe light, a photomask having a circuit pattern drawn thereon (a conductor width and a gap: 50 μm) was mounted on a fourth resin layer and an ultraviolet exposure was carried out for 30 seconds by using a high pressure mercury lamp light source apparatus for baking which has a sucking and adhering mechanism (UNILEC URM 300 manufactured by USHIO INC.). Furthermore, the substrate was inverted to carry out the exposure to a reverse surface in the same manner so that a crosslinked portion was formed. By using xylene and a 1% by mass sodium carbonate solution (30° C.) for the substrate subjected to the exposing processing, subsequently, a second resin layer and an uncured photo-crosslinkable resin layer were eluted and removed so that a first conductive layer corresponding to a circuit portion was exposed.

<Formation of Circuit Portion>

Thereafter, electrolytic copper plating was carried out to form an electrolytic copper plated layer having a thickness of approximately 12 μm as a second conductive layer on the first conductive layer. Subsequently, a treatment was carried out with a sodium hydroxide solution and the crosslinked portion of the photo-crosslinkable resin used as a resist layer was peeled and removed.

Furthermore, a treatment was carried out with an etchant of a sulfuric acid-hydrogen peroxide type etchant (30° C., a spray pressure of 2.0 kgf/cm²) and the first conductive layer which was exposed was removed so that a circuit board was obtained.

<Evaluation of Circuit Board>

(1) Observation of Shape

The circuit board which was obtained was observed by means of the microscope. Consequently, the land was removed concentrically with the through hole. The through hole diameter L30 in the perforation, the through hole diameter L31 in the plated portion and the land diameter L32 shown in FIG. 95, and the maximum height T1 of the conductive layer in the non-coupling portion, the thickness T2 of the conductive layer in the circuit portion and the land width L in FIG. 66 were obtained as shown in Table 13. Moreover, a disconnection was not confirmed in the circuit portion and the through hole portion.

TABLE 13

| Substrate | L30 [μm] | L31 [μm] | L32 [μm] | T1 [μm] | T2 [μm] | L [μm] |
|---|---|---|---|---|---|---|
| F | 150 | 126 | 150 | 12 | 12 | 0 |
| H | | | 180 | 12 | 12 | 15 |
| I | | | 220 | 12 | 12 | 35 |

The maximum value $L_{max}$ and the minimum value $L_{min}$ of the land width of the hole shown in FIG. 67 were measured based on 100 points and a maximum value of a difference therebetween is shown in Table 14. L indicates a mean land width. It was confirmed that the difference was equal to or smaller than 8 μm in the circuit boards H and I having small land widths.

TABLE 14

| Substrate | L [μm] | $L_{max}$ [μm] | $L_{min}$ [μm] | Difference between $L_{max}$ and $L_{min}$ [μm] |
|---|---|---|---|---|
| H | 15 | 16 | 14 | 2 |
| I | 35 | 36 | 33 | 3 |

In the circuit boards F, H and I, the sectional shape of the conductive layer in the land portion and that of the conductive layer in the circuit portion were observed. Consequently, results shown in Table 15 were obtained. In the circuit board F, moreover, it was confirmed that a portion having a maximum height was present within a range from the internal wall of the hole to a thickness of the conductive layer in the hole in the conductive layer of the land.

TABLE 15

| Substrate | Shape of conductive layer in circuit portion | Shape of conductive layer in land portion |
|---|---|---|
| F | FIG. 79(b) | FIG. 73(b) |
| H | FIG. 79(b) | FIG. 78(a) |
| I | FIG. 79(b) | FIG. 78(a) |

(2) Reliability Test

A reliability test was carried out over the circuit boards F, H and I by the method described in the example 11 and a result is shown in Table 16.

TABLE 16

| Substrate | Thermal shock test [%] | Temperature cycle test [%] | Saturated steam pressurizing test |
|---|---|---|---|
| F | 5 | 4 | No crack |
| H | 0 | 0 | No crack |
| I | 0 | 0 | No crack |

It was confirmed that the circuit boards F, H and I according to the invention had a very high reliability.

Comparative Example 2

A through hole having a size of 0.15 mmφ was formed on a glass base material epoxy resin substrate (340×510×0.1 mm) and a desmear processing was then carried out. Subsequently, a nonelectrolytic plating processing was carried out to provide a nonelectrolytic copper plated layer having a thickness of approximately 0.5 μm as a first conductive layer on a surface including an inner part of the through hole. By using a laminator for a dry film, a photo-crosslinkable dry film photoresist put on the market was thermo-compression bonded under an yellow safe light. Thereafter, an ultraviolet exposure was carried out for 30 seconds by using a high pressure mercury lamp light source apparatus for baking which has a sucking and adhering mechanism (UNILEC URM300 manufactured by USHIO INC.) through a photomask (a conductor width: 50 μm, a conductor gap 50 μm and a land diameter: 250 μm). Subsequently, an alkali elution was performed with a 1% by mass sodium carbonate solution (a liquid temperature of 35° C.) so that a plated resist layer was formed in a non-circuit portion.

Figure 66:
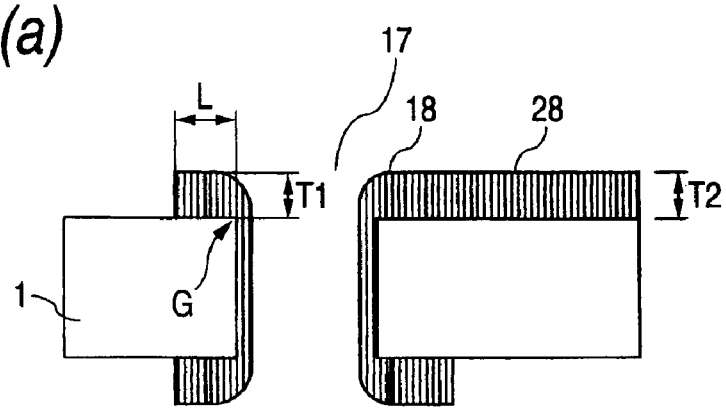
FIGS. 66(*a*) and (*b*) show the schematical cross sectional views of line A portion of FIG. 65.
Figure 66:
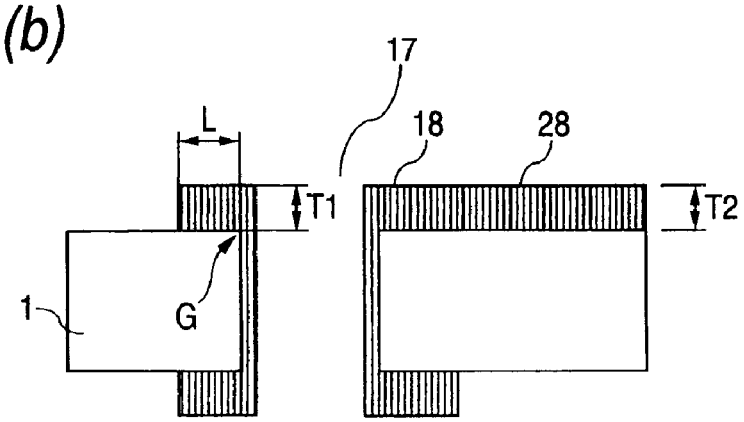

Then, electrolytic copper plating was carried out to form a second conductive layer having a thickness of approximately 12 μm on a surface of a portion from which the first conductive layer was exposed. Next, a treatment was carried out with a 3% by mass sodium hydroxide solution at 40° C. to remove the photoresist layer. Subsequently, a treatment was carried out with an etchant of a sulfuric acid-hydrogen peroxide type etchant (30° C., a spray pressure of 2.0 kgf/cm$^2$) to etch the first conductive layer so that a circuit board was obtained. The circuit board thus obtained was observed by means of a microscope. Consequently, a through hole diameter in perforation was 150 μm and a through hole diameter in a copper plated portion was 126 μm. In FIG. 66(*a*), a height of the conductive layer in a non-coupling portion was T1=11.5 μm, a thickness of the conductive layer in a circuit portion was T2=11.5 μm and a land diameter was 260 μm. A maximum value and a minimum value of the land width of the hole were measured based on 100 points, and a maximum value of a difference therebetween was 18 μm, a land was not formed concentrically with the through hole and a land width was nonuniform.

A sectional shape of the circuit board according to the comparative example 2 was observed. Consequently, it was confirmed that the conductive layer in the circuit portion takes a shape shown in FIG. 79(*b*) and the conductive layer in the land portion takes a shape shown in FIG. 78(*b*), and they are identical to each other.

In the circuit board according to the comparative example 2, a result obtained by the execution of the reliability test described in the example 11 is shown in Table 17. In the circuit board according to the comparative example 2, the result of the saturated steam pressurizing test was the same as that of the circuit board obtained in the example 12. However, the results of a thermal shock test and a temperature cycle test were low.

TABLE 17

| Thermal shock test [%] | Temperature cycle test [%] | Saturated steam pressurizing test |
| --- | --- | --- |
| 10 | 12 | No crack |

INDUSTRIAL APPLICABILITY

The invention can be utilized in a method of manufacturing a circuit board such as a printed wiring substrate or a semiconductor device. For an open substrate having a resin which is obtained in a serial process included in the method of manufacturing a circuit board according to the invention, a serial process obtained by properly combining a hole filling ink step, a conductive ink filling step, an electrodepositing step, a metal plating step, a resist forming step and an etching step is carried out. Consequently, it is possible to manufacture a circuit board including a hole having a land in a uniform and optional width.

What is claimed is:

1. A circuit board in which a circuit portion is formed on an insulating substrate by a conductive layer and there provided a through hole and/or a non-through hole having an internal wall covered or filled with the conductive layer, wherein a land of the through hole and/or the non-through hole is formed continuously like a concentric circle with respect to the hole, a maximum height of the conductive layer in a non-coupling portion of the land is equal to or greater than −5 μm with a corner portion of the insulating substrate set to be a reference point and is equal to or smaller than a thickness of the conductive layer in a circuit portion, and a land width from the reference point is 0 to 40 μm, wherein the land width falls between a maximum value and a minimum value, and wherein a difference between the maximum and minimum values is equal to or less than 8 μm and greater than 0 μm.

2. The circuit board according to claim 1, wherein a sectional shape of the conductive layer in the circuit portion is different from that of the conductive layer in the land portion.

3. The circuit board according to claim 2, wherein a portion having a maximum height is present within a range from the internal wall of the hole to a thickness of the conductive layer in the hole in the conductive layer of the land.

\* \* \* \* \*

UNITED STATES PATENT AND TRADEMARK OFFICE
CERTIFICATE OF CORRECTION

| | |
|---|---|
| PATENT NO. | : 7,679,004 B2 |
| APPLICATION NO. | : 10/598524 |
| DATED | : March 16, 2010 |
| INVENTOR(S) | : Fukase et al. |

Figure 14:
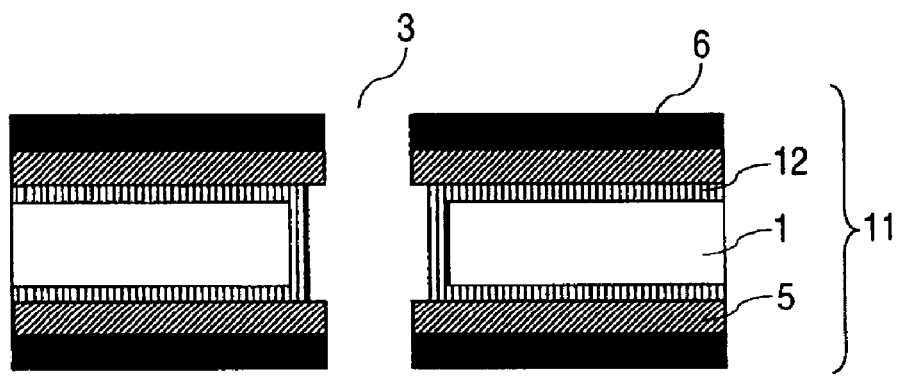
FIG. 14 is a cross sectional view of an example of an open substrate having resin by a method for manufacturing a circuit board of the present invention.
Figure 15:
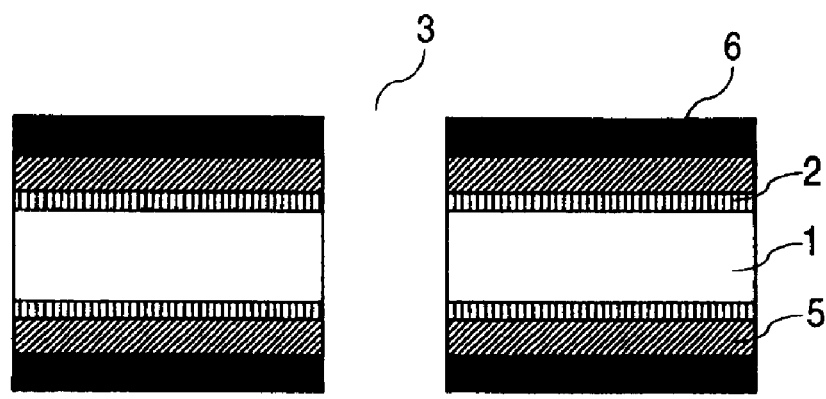
FIG. 15 is a cross sectional view of an example of an open substrate having resin by a method for manufacturing a circuit board of the present invention.
Figure 16:
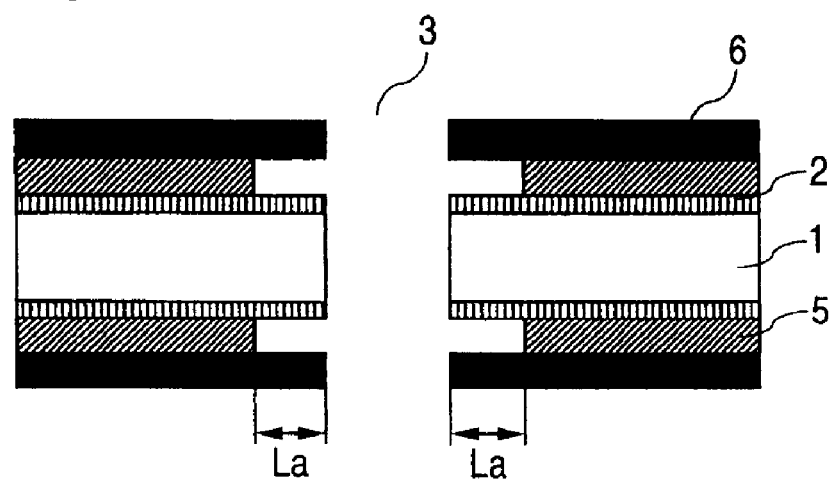
FIG. 16 is a cross sectional view of an example of an open substrate having resin by a method for manufacturing a circuit board of the present invention.
Figure 17:
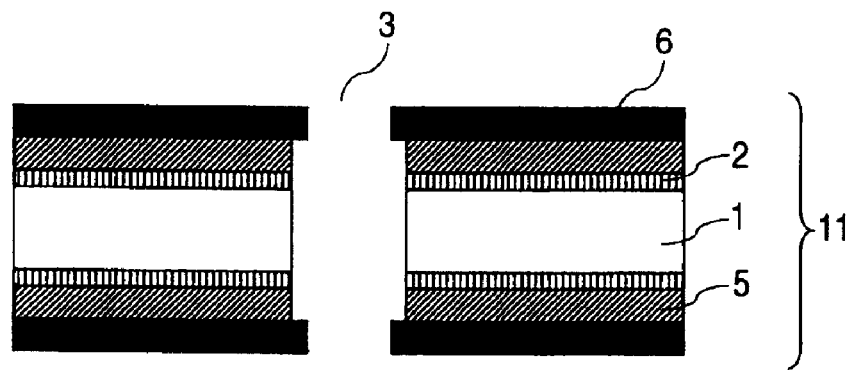
FIG. 17 is a cross sectional view of an example of an open substrate having resin by a method for manufacturing a circuit board of the present invention.

It is certified that error appears in the above-identified patent and that said Letters Patent is hereby corrected as shown below:

In Fig. 14, Sheet 6 of 54, delete Tag "12" and insert -- 2 --

Figure 18:
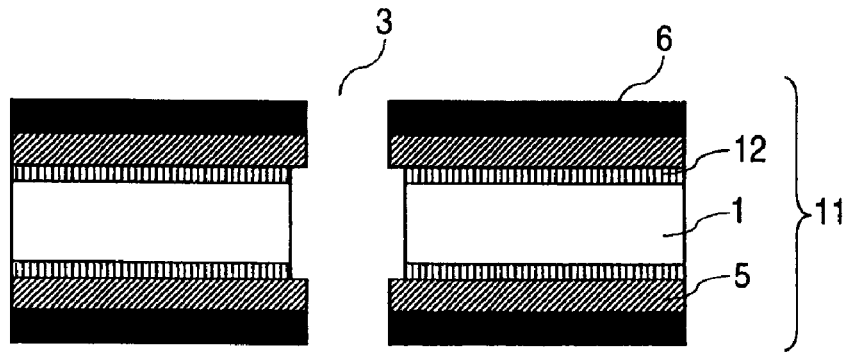
FIG. 18 is a cross sectional view of an example of an open substrate having resin by a method for manufacturing a circuit board of the present invention.

In Fig. 18, Sheet 8 of 54, delete Tag "12" and insert -- 2 --

Signed and Sealed this

Eleventh Day of May, 2010

David J. Kappos
*Director of the United States Patent and Trademark Office*